United States Patent [19]
Dorst et al.

[11] Patent Number: 5,808,887
[45] Date of Patent: Sep. 15, 1998

[54] ANIMATION OF PATH PLANNING

[75] Inventors: Leendert Dorst, Yorktown Heights; Karen Irene Trovato, Putnam Valley, both of N.Y.

[73] Assignee: Philips Electronics North America Corporation, New York, N.Y.

[21] Appl. No.: 487,621

[22] Filed: Jun. 7, 1995

Related U.S. Application Data

[62] Division of Ser. No. 617,303, Nov. 16, 1990, which is a continuation of Ser. No. 442,476, Nov. 22, 1989, abandoned, which is a continuation of Ser. No. 123,502, Nov. 20, 1987, abandoned.

[51] Int. Cl.$^6$ ................................................. G06F 19/00
[52] U.S. Cl. .............................. 364/167.01; 364/424.031
[58] Field of Search ........................... 364/148, 424.02, 364/474.2, 461, 474.26, 436, 437, 438, 444, 167.01, 424.027, 424.028, 424.029, 424.031, 424.032, 424.033; 395/80, 85, 88, 90, 919, 89, 905, 152, 161, 119

[56] References Cited

U.S. PATENT DOCUMENTS

| | | | |
|---|---|---|---|
| 4,481,568 | 11/1984 | Inaba et al. | 364/167.01 |
| 4,482,968 | 11/1984 | Inaba et al. | 364/167.01 |
| 4,674,048 | 6/1987 | Okumura | 901/1 |
| 4,752,836 | 6/1988 | Blanton et al. | 395/119 |
| 4,764,873 | 8/1988 | Libby | 364/461 X |

OTHER PUBLICATIONS

Gouzenes—"Strategies for Solving Collision–free Trajectories Problems for Mobile and Manipulator Robots"–The International Journal of Robotics Research, vol. 3, No. 4, Winter 1984.

Ichikawa et al—"A Heuristic Planner and an Executive for Mobile Robot Control"—IEEE Trans. on Systems, Man, and Cybernetics, vol. SMC-15, No. 4, Jul./Aug. 1985: pp. 558–563.

Dorst et al.—"The Constrained Distance Transformation: A Pseudo–Evelidean Recursive Implementation of the Lee–Algorithm," *Signal Processing III: Theories and Applications*; Elsivier Science Publishers B.d. (North Holland); 1986; pp. 917–920.

Verbeek et al.—"Collision Avoidance and Path Finding Through Constrained Distance Transformation in Robot State Space," Proc. Conf. 8–11, Dec. 1986 Amsterdam (North Holland) pp. 627–634.

Khatib, "Real–Time Obstacle Avoidance for Manipulators and Mobile Robots,"—International Journal of Robotics Research, pp. 90–98, vol. 5, No. 1 (Spring 1986).

Nilson—*Principles of Artificial Intelligence*, Tioga Publishing Comp. California, 1980.

Verwer—Abstract, 3$^{rd}$ Conf. on Artificial Intelligence for Space Applications (Nov. 2, 1987) p. 153.

Verwer, Unpublished Paper, "Heuristic Search in Robot Configuration Space Using Variable Metric"; Nov. 2, 1987.

*Primary Examiner*—Joseph Ruggiero
*Attorney, Agent, or Firm*—Anne E. Barschall

[57] ABSTRACT

A method and apparatus for path planning are presented. Path planning involves propagating cost waves in a configuration space representation of a task space. A space variant metric and budding are used for cost wave propagation. The disclosed method and apparatus are readily adaptable to robots with n degrees of freedom.

24 Claims, 34 Drawing Sheets

Configuration Space:

|   | 0 | 1 | j 2 | 3 |
|---|---|---|---|---|
| 0 | U | U | 1.4 ▲ | U |
| i 1 | U | 0 | INF | U |
| 2 | U | U | U | U |

Heap:

| 0 | 2 |   1.4

Configuration Space:

|   | 0 | 1 | j 2 | 3 |
|---|---|---|---|---|
| 0 | 1.4 ◄ | 1 ▼ | 1.4 ▲ | U |
| i 1 | 1 ► | 0 | INF | U |
| 2 | 1.4 ▼ | 1 ▲ | 2.8 ▼ | U |

Heap:

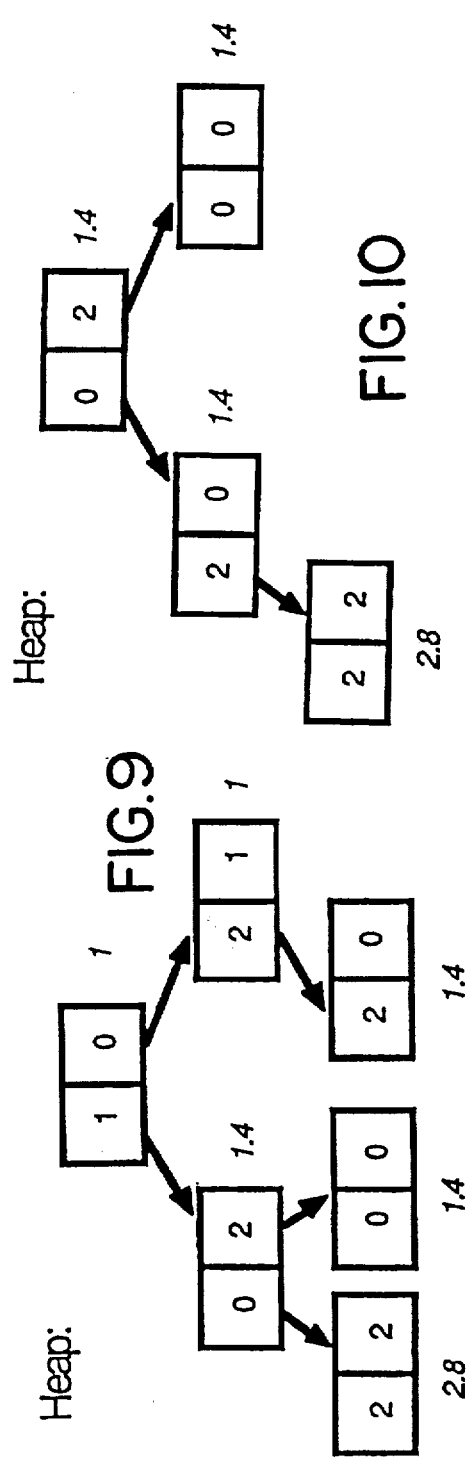
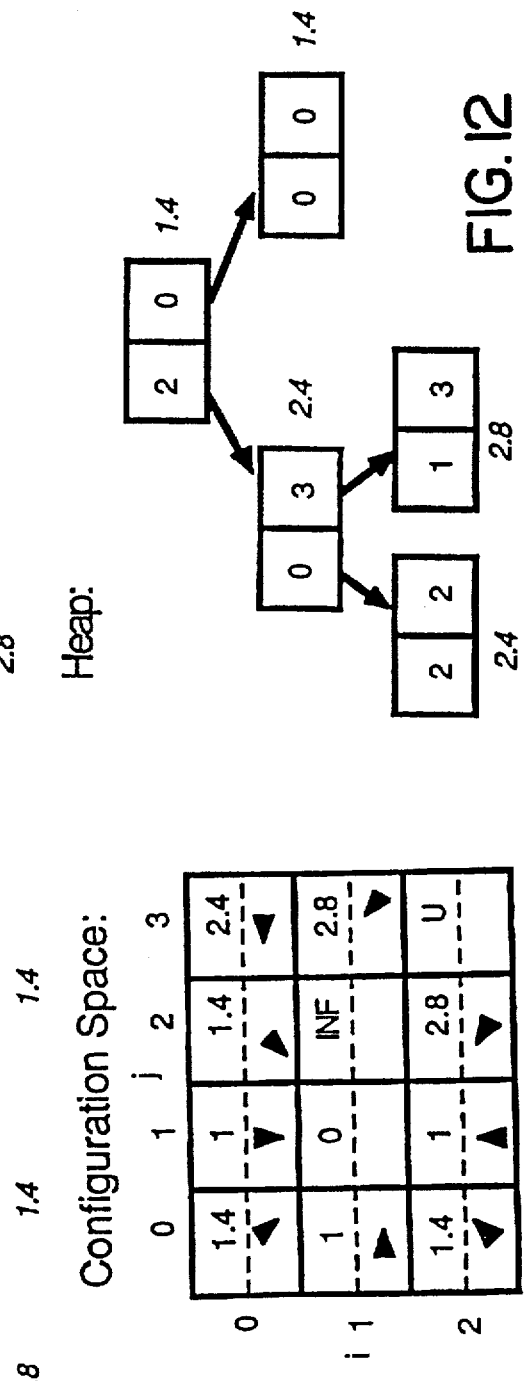

Configuration Space:

Heap:

Configuration Space:

Configuration Space:

FIG. 19

Transition Costs

| | | j=0 | | | j=1 | | | j=2 | | | j=3 | |
|---|---|---|---|---|---|---|---|---|---|---|---|---|
| i=0 | INF | INF | INF | INF | INF | INF | INF | INF | INF | INF | INF | INF |
| | INF | ▨ | 1 | 1 | ▨ | 1 | 1 | ▨ | 1 | INF | ▨ | INF |
| | INF | 1 | 1.4 | 1.4 | 1 | 1.4 | 1.4 | 1 | INF | | | |
| i=1 | INF | 1 | 1.4 | 1.4 | 1 | 1.4 | 1.4 | 1 | INF | | | |
| | INF | ▨ | 1 | 1 | ▨ | 1 | 1 | ▨ | INF | | | |
| | INF | 1 | INF | 1.4 | INF | 2.8 | INF | 2 | INF | | | |
| | INF | 1 | 1.4 | INF | INF | INF | 1.4 | 1 | INF | | | |
| i=2 | INF | ▨ | INF | INF | ▨ | INF | INF | ▨ | INF | | | |
| | INF | 1 | 1.4 | INF | INF | INF | 1.4 | 1 | INF | | | |
| | INF | 1 | INF | 1.4 | INF | 2.8 | INF | 2 | INF | | | |
| | INF | ▨ | 1 | 1 | ▨ | 1 | 1 | ▨ | INF | | | |
| | INF | INF | INF | INF | INF | INF | INF | INF | INF | | | |

ANIMATION OF PATH PLANNING

This is a division of application Ser. No. 07/617,303, filed on Nov. 16, 1990, which is a continuation of application Ser. No. 07/442,476, filed on Nov. 22, 1989, abandoned, which is a continuation of application Ser. No. 07/123,502, filed on Nov. 20, 1987 abandoned.

BACKGROUND OF THE INVENTION

1. Field of the Invention

The invention relates to planning an optimal path for an object to follow from a given start point to a nearest one of a set of goals, taking into account constraints and obstacles.

2. The Prior Art

One of the most important outstanding problems in robotics is that of path planning with obstacle avoidance. In a typical task, the robot has to move from a start location to a goal location. Obstacles should be avoided along the way, and the movement as a whole should be as efficient as reasonably possible. The planning of the path should be as rapid as possible. The problem of providing such a "path" for a robot, for instance by giving a series of set points, is called the path planning problem.

There are a number of existing robots. Typically they are controlled using a programming language. One commonly used language is Val II, described in Unimation, Inc., "Programming Manual: User's Guide to Val II: Version 2.0 398AG1", December 1986. Val II can be used to control products such as Unimation's Puma Robots and Adept Robots. Using Val II, a user can specify the movement of a robot, from a current point to a desired point, using the command MOVE POINT ( ) on page 4–20 of the reference. Points are usually generated in joint coordinates. It is therefore sufficient for a path planning method to generate a series of set points to be inserted in the appropriate Val II command. The technology is in place for the robot to follow a path once the set points are generated.

Typical industrial robots use manually generated set points. Such manually generated set points are adequate for performing a simple repetitive task such as automated assembly in an environment which does not change from one task to the next. Manually generated set points are not practical and paths followed are often not efficient for dynamic situations, or for situations with large numbers of obstacles, or for obstacles with complex shapes. Therefore there is a need for a method to generate set points automatically.

One known method automatically generates a set of points along an optimal path. The set of points allows a robot to get from a start point to one of a set of goal points. One goal point is chosen over the others because it minimizes movement of the robot. This known method is disclosed in L. Dorst et al., "The Constrained Distance Transformation, A Pseudo-Euclidean, Recursive Implementation of the Lee-algorithm", Signal Processing III (I. T. Young et al. eds; Elsevier Science Publishers B.V., EURASIP 1986) ("L. Dorst et al."); and P. W. Verbeek et al., "Collision Avoidance and Path Finding through Constrained Distance Transformation in Robot State Space", Proc. Conf. Dec. 8–11, 1986, Amsterdam pp. 627–634. The known method plans paths in the configuration space of the robot. Obstacles to robot movement are represented by forbidden states in configuration space. In this space, the series of set points is represented in so-called joint coordinates, this is a set of coordinates that can be used to drive the joints of the robot directly. No complicated coordinate transformations are needed. An advantage of the known method is the simplicity with which it can be expanded to greater numbers of degrees of freedom.

In the prior art, the path in configuration space is found in three steps:

1) A transformation is made of the obstacles and the goals of the robot from points in task space to states in configuration space. The configuration space is discretized.

2) A cost field is created, specifying the total cost needed to reach the closest goal state at each state in configuration space. The particular method used to produce the cost field is described in L. Dorst et al. The method is a repeated scanning of the complete configuration space, while performing a basic cost propagation operation at each state.

3) From the start state, steps are taken in the direction of the cost gradient of the cost field until the goal state is reached. The states passed on the way form the shortest path from start to goal, and can be used as the series of set points.

Steps 1) and 2) are performed only once for a given robot and a given set of obstacles and goals. Using the same cost field, Step 3) can be performed for different start states.

The prior art method has a number of disadvantages. First, in step 2), the whole configuration space has to be scanned several times. Second, the kinds of cost metrics considered are restricted. In particular the cost of transitions between states in configuration space are considered to be the same for a given direction independent of the state at which cost is calculated. These restrictions limit practical applications. For instance, it is not possible to find a path for a robot arm with revolute joints that will result in minimal movement of an end-effector. Minimal time paths are only possible for a few robots which are of limited practical application. A third disadvantage is that following the gradient requires computation of the gradient at every point of the path.

SUMMARY OF THE INVENTION

It is an object of the invention to avoid repeated scanning of the configuration space during creation of the cost field.

It is a second object of the invention to allow use of cost metrics which vary at different states in configuration space. An example of this would be a cost function which allows minimization of the movement of the effector end of the robot.

It is a third object of the invention to avoid computation of the gradient at every state during establishment of a path.

It is a fourth object of the invention to create a path planning method which is easily adaptable to multiple degrees of freedom.

These objects are achieved according to the invention by a process referred to herein as "budding."

These objects are further achieved according to the invention by the use of cost metrics which a re referred to herein as "space-variant metrics."

These objects are still further achieved according to the invention by a process referred to herein as "following the direction arrows".

These objects are further achieved according to the invention by using the space-variant matrices in a multi-dimensional configuration space.

Further objects and advantages of the invention will become apparent in the remainder of the application.

BRIEF DESCRIPTION OF THE DRAWING

These and other aspects of the invention are described herein with reference to the selected embodiments illustrated in the following figures.

FIGS. 4a, 5, 7, 11, 13, 15 and 16 illustrate the progressive organization of a configuration space corresponding to the highly simplified task space by the method called "budding".

FIGS. 4b, 6, 8, 9, 10, 12 and 14 illustrate the progressive building of a heap during organization of the configuration space.

FIG. 19 shows the metric for the whole highly simplified configuration space.

DETAILED DESCRIPTION OF THE PREFERRED EMBODIMENT

A. Definition of Some Terms

A robot has degrees of freedom. The degrees of freedom are the independent parameters needed to specify its position in its task space. Some examples follow. A hinged door has degree of freedom. In other words, any position can be characterized by one parameter, an opening angle. A robot which moves freely over a factory floor has two degrees of freedom, for instance the x- and y- position coordinates. An object in space can be considered to have six degrees of freedom. The 6 independent parameters that need to be specified are three position coordinates and three orientation angles. Therefore in order for a robot to be capable of manipulating an object into an arbitrary position and orientation in space, the robot must have at least six degrees of freedom. An example of a commercially available robot with six degrees of freedom is the Puma 562, manufactured by Unimation, Inc.

A rotational degree of freedom is a degree of freedom that corresponds to an angle about a rotation axis of a robot joint. A rotational degree of freedom is a periodic parameter with values running from 0° to 360°; i.e. 360° corresponds to the same configuration of the robot as does 0°. Translational degrees of freedom correspond to non-periodic parameters that can take on values over an infinite range. Usually, however, the ranges of both rotational and translational degrees of freedom are limited by the scope of the robot.

The "configuration space" of a robot is the space spanned by the parameters of the robot. The configuration space has one dimension for each degree of freedom of the robot. Herein, a point in configuration space will be called a "state". Each "state" in an n-dimensional configuration space is characterized by a set of n values of the n robot degrees of freedom. A robot in the position characterized by the set of values is in a certain configuration. The set of states in the configuration space correspond to the set of all possible robot configurations.

For the purpose of computation, the configuration space is "discretized". This means that only a limited number of states are used for calculations.

Figure 2:
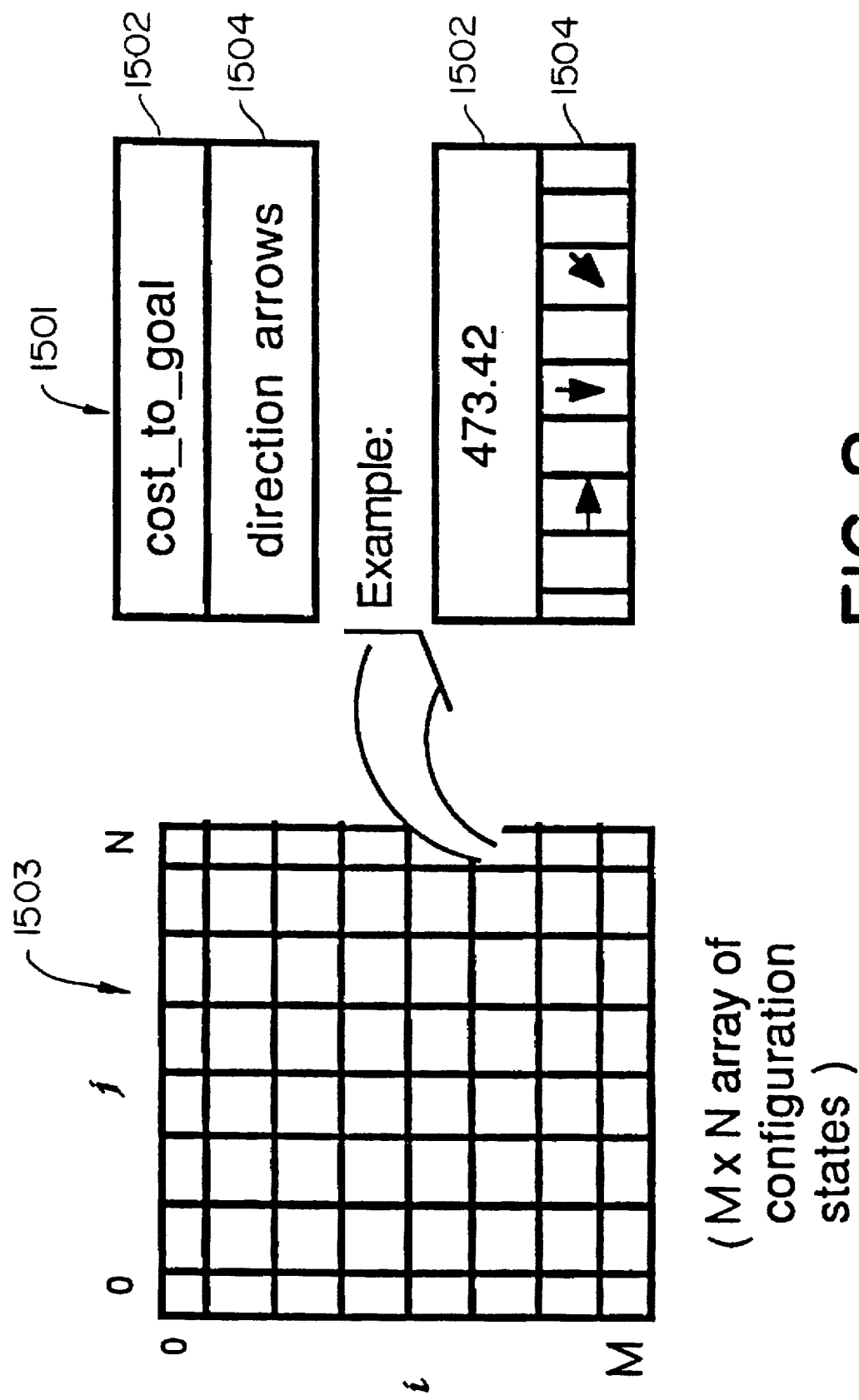
FIG. 2 shows a data structure used as a configuration space.

FIG. 2 shows a data structure 1503 which is used as the configuration space of a robot with two degrees of freedom. Data structure 1503 is an M×N matrix of configuration states. The states are identified by their indices (i,j), where i represents a row number and j represents a column number. Each state (i,j) is itself a data structure as shown at 1501 and has a cost_to_goal field 1502 and a direction arrows field 1504. These fields are filled in by "budding" as described below. The cost_to_goal field 1502 generally contains a number which represents the cost of transition to get from the present state to a nearest "goal state". "Goal states" represent potential end points of the path to be planned.

The cost of a transition in configuration space is a representation of a "criterion" or constraint in task space. A criterion is a cost according to which a user seeks to optimize. Examples of criteria that a user might chose are: amount of fuel, time, distance, wear and tear on robot parts, and danger.

The direction_arrows field 1504 can contain zero or more arrows which indicate a direction of best transition in the configuration space from the present state to a neighbor state in the direction of the goal state resulting in a path of least total cost.

Arrows are selected from sets of permissible transitions between neighboring states within the configuration space. The term "neighbor state" is used herein to mean a state which is removed from a given state by a single permissible transition. One set of arrows could be {up, down, right, left}, where, for instance, "up" would mean a transition to the state immediately above the present state. Another set of arrows could be {NORTH, SOUTH, EAST, WEST, NE, NW, SE, SW}. Yet a third set of arrows could be {$(\overline{0,1})$, $(\overline{1,0})$, ($\overline{0,-1}$), $(\overline{-1,0})$, $(\overline{1,1})$, $(\overline{1,-1})$, $(\overline{-1,1})$, $(\overline{-1,-1})$, $(\overline{1,2})$, $(\overline{-1,2})$, ($\overline{1,-2}$), $(\overline{-1,-2})$, $(\overline{2,1})$, $(\overline{-2,1})$, $(\overline{2,-1})$, $(\overline{-2,-1})$}. It is noted that the arrows "up", "NORTH", and "$(\overline{-1,0})$", are all representations of the same transition within the configuration space. In general one skilled in the art may devise a number of sets of legal transitions according to the requirements of particular applications. Once a set of legal transitions is devised any unambiguous symbolic representation of the set of permissible transitions can serve as the direction arrows. In the case of the directions $(\overline{1,2})$, $(\overline{-1,2})$, $(\overline{1,-2})$, $(\overline{-1,-2})$, $(\overline{2,1})$, ($\overline{-2,1}$), $(\overline{2,-1})$ and $(\overline{-2,-1})$, transition to a "neighbor" state in a two dimensional matrix 1503 actually requires a "knight's move", as that term is known from the game of chess. For example (1, −2) represents the move in the neighbor direction "down one and left 2".

In the configuration space, a metric is defined. The "metric" specifies for each state in configuration space the cost of a transition to any neighboring state. This metric may be specified by a function. For instance, a locally Euclidean metric can be defined as follows. At a state (i,j), the cost of a transition in a neighbor removed from (i,j) by direction arrow (di,dj) is given by $$\sqrt{di^2 + dj^2}.$$

In other situations, it is more convenient to compute the metric in advance and store it. Obstacles can be represented in the metric by transitions of infinite cost. A transition between two arbitrary states must take the form of a series of transitions from neighbor to neighbor. The cost of any arbitrary path from a start state to a goal state is the sum of the costs of transitions from neighbor to neighbor along the path.

In budding, a standard data structure called a heap is used to maintain an ordering of states. This is only one of many possible schemes for ordering, but the heap is considered to be the most efficient schedule for implementations with a small number of parallel processors. Heaps are illustrated in FIGS. 4b, 6, 8, 9, 10, 12 and 14. The heap is a balanced binary tree of nodes each representing a configuration state. In the preferred embodiment, the nodes actually store the indices of respective configuration states. In the heap, each parent state e.g. at 601 has a lower cost__to__goal than either of its two children states e.g. at 602. Therefore, the state at the top of the heap, e.g. at 600, is that with the least value of cost__to__goal. Heaps are well known data structures, which are maintained using well known methods. One description of heaps and heap maintenance may be found in Aho et al., *The Design and Analysis of Computer Algorithms*, (Addison-Wesley 1974) pp. 87–92. In an alternate embodiment, other ways of ordering states may be used during budding. For instance, a queue can be used. This means that modes are not necessarily budded in order of lower cost.

B. Overview of the Method

Figure 1A:
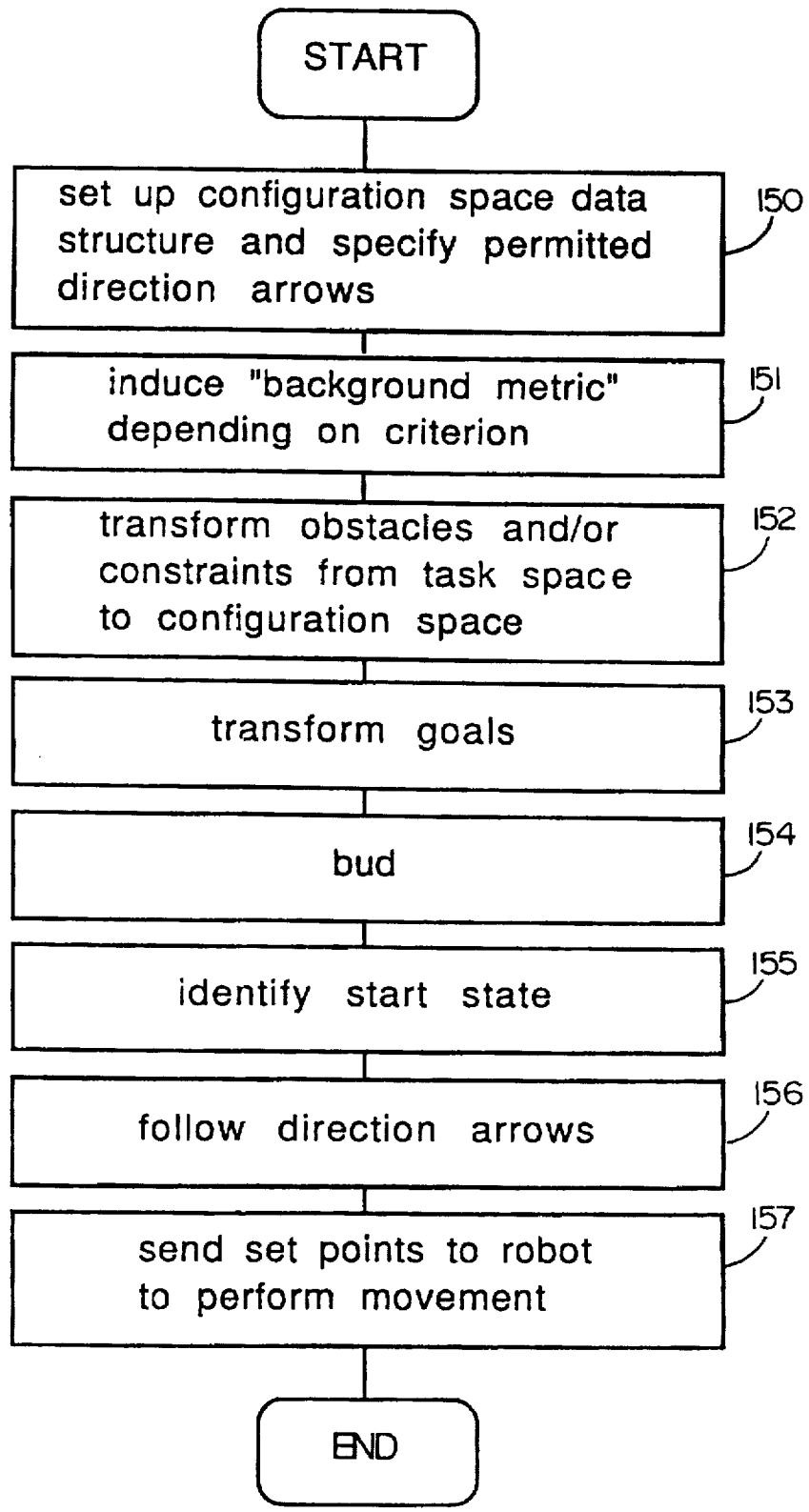
FIG. 1a is a high level flowchart giving a conceptual view of the method of path planning.

FIG. 1a gives a general overview of steps used in generating a series of set points using the method of the invention.

In box 150 the configuration space is set up and permitted direction arrows are specified. One skilled in the art might devise a number of ways of doing this.

One option offered by the method is that of specifying aspects of the configuration space interactively. The number of states in a configuration space might be chosen to reflect how finely or coarsely a user wishes to plan a path. The set of direction arrows may be chosen to be more complete to get finer control of direction. The set of direction arrows may be chosen to be less complete if speed of path planning is more important than fine control of direction.

Other ways of specifying the configuration space and direction arrows are to code them into a program or hardware them into circuitry. These options provide for less flexibility, but can result in increased processing efficiency.

In box 151, a "background metric" is induced by a criterion. A background metric is one which applies throughout a configuration space without taking into account local variations which relate to a particular problem. Another option offered by the method is to specify the transition costs interactively.

In box 152 obstacles and constraints are transformed from task space to configuration space. This transformation generates obstacle states and/or constraint states. In addition or alternatively the transformation can represent obstacles and constraints as part of the metric. Boxes 151 and 152 are represented as separate steps in FIG. 1a, but in fact they can be combined.

In box 153, goals are transformed from points in task space to one or many goal states in configuration space.

In box 154 "budding" occurs. "Budding" is explained below. Budding results in filling the direction__arrows fields of the configuration space with direction arrows.

In box 155, a start state is identified. The start point in task space can be input by a user, or it can be sensed automatically, where applicable. This start point must then be transformed into a state in configuration space. If robot encoders are read, or the command WHERE in Val II is used, one obtains the parameters of the start state immediately, without any need for transformations. The WHERE command returns the joint encoder angles in degrees.

In box 156, the method follows the direction arrows set up in box 154 from the start point indicated in box 155 to the goal state. The path states passed through in box 156 are sent to a robot at 157. The path can be sent in the form of set points. Each set point can then be a parameter of a MOVE POINT( ) command in Val II. The set points can be transformations into task space of the path states passed through in box 156. In an appropriate application, the set points can be the path states themselves. As will be discussed below, in some applications the set points need not be used to direct a robot. They can also be used as instructions to human beings.

Figure 1B:
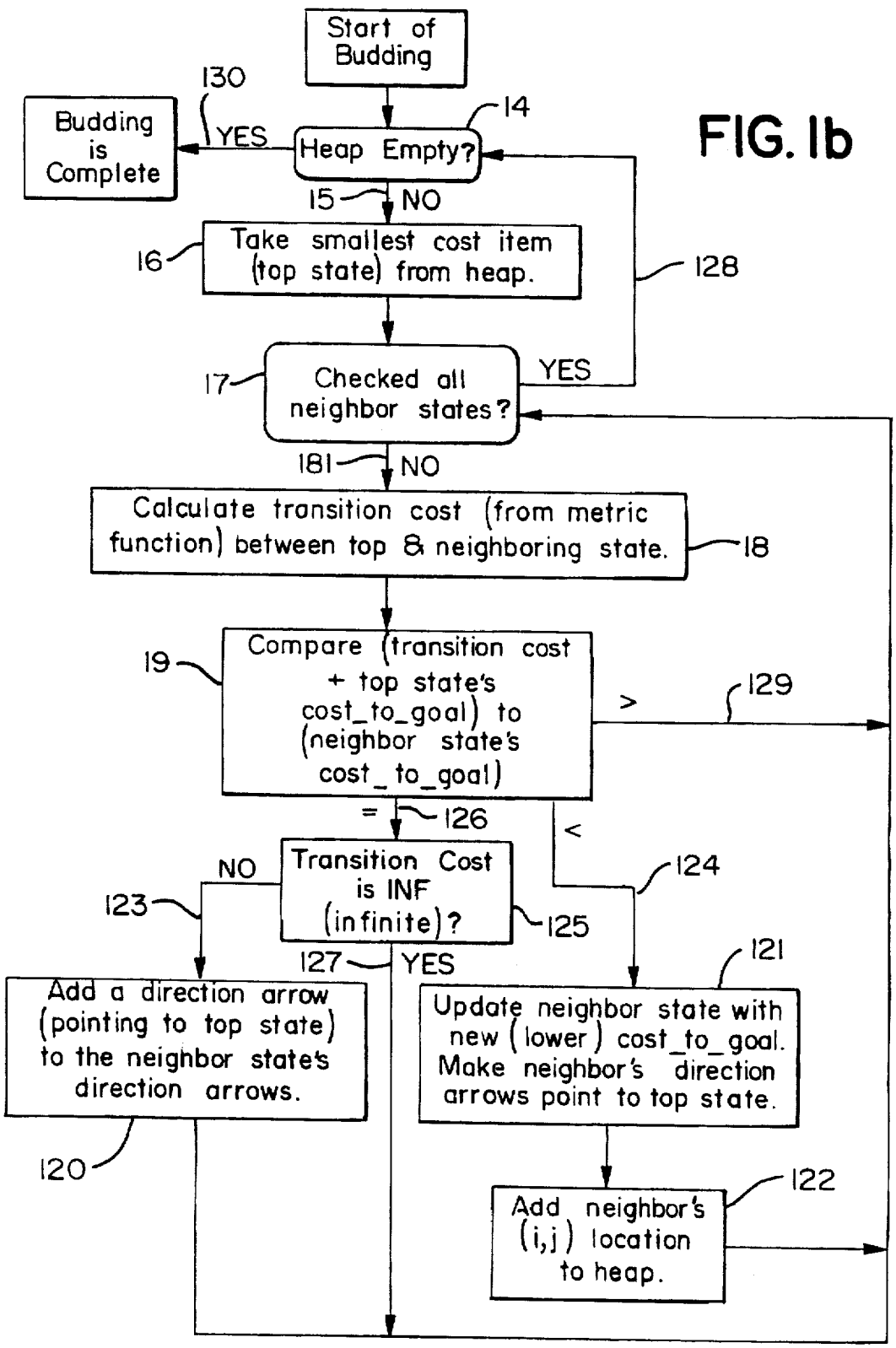
FIG. 1b is a more detailed flowchart of a part of a method of path planning.

FIG. 1b expands box 154 of FIG. 1a.

The method described in the flowchart of FIGS. 1a and 1b is applicable to a large number of different situations. In what follows, the application of the method to a simple example is described first. Then the application of the method to more complicated examples will be described.

C. Applying Budding to a Simple Factory Floor

Figure 3:
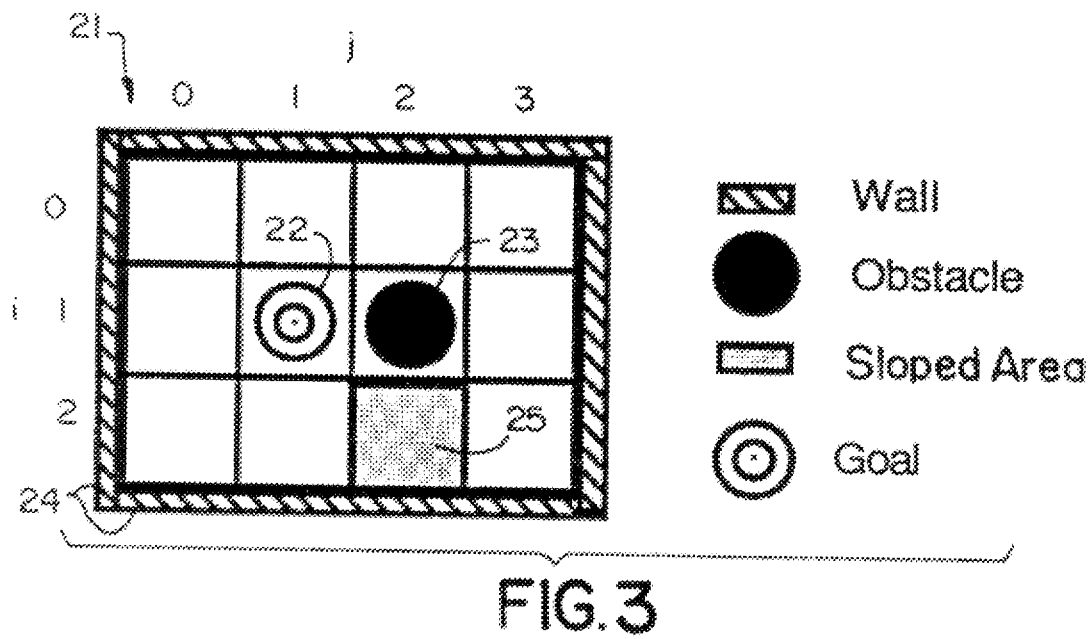
FIG. 3 is a plan of a highly simplified task space.

FIG. 3 represents a factory floor 21 on which a robot is to travel. The map of the actual room is called a "task space". The floor consists of cells. There are four cells horizontally and three cells vertically. The robot moves from cell to cell, in any of 8 directions: horizontally, vertically, or diagonally. The factory floor is bounded by walls 24. There is a pillar 23 which is an obstacle to the movement of the robot. In cell 25, the floor sags. The sagging floor in cell 25 is a constraint to the movement of the robot. The cell 22 is the "goal cell". The problem to be solved is to find the fastest path from any cell to the goal cell 22.

Figure 4A:
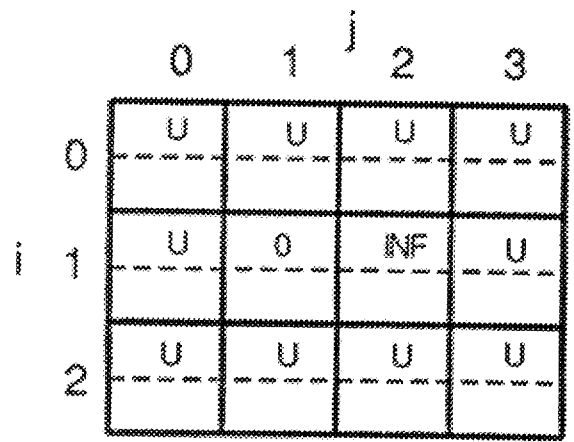

FIG. 4a is a configuration space representation of the task space of FIG. 3. Configuration space represents the combination of all the parameters of the task space. It is noted that the configuration space has twelve configuration states, (0,0), (0,1), (0,2), (0,3), (1,0), (1,1), (1,2), (1,3), (2,0), (2,1), (2,2), and (2,3), described by the i and j locations on the factory floor and denoted as (i, j). Each configuration state has a cost__to__goal field 1502 and a direction__arrows field 1504, as shown in FIG. 2. The set of arrows to be used in the direction arrows field 1504 are $\{(\overline{0,1}), (\overline{-1,1}), (\overline{-1,0}), (\overline{-1,-1}), (\overline{0,-1}), (\overline{1,-1}), (\overline{1,0}), (\overline{1,1})\}$ (or {E, NE, N, NW, W, SW, S, SE)}, which correspond to the 8 directions in task space. In this example, moving from one state to a neighbor state in the configuration space of FIG. 4a corresponds to moving from cell to cell in the task space of FIG. 3.

Because of the simplicity of the current example, and because of the particular geometry, the task space of FIG. 3 and the configuration space of FIG. 4a are very similar. It will not generally be the case that the task and configuration spaces are so similar.

Although the path planning problem given is that of moving from a starting position to a goal position, the solution is actually found by propagating cost waves starting at the goal toward the start. The transition cost for moving from state "a" to a state "b" calculated during "budding"

represents the cost that will be incurred while following the path states through b to a.

"Propagating cost waves", here, is treating layer after layer of unprocessed states. If a queue is used to schedule budding, unprocessed states are treated first in, first out. If a heap is used, then the lowest cost node will always be budded first.

In the simple factory floor example, 'time' is taken to be the cost criterion of movement. It is assumed that the horizontal or vertical movement from cell to cell in the task space generally takes one unit of time. A diagonal movement generally takes √2 units of time, which can be rounded off to 1.4 units of time.

It is important to notice that the transition cost of movement is not commutative (that is, there may be different costs for moving from (2,2) to (1,1) and from (1,1) to (2,2). For instance in the case of the sagging floor 25, it takes longer to move out of the cell than into the cell. In the example we assume that in a horizontal or vertical direction, it takes 2 units of time to climb out of the cell. In a diagonal direction it takes 2.8 units of time to climb out of the cell. However, the cost into the sagging floor area 25 is taken to be the same as a normal movement. It is assumed for this simple problem that the robot slows down when moving uphill, but does not go faster downhill.

The metric for transition costs between states of the configuration space is different from the cost criterion of movement in the task space, because cost waves are propagated from goal state to start state, in other words the transition costs are associated with transitions in configuration space.

Figure 18:
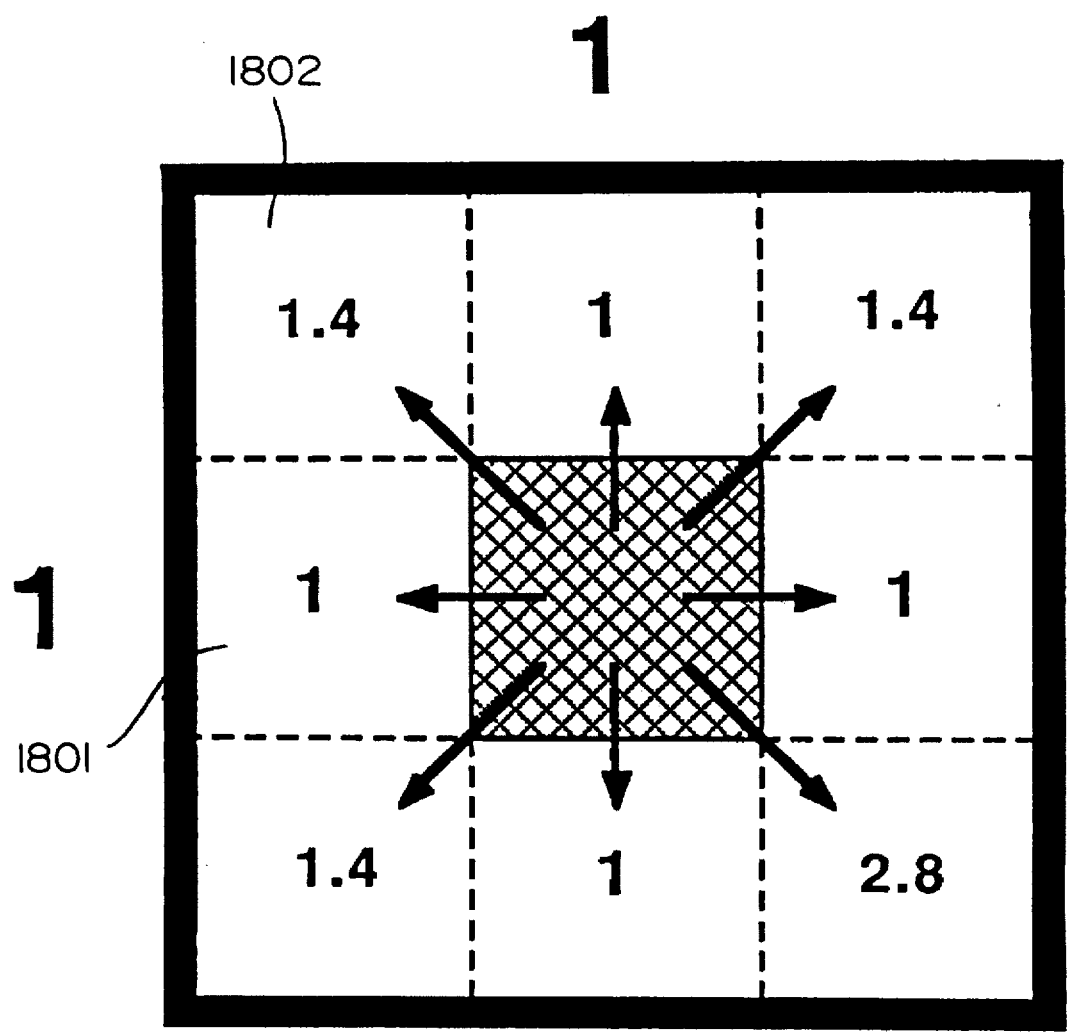
FIG. 18 shows a metric for one state of the highly simplified configuration space.

The data structure of FIG. 18 illustrates the value of the metric applicable to state (1,1) of the configuration space of FIG. 4a. In FIG. 18, a data structure is shown which illustrates the value of the metric applicable to state (1,1) of the configuration space of FIG. 3. State (1, 1) corresponds to the goal cell 22. A transition from state (1,1) to state (1,0) indicated at 1801 would take one unit of time and therefore has a cost of one. A transition from state (1,1) to state (0,0) indicated at 1802 has a cost of 1.4. A transition from state (1,1) to state (2,2) has a cost of 2.8, indicated at 1803. This transition cost indicates that climbing out of the sagging floor area 25 to the goal 22 costs 2.8 units of time. The transition cost of FIG. 18 represents the cost criterion of movement in the task space, in a direction opposite to the transition.

The data structure of FIG. 19 illustrates the values of the metric applicable to the entire configuration space of FIG. 4a.

It is impossible to move into the walls bounding the task space. Another way of stating this is that it takes an infinite amount of time to move into or out of the wall. Therefore the transitions in configuration space corresponding to such movements in task space have a cost "INF". The notation "INF" is used to indicate the largest number that can be represented in the device in which the method is implemented (e.g. in a computer). Examples of the costs of moving out of the walls are illustrated in the outer border of FIG. 19, for instance at 1901. The same cost INF is assigned for movements out of the state (1,2) corresponding to the pillar. This is illustrated in state (1,2) of FIG. 19. It is noted that in state (2,2) the transition costs appear to be normal, even though this state represents the sagging floor 25. Again, the increased costs appear in the neighboring states (1,1), (2,1), (1,2), (1,3), and (2,3). Cost of movement out of the sagging floor area 25 is increased. However, the increased costs appear in the neighboring states, because transitions during cost wave propagation are in a direction opposite to movement in the task space.

With the introduction of the obstacles and of the constraint of the sagging floor, the metric of FIG. 19 has become different depending on location in configuration space. It is now of the type referred to herein as a "space-variant metric".

In box 150 of FIG. 1a, uncosted values U are assigned to the cost_to_goal field of each configuration state, and all the direction arrows fields are cleared.

In box 152 infinite values INF are set in the cost_to_goal field of configuration states (1,2) which represent obstacles such as the pillar 23. Since FIG. 4a is a highly simplified example, there is only one obstacle (1,2). In addition, the bounding walls 24 are obstacles. However, there are often many more obstacles in a real situation.

Figure 4B:
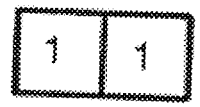

Box 153 assigns zero 0 to the cost_to_goal fields of the configuration states which represent goals (1,1). Since FIG. 4a represents a highly simplified example, there is only one goal (1,1) shown. However, in a real world example there may be many goals. Also in box 153, the indices of the goals (1,1) are added to heap. Standard methods of heap maintenance are employed for addition and removal of states to/from the heap. As a result, the state with the lowest cost will always be the top state of the heap. In the example of FIG. 4a, the sample goal has indices (1,1). Therefore, the indices (1,1) are added to the heap. In a more complicated example, with more goals, the indices of all the goals are added to the heap. FIG. 4a illustrates the configuration space after the completion of boxes 150, 151, 152, and 153 of FIG. 1a. FIG. 4b illustrates the corresponding heap.

Box 14 of FIG. 1b checks to see if the heap is empty. In the example of FIG. 4b, the heap is not empty. It contains the indices (1,1) of the goal. Therefore the algorithm takes the NO branch 15 to box 16.

Box 16 takes the smallest cost item from the heap (top state), using a standard heap deletion operation. In the example of FIG. 4a, the goal (1,1) is the current smallest cost item, with a cost of 0.

Box 17 tests whether all the neighboring states have been checked. Neighbor states are those states which are immediately adjacent to the top state. In the case of FIG. 4a the neighbor states at the present stage of processing are the states (0,0), (0,1), (0,2), (1,0), (1,2), (2,0), (2,1), and (2,2). So far, the neighboring states have not been checked. Therefore the method takes the NO branch 181 from box 17.

In box 18 the transition cost between the top state and its neighboring states is calculated using the metric function.

The transition cost between state (1,1) and state (0,2) is 1.4. Transition costs from state (1,1) to states (1,0), (2,0), (2,1), (2,2), (0,1), and (0,0) are calculated analogously, and are respectively 1, 1.4, 1, 2.8, 1, 1.4. The transition from the top state (1,1) to the obstacle state (1,2) is INF. These are given here beforehand for convenience; but box 18 calculates each of these transition costs one at a time as part of the loop which includes boxes 17, 18, 19, 120, 121, 122, and 125.

Box 19 compares the sum of the transition cost and the contents of the cost_to_goal field of the top state with the contents of the cost_to_goal field of the neighboring state. In the case of top state (1,1) and neighboring state (0,2) in FIG. 4a, the transition cost is 1.4 and the contents of the cost_to_goal field of the top state are 0. The sum of 1.4 and 0 is 1.4. The contents of the cost_to_goal field of the state (0,2) are currently U, uncosted, indicating that state (0,2) is in its initialized condition. One way to implement "U" is to assign to the cost_to_goal field a value which exceeds the largest possible value for the configuration space, other than INF. Performing the comparison in Box 19 thus gives a comparison result of "<". Therefore the method takes branch 124 to box 121. Following branch 124 will be referred to herein as "improving" a state.

Figures 5, 6, 7, 8:
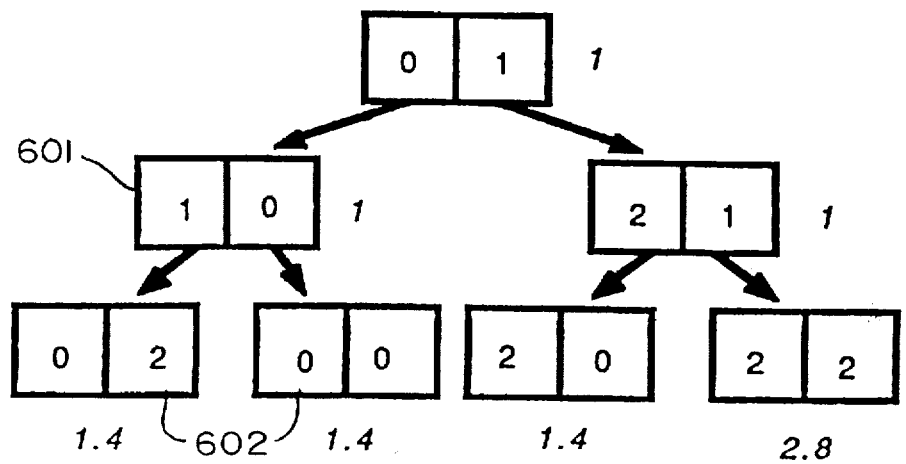

In box 121 the cost_to_goal field of the neighbor state is updated with the new (lower) cost_to_goal, i.e. the sum of the transition cost and the contents of the cost_to_goal field. In other words, for the state (0,2), the cost_to_goal field is updated to 1.4. In addition, box 121 adds an arrow pointing to the top state in the direction arrows field of the neighboring state. In the case of state (0,2), the arrow added is $(\overline{1,-1})$. The downward direction on the figure corresponds to an increase in the first value of the direction arrow. The results of box 121 on state (0,2) are illustrated in FIG. 5.

In box 122, which follows box 121, the indices (i,j) of the neighboring state (0,2) are added to the heap. This is illustrated in FIG. 6. The cost values are noted next to the state indices, for reference, but are not actually stored in the heap.

The method now returns control to box 17. This return results in a loop. The method executes boxes 17, 18, 19, 121, and 122 for each of the neighboring states, other than the obstacle. For the obstacle, the method takes branch 126 to box 125. Since the transition cost is infinite, branch 127 is taken from box 125 to return control to box 17. The effects on the configuration states which are neighbors of the goal (1,1) are illustrated in FIG. 7. The heap corresponding to FIG. 7 is illustrated at FIG. 8.

The above-described process of: exploring all of the neighbors of a first state; assigning appropriate costs and direction arrows to neighbors; and adding 'improved' neighboring states to the heap, is referred to herein as "budding" a state.

After budding the goal state (1,1), all neighbor states have been checked, so the 'yes' branch 128 is taken from box 17. The heap is not empty at box 14, as is illustrated in FIG. 8, so branch 15 is taken from box 14.

In box 16, the next top state is retrieved. This is the smallest cost item which is on top of the heap. The next top state has indices (0,1), 600 in FIG. 8.

The (0,1) state at the top of the heap is the next to be "budded". The neighbors in the directions $(\overline{-1,1})$, $(\overline{-1,0})$, and $(\overline{-1,-1})$ have an infinite transition cost since the walls are constraints. No impact can be made on any other neighbor of the (0,1) state, so no changes are made to the configuration space. For instance, when budding state (0,1), neighboring state (0,2) is considered. At this stage, the cost_to_goal field of (0,2) is already set to 1.4. The transition cost to state (0,2) is 1. The sum of the transition cost and the top state's (0,1)'s cost_to_goal is 2. The sum is thus greater than the neighbor's (0,2)'s preexisting cost_to_goal. Therefore branch 124 is not taken. No improvement can be made. Branch 129 is taken instead, returning control to box 17. Taking branch 129 is referred to herein as "not impacting" another state. The budding of (0,1) is complete. The heap now is as shown in FIG. 9.

The top state (1,0) from FIG. 9 is the next to be budded. Budding of this state does not result in any impact, nor does the budding if node (2,1) (the next to be budded after (1,0)). After consideration of state (2,1) the heap appears as shown in FIG. 10.

As state (0,2) is budded, an improvement can be made to both (0,3) and (1,3). They are then added to the heap, and their costs and direction arrows are updated. The configuration space and heap are now as shown in FIG. 11 and FIG. 12, respectively.

The new top state of the heap, (2,0) as seen in FIG. 12, is next to be budded. Budding of the state (2,0) does not make an impact on any neighbors. The next top of the heap is (0,0), which does not result in any impact either. Nor does (0,3). Once these 3 have been removed from the heap, only (2,2) and (1,3) remain.

Figures 13, 14, 15, 16:
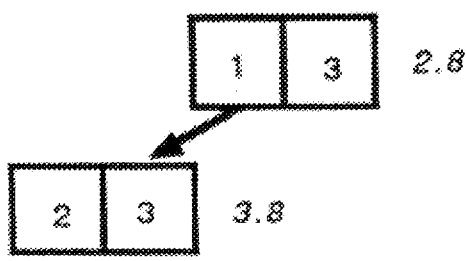

Budding of (2,2) results in improvement of the "uncosted" state (2,3) to its right, so we add the new cost and arrow to that neighbor, and add (2,3) to the heap. No impact can be made on any other neighbor. The results are illustrated in FIGS. 13 and 14.

State (1,3) is now budded. Evaluating the cost to the neighbor (2,3) below gives an equal cost_to_goal to what (2,3) already has. This is referred to herein as an "equivalent" path and corresponds to branch 123 in FIG. 1b. An "alternative arrow" is added to this neighbor (2,3), but (2,3) is not added to the heap.

It is noted that the direction arrows field can contain more than one arrow as illustrated in 1504 of FIG. 2.

The last node in the heap to be budded is (2,3) the budding of which does not impact on any neighbors.

The heap is now empty. Therefore branch 130 is taken in FIG. 1b and budding is completed.

Once the budding of all the states of the configuration space is finished, a path can be followed from any starting position to the goal by simply following the direction-arrows values. The cost in each configuration state gives the total cost required to reach the goal from that state. If the user wanted to start at (2,3), 2 alternate routes exist. Both cost 3.8 (units of time). These routes are illustrated in FIGS. 15 and 16. In FIG. 15 the route starts at (2, 3) and proceeds to (1,3), (0,2), and finally to the goal state (1,1) in that order. In FIG. 16 the route goes over the sagging floor from (2,3) to (2,2) and then to the goal state (1,1). The series of set points sent to the robot would thus be (2,3), (1,3), (0,2), (1,1), or (2,3), (2,2), (1,1). Both will lead to arrival of the robot in 3.8 units of time.

It is important to notice that there are situations that occur where transformed obstacles may completely separate the start state from the goal state, e.g. if (0,2), (1,2) and (2,2) all were constrained by obstacles, forming a wall for instance. In this situation, when budding has completed, there will be no arrows at the starting state. This indicates that there is no path to the goal from this starting state. It is important to know if a path is possible at all, since effort might otherwise be wasted when there is no solution.

Appendix A contains source code implementing the method of FIGS. 1a and 1b.

D. Applying Budding to a Robot Arm Having Two Rotational Degrees of Freedom

1. Coarse Configuration Space

Figure 17:
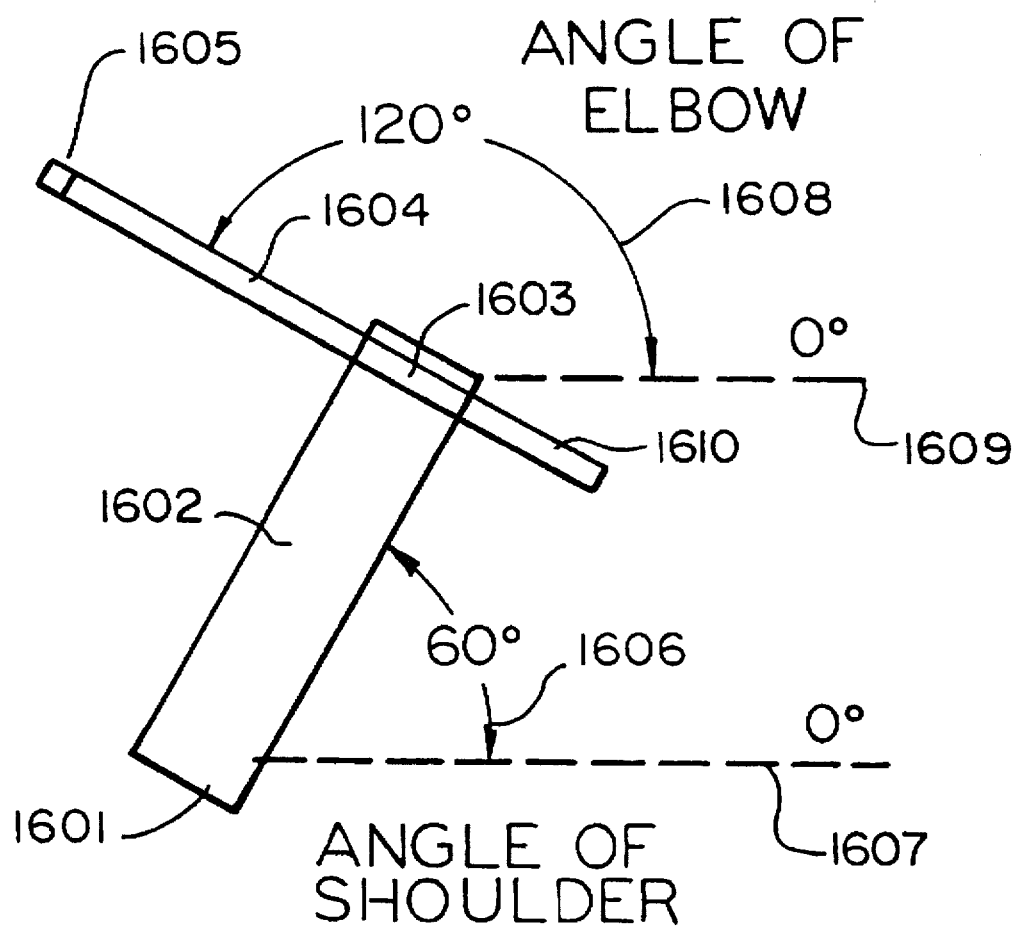
FIG. 17 is a schematic drawing of a two link robot.

FIG. 17 represents a two-link robot. The robot has a shoulder joint 1601, an upper arm 1602, an elbow joint 1603, a forearm 1604, a protruding part 1610 beyond the elbow joint 1603, and an end effector 1605. Because the two-link robot has two joints, the elbow joint 1603 and the shoulder joint 1601, the robot has two rotational degrees of freedom. FIG. 17 illustrates a convention for measuring the angles of rotation. The angle 1606 of the shoulder joint 1601 is 60°, measured from a horizontal axis 1607. The angle 1608 of the elbow 1603 is 120°, measured from a horizontal axis 1609.

Figure 20:
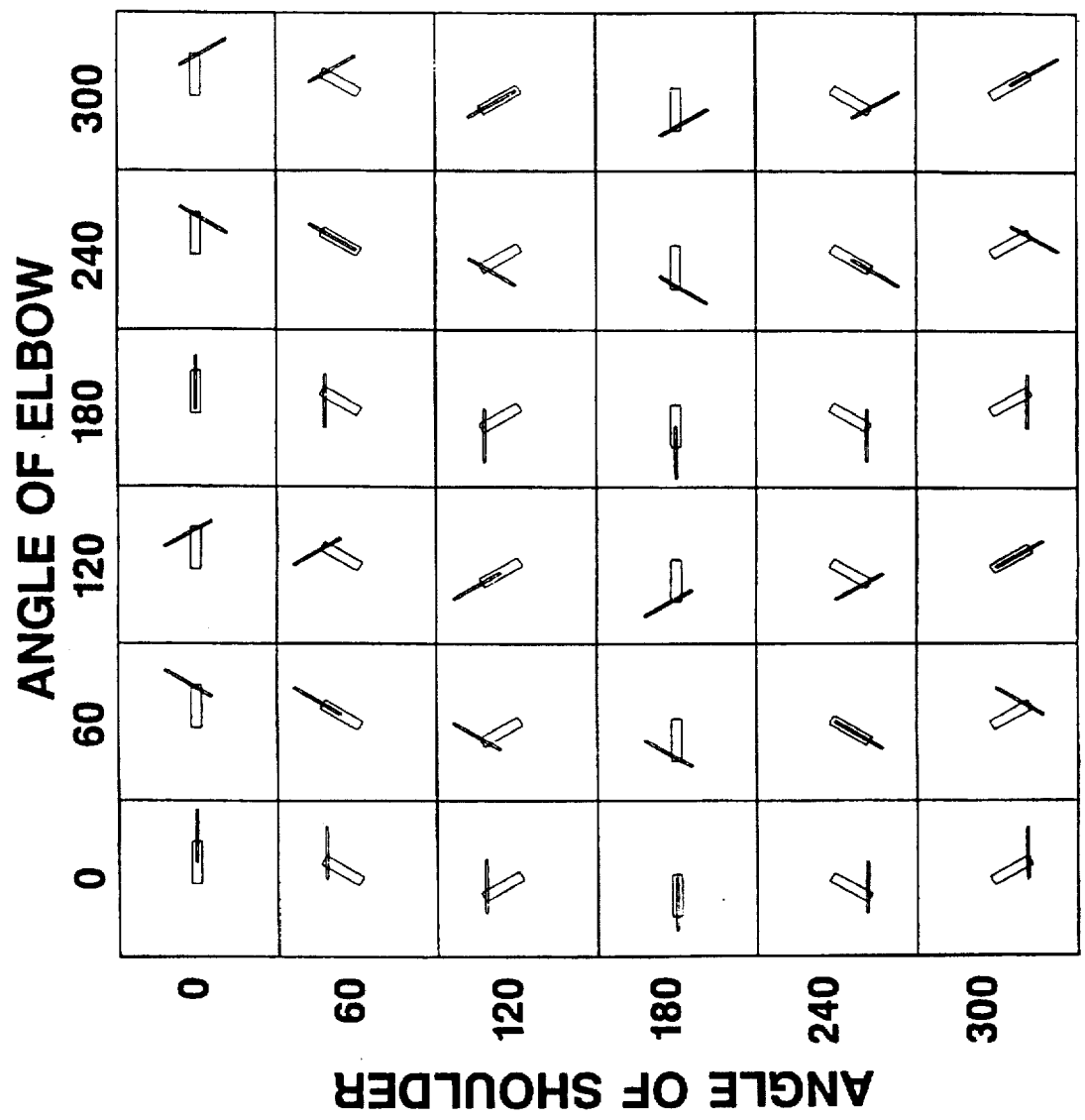
FIG. 20 shows a coarse configuration space for a 2-link robot with two rotational degrees of freedom.

FIG. 20 represents a coarse discrete configuration space for the robot of FIG. 17. This coarse configuration space is presented as a simplified example. In practice, one skilled in the art would generally use a finer configuration space to allow for finer specification of the motion of the corresponding robot arm. The first degree of freedom in FIG. 20 is the angle of the shoulder joint of the robot arm. This first degree of freedom is plotted along the vertical axis of FIG. 20. The second degree of freedom is the angle of elbow of the robot arm and is plotted along the horizontal axis. The discretization of the angles is in multiples of 60°.

The position of the robot which corresponds to each state of the configuration space is illustrated within the appropriate box in FIG. 20. Thus the state (0°,0°) corresponds to the position in which the arm is completely extended horizontally, with both the shoulder and the elbow at 0°. The fat part of the arm, e.g. 2001 is the upper arm, between the shoulder and the elbow. The thin part of the arm, e.g. 2002, is the forearm, between the elbow and the end effector.

As in FIG. 2, each state of the configuration space of FIG. 20 has a cost_to_goal and a direction arrows field. These fields are not shown again in FIG. 20.

2. Finding Obstacle Regions in Fine Configuration Space

Figure 21:
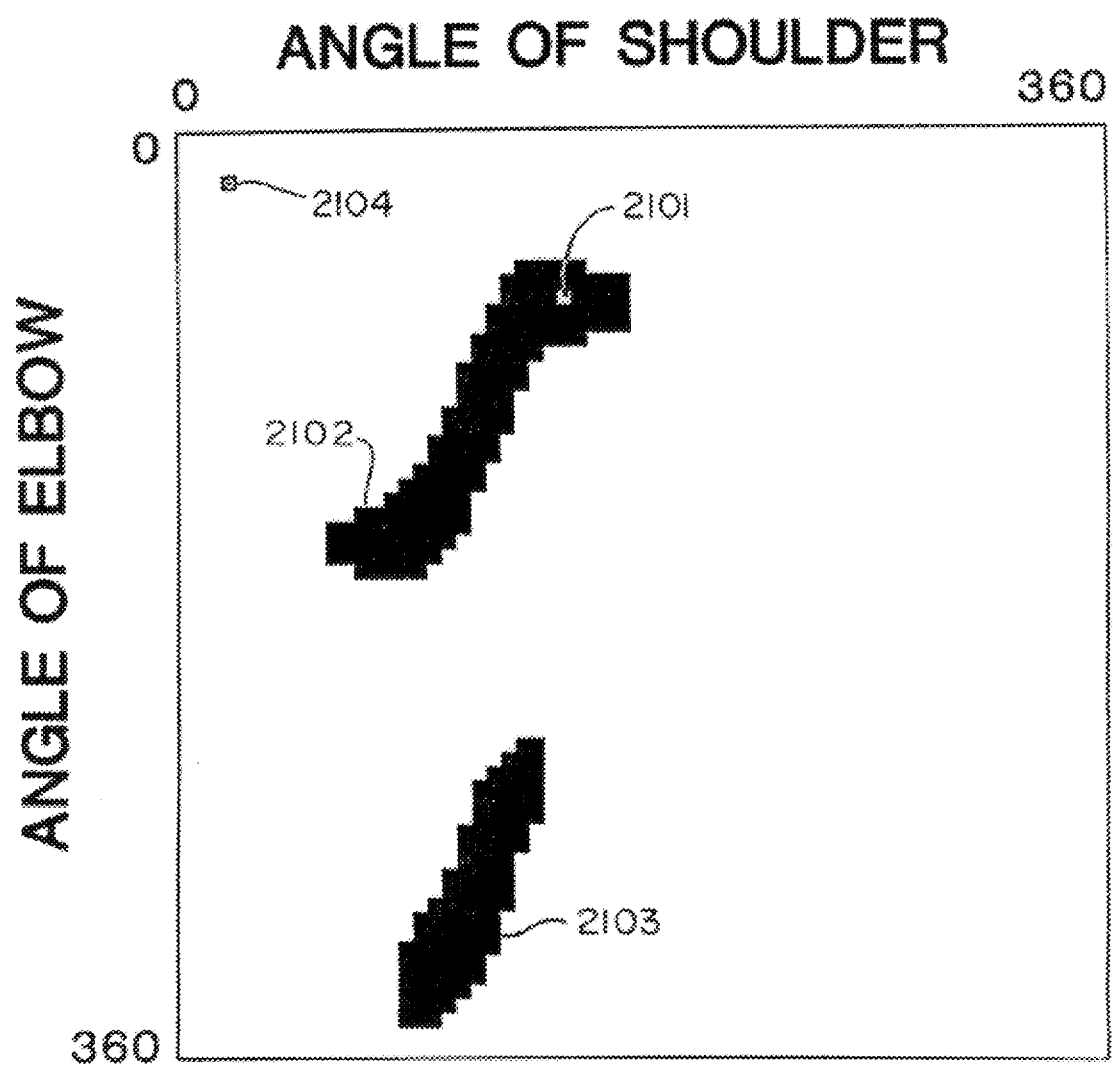
FIGS. 21, 24, 26, 28, 29, 30, 33, 34, 35 and 38 show configuration spaces for the robot with two rotational degrees of freedom.

FIG. 21 is a fine-grained configuration space for a two-joint robot arm. The fine-grained configuration space is a 64×64 array. The individual states of the fine-grained configuration space are not demarcated with separator lines, unlike FIG. 20, because the scale of the figure is too small to permit such separator lines. In the configuration space of FIG. 21, unlike the configuration space of FIG. 20, the vertical axis is the angle of the elbow. The angle of the elbow increases from top to bottom from 0° to 360°. The horizontal axis is the angle of the shoulder. The angle of the shoulder increases from left to right from 0° to 360°. In the coarse space of FIG. 20, the axes were marked off in units of 60°. However, in the fine space of FIG. 21, the axes are divided into units of 360°/64°, or approximately 5.6°.

Figure 22:
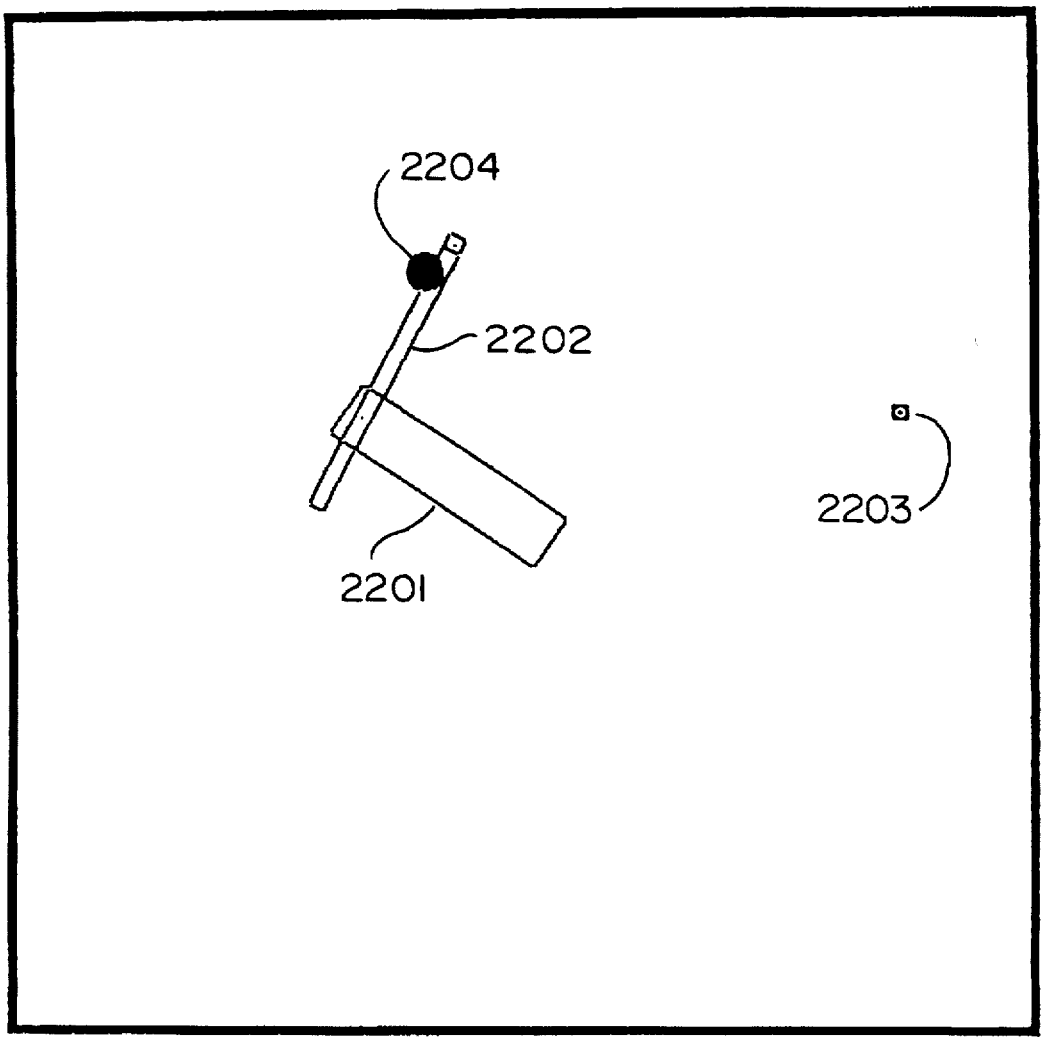
FIGS. 22, 23, 25, 27, 31, 32, 36, 37 and 39 show task spaces for the robot with two rotational degrees of freedom.

FIG. 22 is a task space which corresponds to the configuration space of FIG. 21. In FIG. 22 the upper arm of the two-link robot is at 2201. The forearm is at 2202. A goal is shown at 2203. An obstacle is shown at 2204. The robot is shown in apposition which it in fact cannot assume, that is overlapping an obstacle. This position has been chosen to illustrate a point in the configuration space.

The white state 2101 of the configuration space in FIG. 21 corresponds to the position of the robot in the task space of FIG. 22. The white state 2101 is located in a black region 2102 which is a representation of the obstacle 2204. There is a second black region 2103 which also represents the obstacle. The black areas represent all of the configurations in which the robot will overlap the obstacle. The goal appears at 2104.

It is noted that there are two obstacle regions 2102 and 2103 in FIG. 21. This results because some states correspond to the forearm end 1604 hitting the obstacle and some states correspond to the protruding part 1610 hitting the object.

One skilled in the art might devise a number of ways of determining which regions in configuration space correspond to an obstacle in task space. One simple way of making this determination, is to simulate each state of the configuration space one by one in task space and test whether each state corresponds to the robot hitting the obstacle. Standard solid-modelling algorithms may be used to determine whether the robot hits the obstacle in task space. One such set of algorithms is implemented by representing surfaces using the B-rep technique in the Silma package sold by SILMA, 211 Grant Road, Los Altos, Calif. 94022. In the task space of FIG. 22 the forearm 2202 hits the obstacle 2204, which corresponds to the white state 2101 of the configuration space. The white state 2101 therefore becomes part of the obstacle region.

Figure 23:
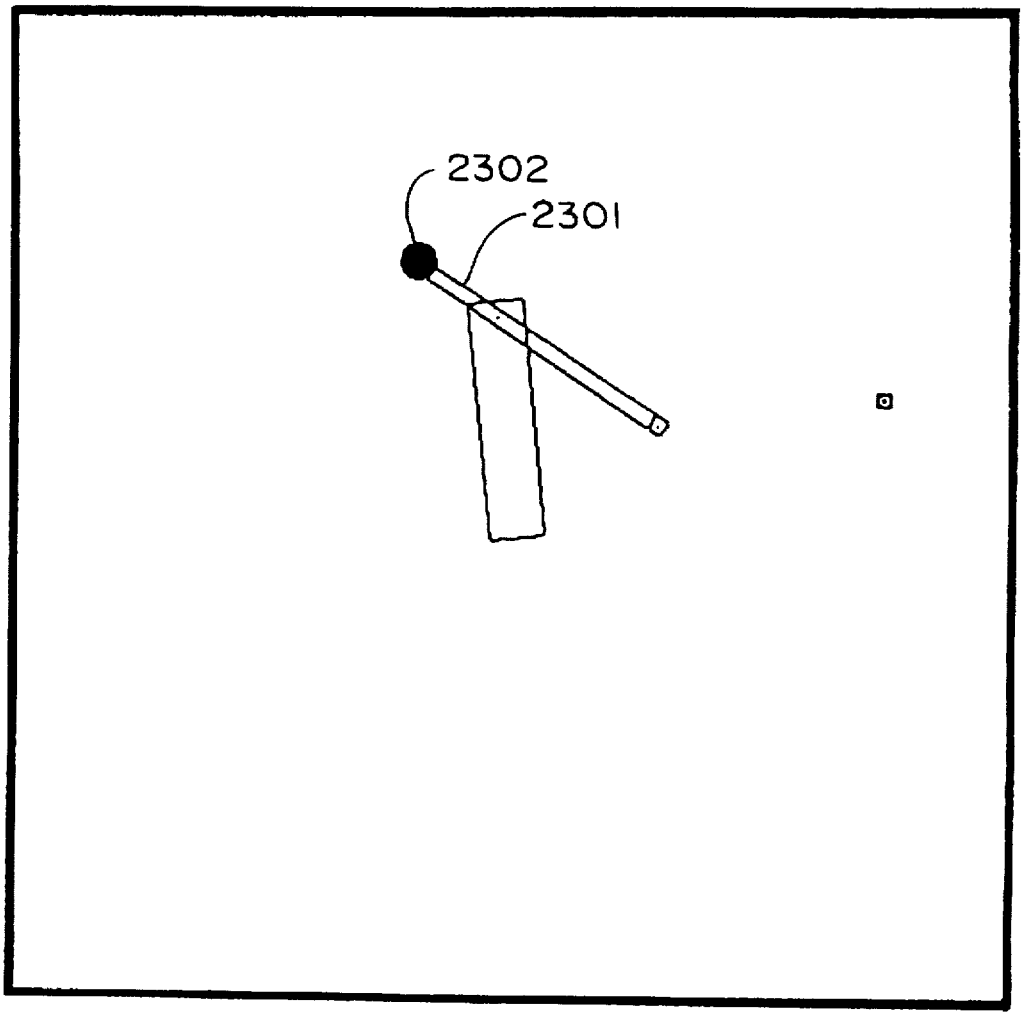
Figure 24:
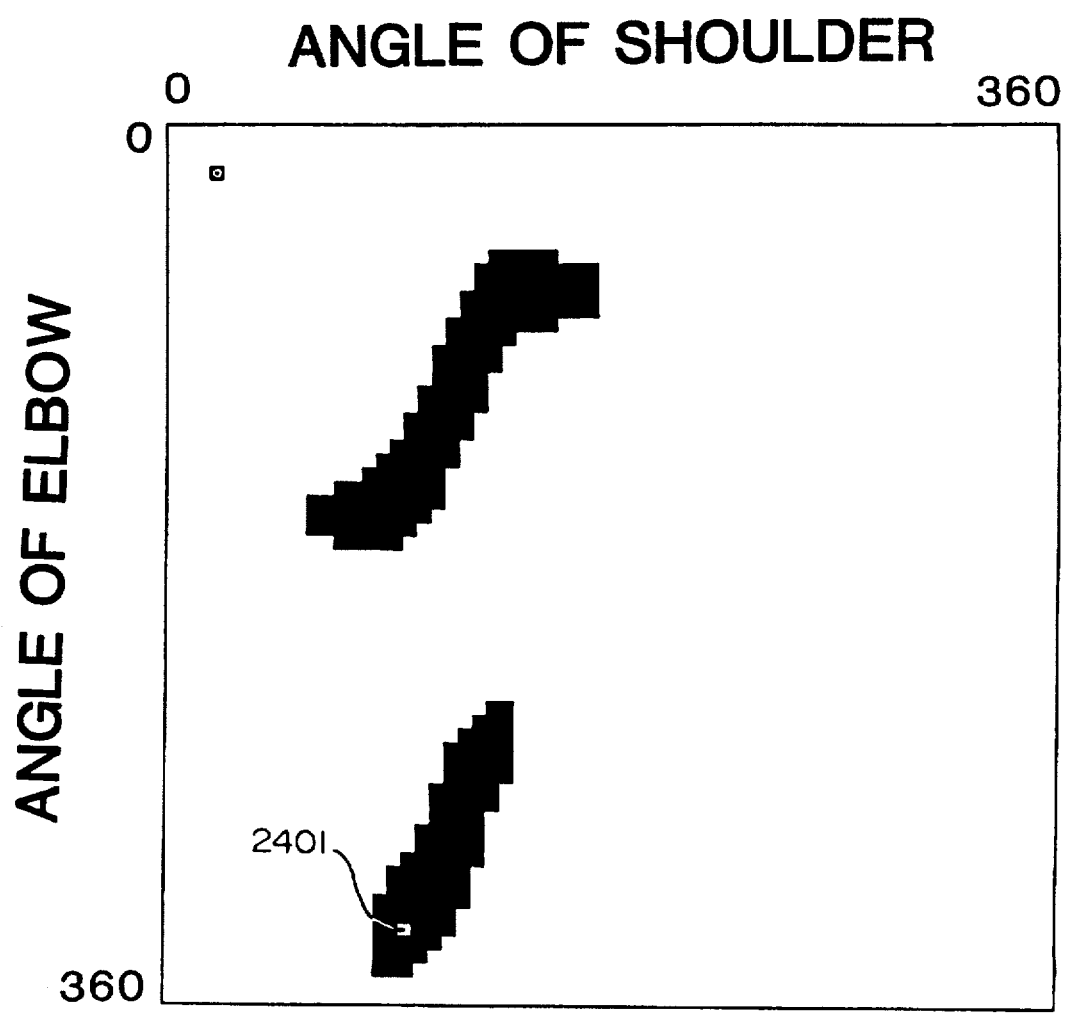

FIGS. 23 and 24 illustrate the determination of an additional state in the obstacle region of the configuration space.

In the task space of FIG. 23 the elbow 2301 hits the obstacle 2302. This position of the robot corresponds to the white state 2401 in FIG. 24.

Figure 25:
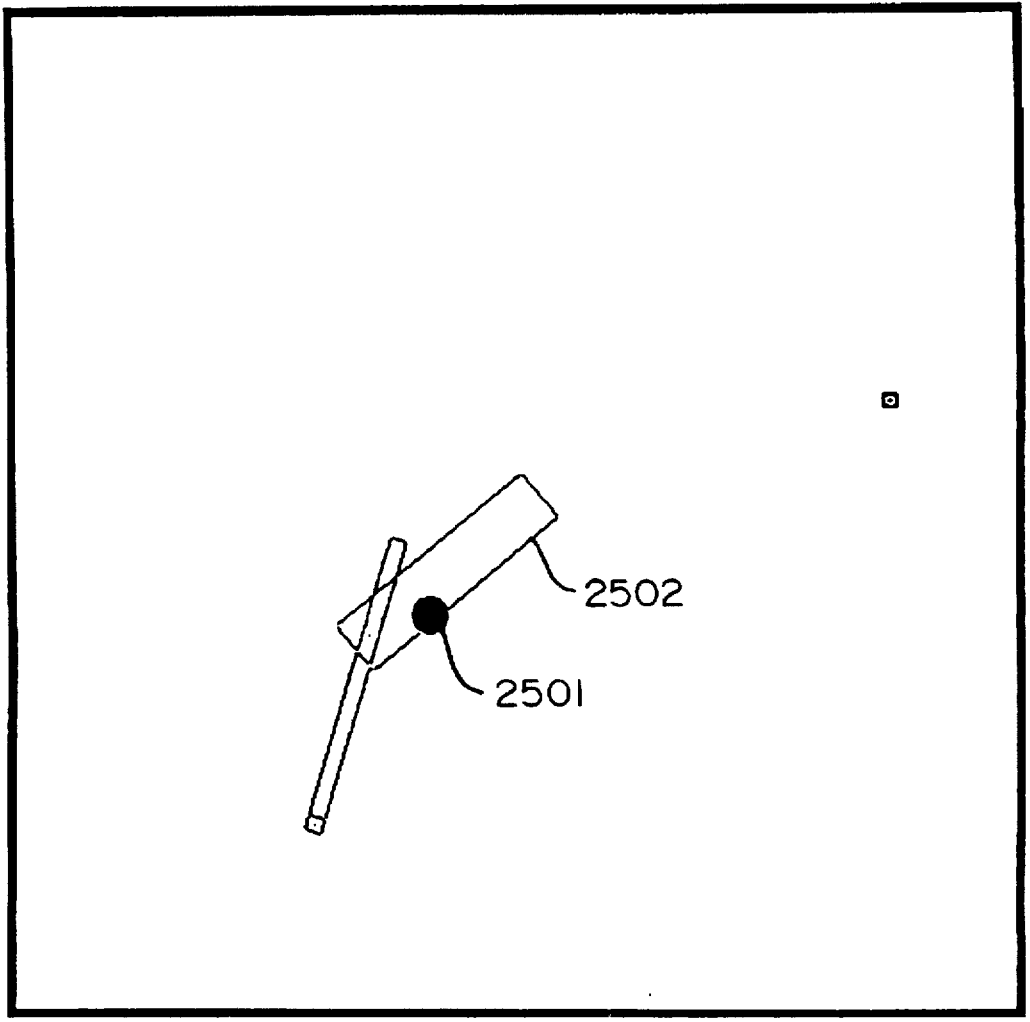
Figure 26:
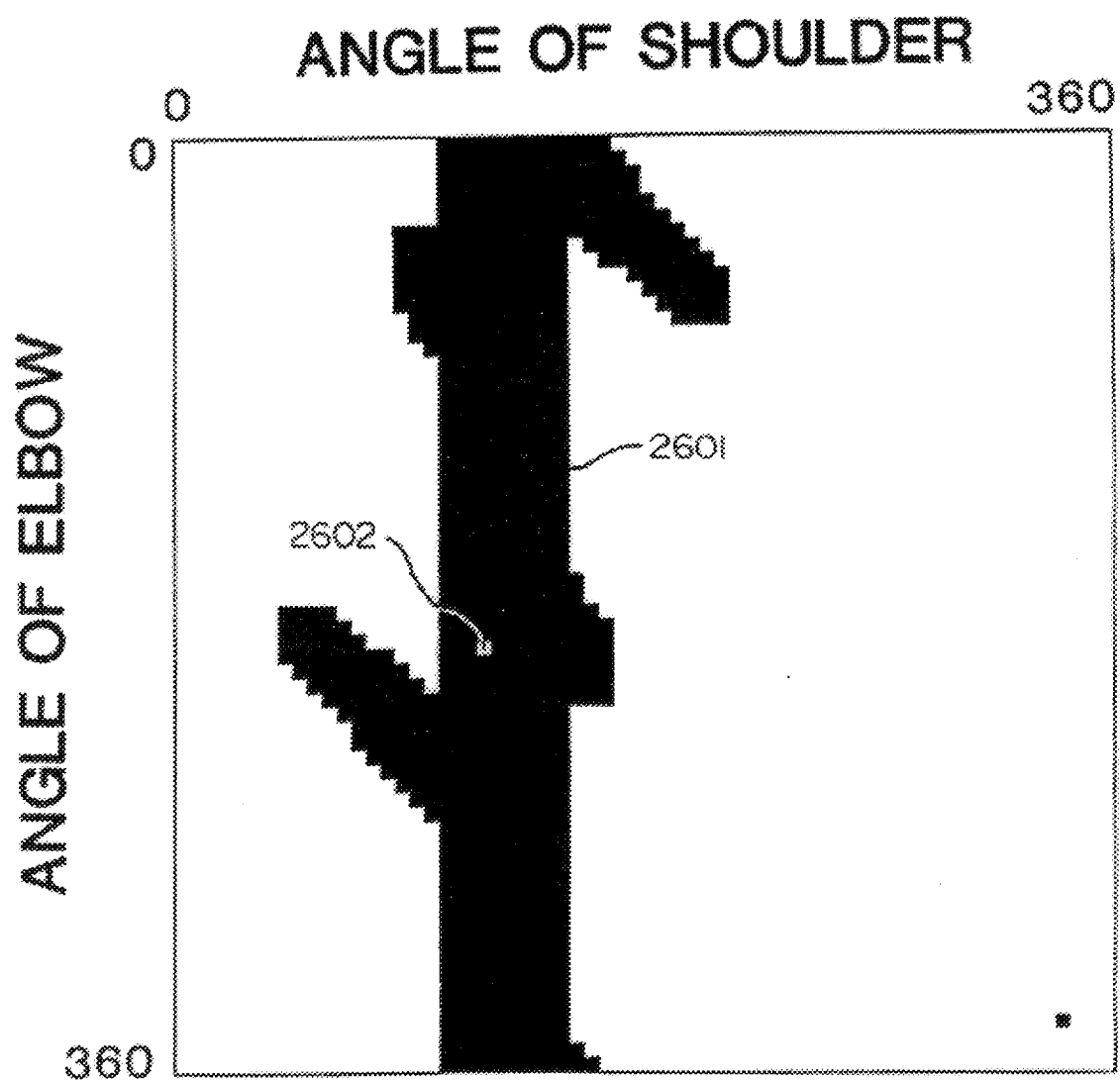

In the task space of FIG. 25, the obstacle 2501 has been moved. Now the upper arm 2502 of the robot hits the obstacle. In the task space of FIG. 25, all elbow angles for which the shoulder 2502 of the robot hits the obstacle 2501 are obstacle states because these states correspond to some part of the robot hitting an obstacle. This range of angles appears as a solid vertical bar in the obstacle region 2601 of the configuration space of FIG. 26. The bar appears because for the angles of the shoulder joint where the obstacle-hit occurs, any value of the elbow joint angle would lead to a collision. The particular position of the robot in the task space of FIG. 25 is illustrated as the state located at the white state 2602.

Once the states which hit the obstacle are identified, the states should be assigned a cost_to_goal of INF as indicated in box 12 of FIG. 1b. In FIG. 21 and what follows, assigning a cost_to_goal of INF will be represented by making the region of states corresponding to the obstacle black in the configuration space.

3. Budding Using a Simple Metric in Fine Configuration Space

Figure 28:
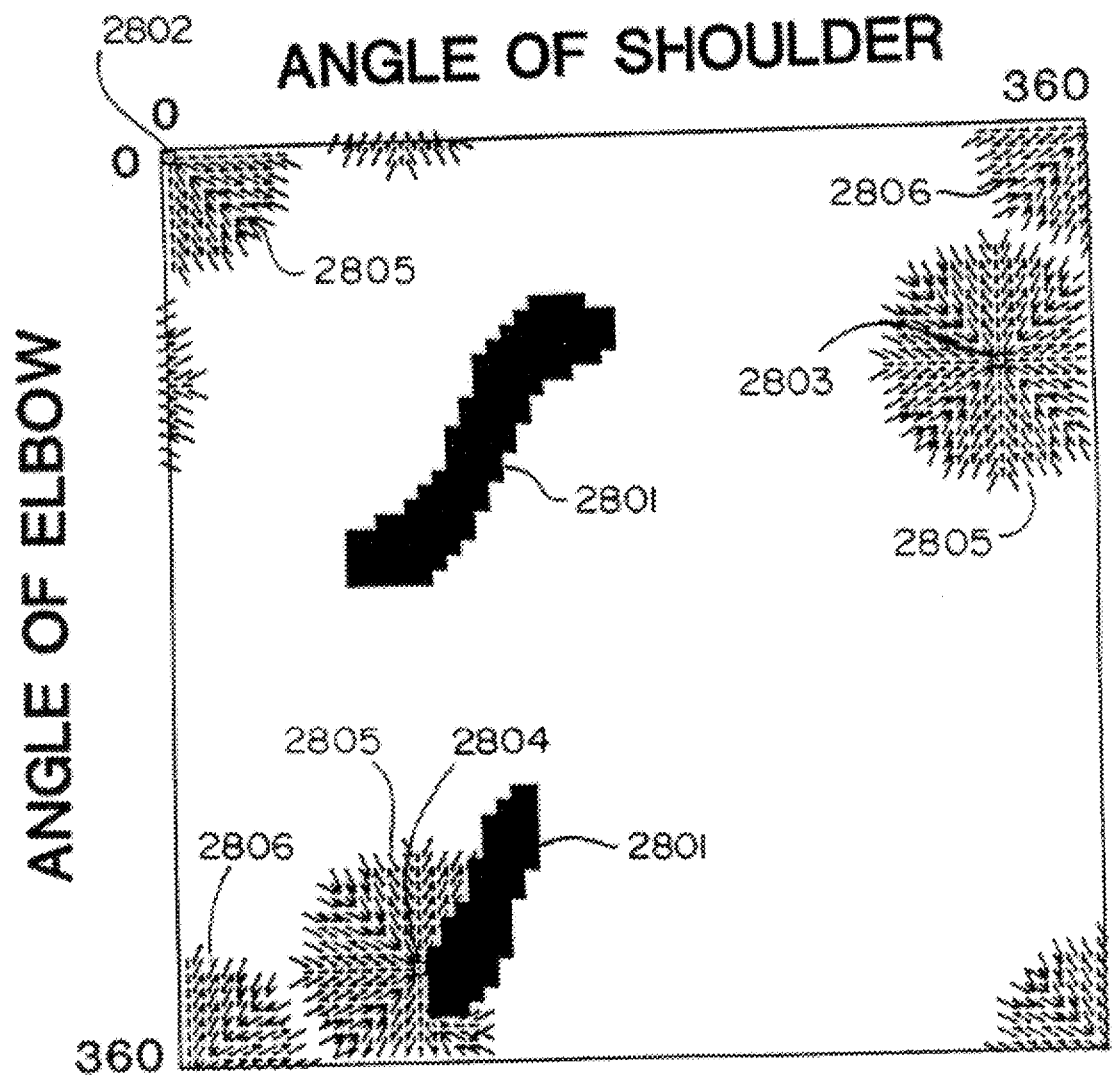
Figure 29:
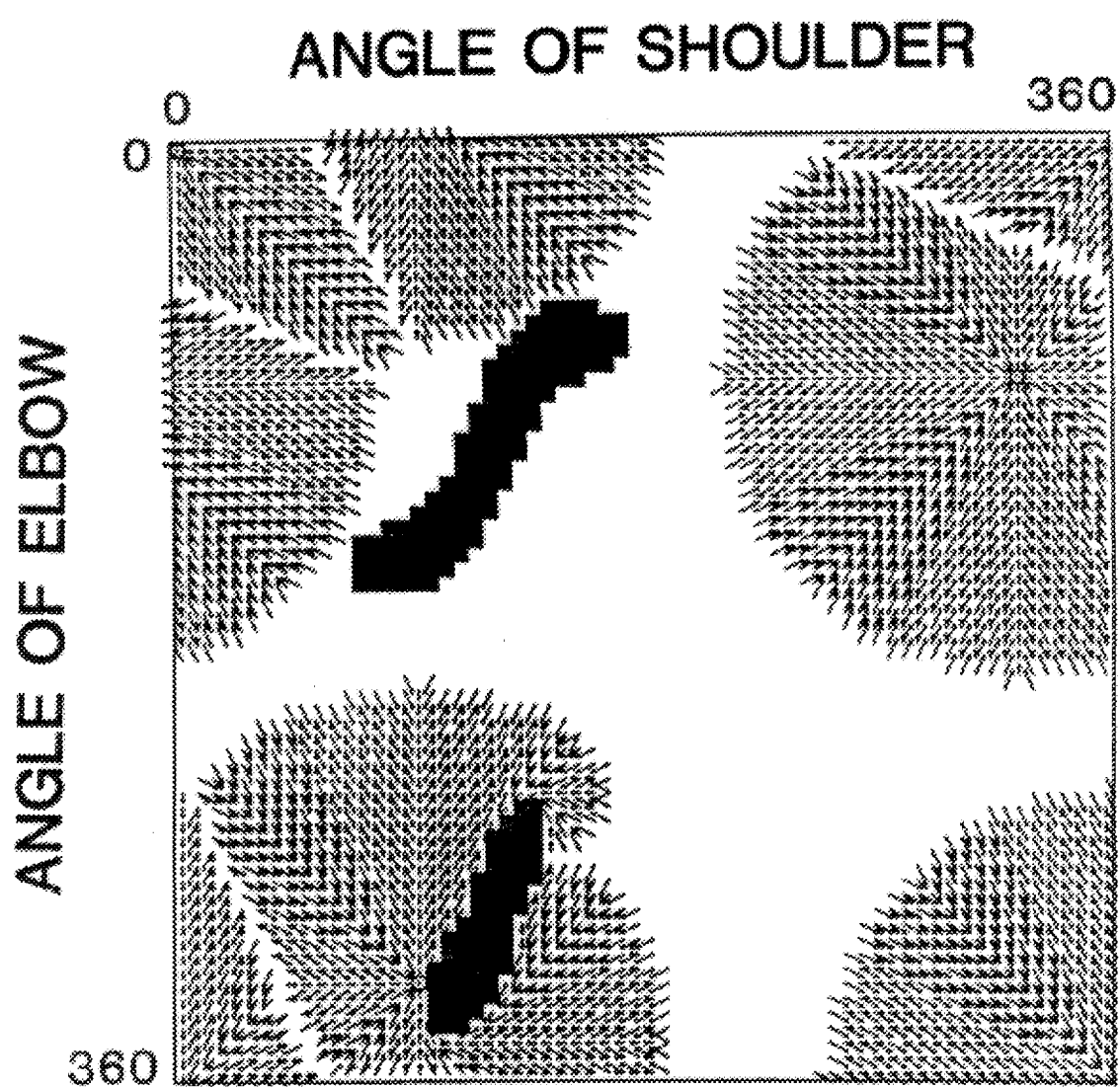
Figure 30:
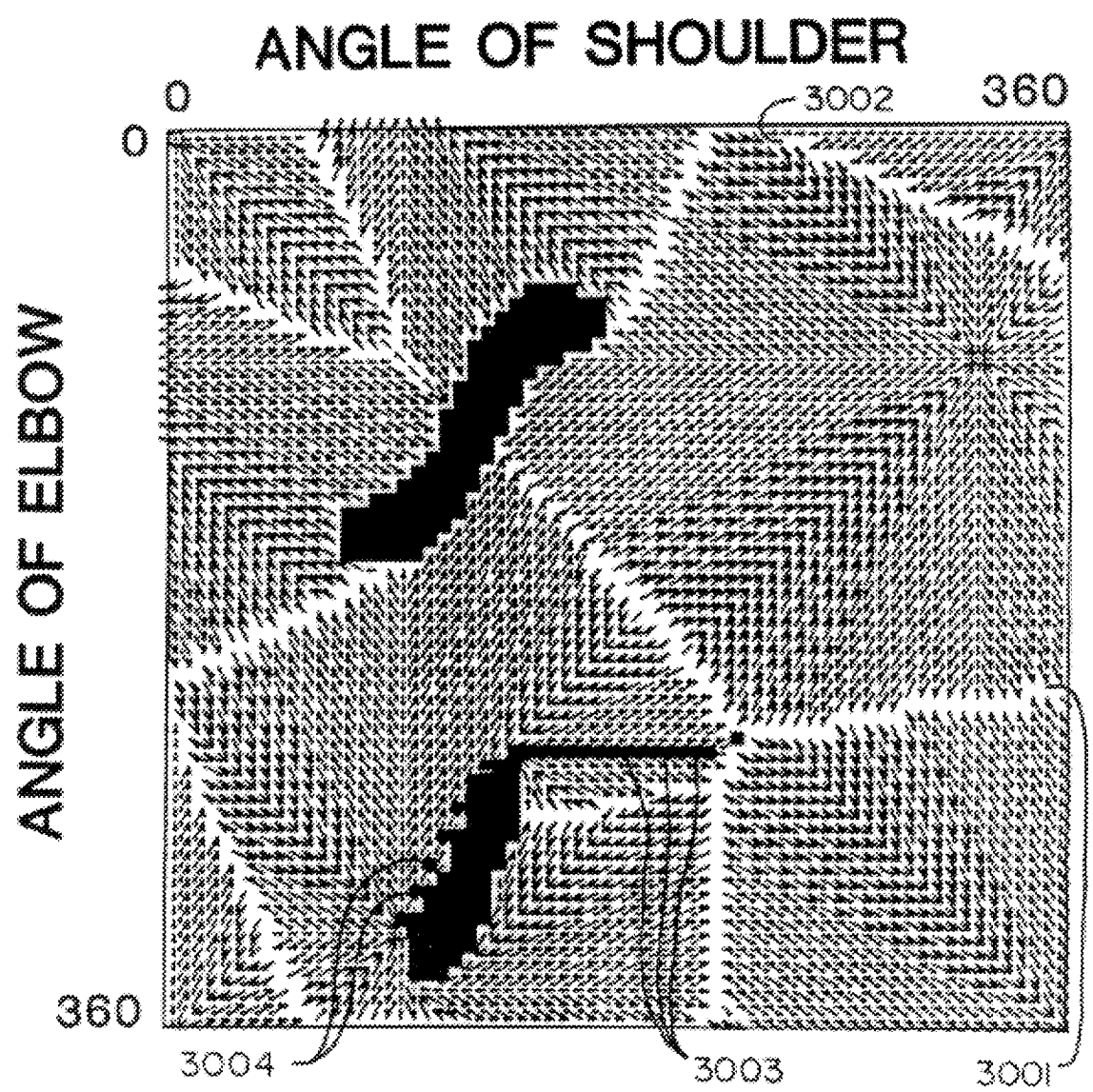

For simplicity, all of the steps of budding in FIG. 1b will not be gone through in detail with respect to the fine-grained two-dimensional configuration space. However, FIGS. 28, 29, and 30 illustrate various stages in the process of budding for such a space, once the obstacle regions and goal states have been located.

For a fine-grained configuration space, a metric data structure such as is illustrated in FIG. 19 may become awkward. A function can be used in place of the data structure. For instance the cost of a transition $(\overline{di,dj})$ at a location (i,j) can be $C(i,j,di,dj)=INF$ if the state $(i+di,j+dj)$ is an obstacle (Eq1)

$$\sqrt{di*di + dj*dj}$$

elsewhere

Figure 27:
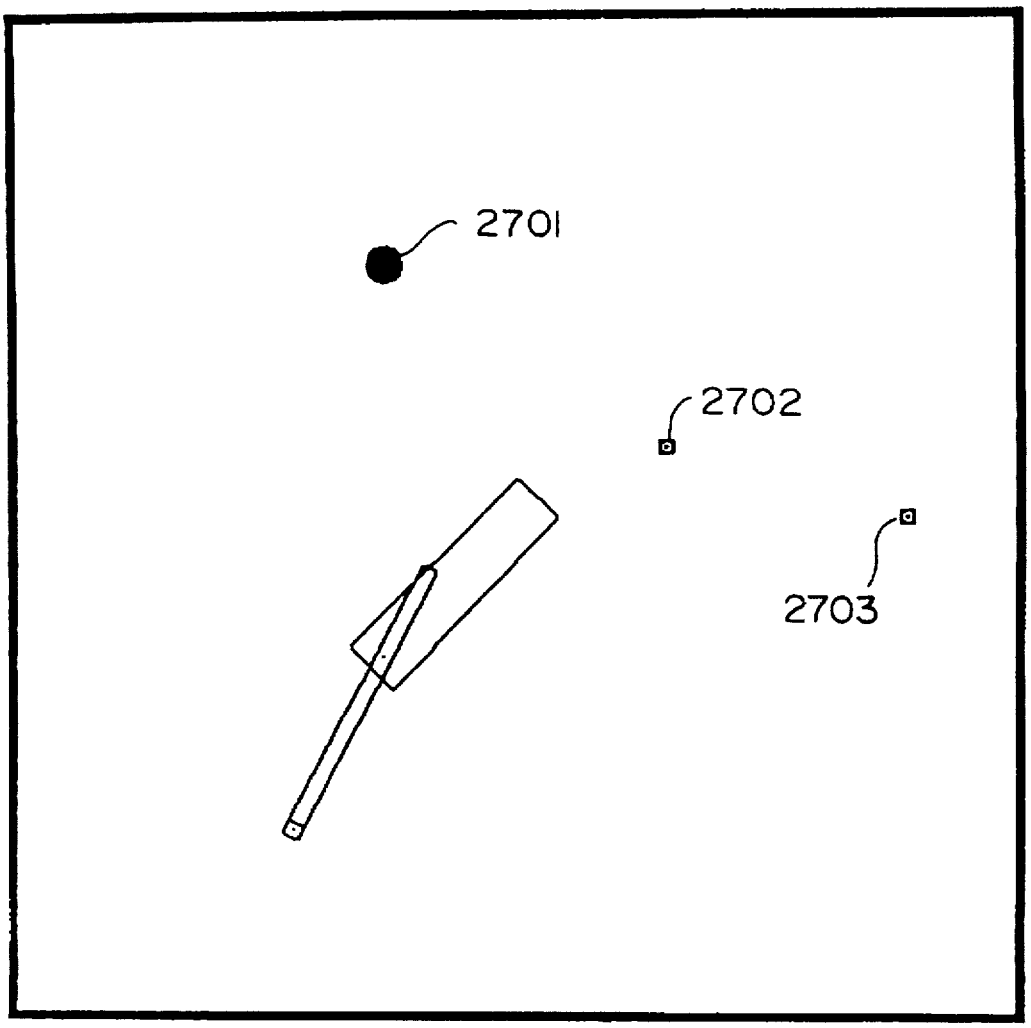

In the task space of FIG. 27, there is one obstacle 2701. There are two goals 2702 and 2703. The presence of two goals indicates, for instance, that the robot can perform an assigned task equally well at either goal. Therefore the robot should attempt to reach that goal which is the least expensive to reach.

The configuration space of FIG. 28 corresponds to the task space of FIG. 27. The obstacle regions 2801 correspond to the obstacle 2701. The goal 2703 corresponds to the state at 2802. The states at 2803 and 2804 both correspond to the goal 2702. This occurs because the robot arm can take two positions and still have the end effector at the same point. In one of these two positions, the robot looks like a right arm and in the other position the robot looks like a left arm. In FIG. 28, the process of budding around the goal states has begun. A number of direction arrows, e.g. at 2805, appear. It is to be noted that the configuration space of FIG. 28 corresponds to two rotational degrees of freedom and is therefore periodic so that the picture will 'wrap-around' both horizontally and vertically. This manifests itself in that the configuration space of FIG. 28 is topologically equivalent to a torus. Therefore direction arrows, e.g. at 2806, which point to goal state 2802 appear instead to point to the boundaries of the configuration state. In fact, it is perfectly possible for a path of the robot to wrap around the configuration space.

In the configuration space of FIG. 29, the process of budding around the goal states has continued. It can now be seen that, with budding, the direction arrows propagate out from the goal states, but they point to the goal states. States with equal cost_to_goal are located on what appear to be equal cost wavefronts flowing out from the goal. For this reason, in the art the term "propagating cost waves" has been used to describe the process of assigning direction arrows to states in configuration space. It is noted that the prior art did not use budding to propagate cost waves, but instead produced a cost field by scanning the configuration space from top to bottom and then from bottom to top until the states stabilized.

The configuration space of FIG. 30 shows how the direction arrows look when budding has been completed. There are a number of blank spaces, e.g. 3001, 3002, where there appear to be no direction arrows. In fact these are states with direction arrows pointing in more than one direction. In other words, these are states which have more than one path of equivalent cost to the goal state.

Figure 31:
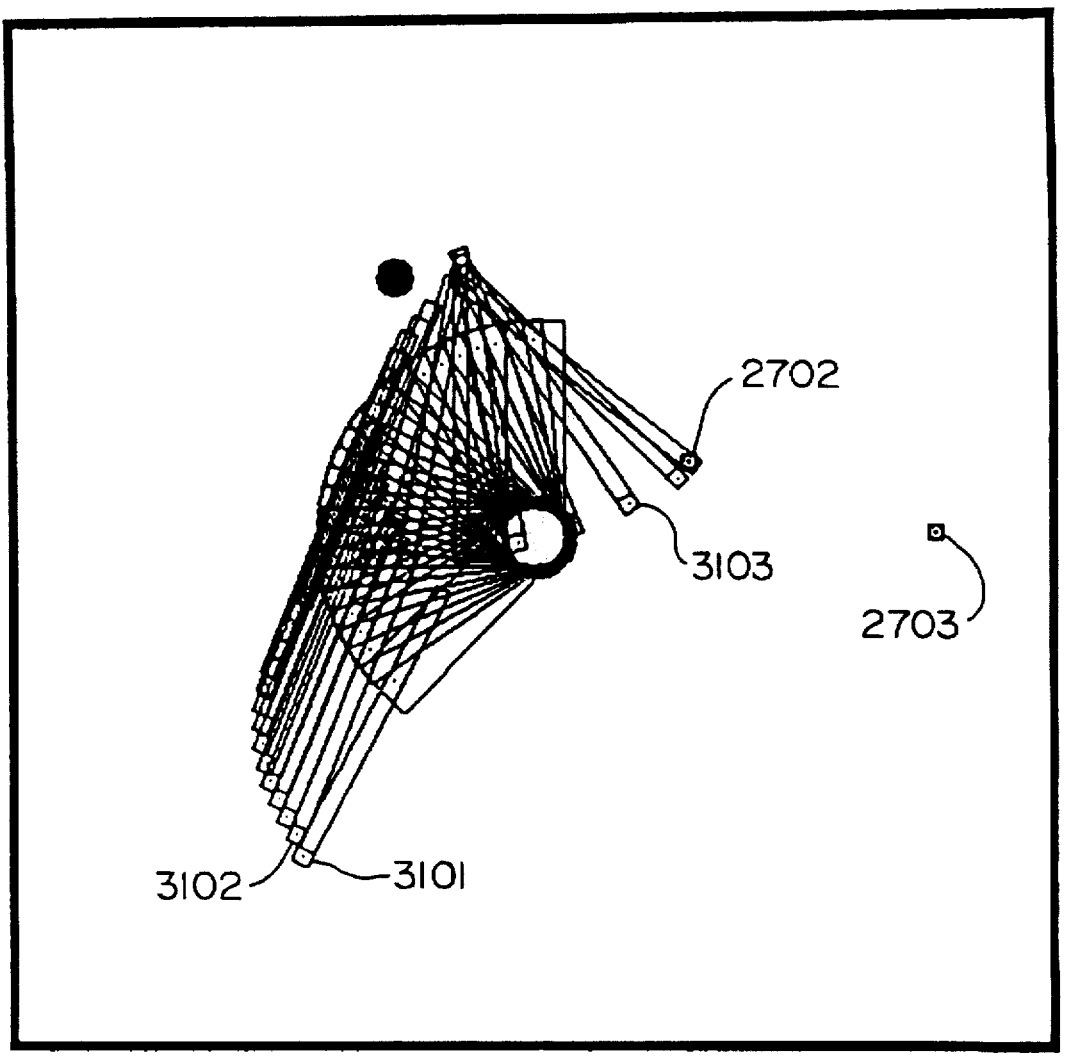

FIG. 31 is the same as the task space of FIG. 27, except that the motion of the robot along a path from starting point 3101 to goal 2702 is shown. The motion is shown by the superposition of a number of images of the robot in various intermediate positions, e.g. 3102 and 3103, along the path. The path also appears on the configuration space of FIG. 30. The path appears as shaded dots, e.g. 3003 and 3004, which are not part of the obstacle region.

4. OTHER METRICS

The metric of Eq.(1) is a locally "Euclidean metric", because it allocates transition costs to the neighbor states equal to their Euclidean distance in configuration space. As a consequence, the path in configuration space in the absence of obstacle regions is an approximation of a straight line. The approximation is better if more directions are available as direction arrows. The accuracy of the approximation using the 8 direction arrows corresponding to the horizontal, vertical and diagonal transitions is about 5% maximum error, 3% average error. The accuracy of the approximation also using the knight's moves is about 1%. We will call the shortest paths produced by using a Euclidean metric in configuration space "minimum motion" paths.

In some applications, one may be interested in paths that are optimal in the sense that they minimize the distance travelled by the end effector. We will call this "minimum distance" paths. For example, if something is gripped that should not be moved too much, minimum distance paths are the paths sought. These minimum distance paths can also be found by the method described. The only difference in the procedure is that a different background metric is used. The transition cost $c(i,j,di,dj)$ in a state $(i,j)$ for direction arrow $\overline{(di,dj)}$ is now:

$$c(i,j,di,dj) = (di)^2 + (dj)^2 + 2\cos 2\pi \left( \frac{i}{N} - \frac{j}{M} \right) \cdot di \cdot dj \qquad \text{Eq (2)}$$

where N is the number of states along the i-axis, and M is the number of states along the j-axis. This is the distance travelled by the end effector. As an example of the use of this metric, consider the task space of FIG. 32. A goal 32001 is indicated, as are obstacles 32002 and the robot in the start configuration 32003. FIG. 33 shows the corresponding configuration space. The goal 32001 in task space transforms to two goals 33001 in configuration space, each corresponding to one of the two ways in which the end effector can touch the goal point in task space. The obstacles in task space transform to obstacle regions in configuration space. These are indicated in black.

Figure 33:
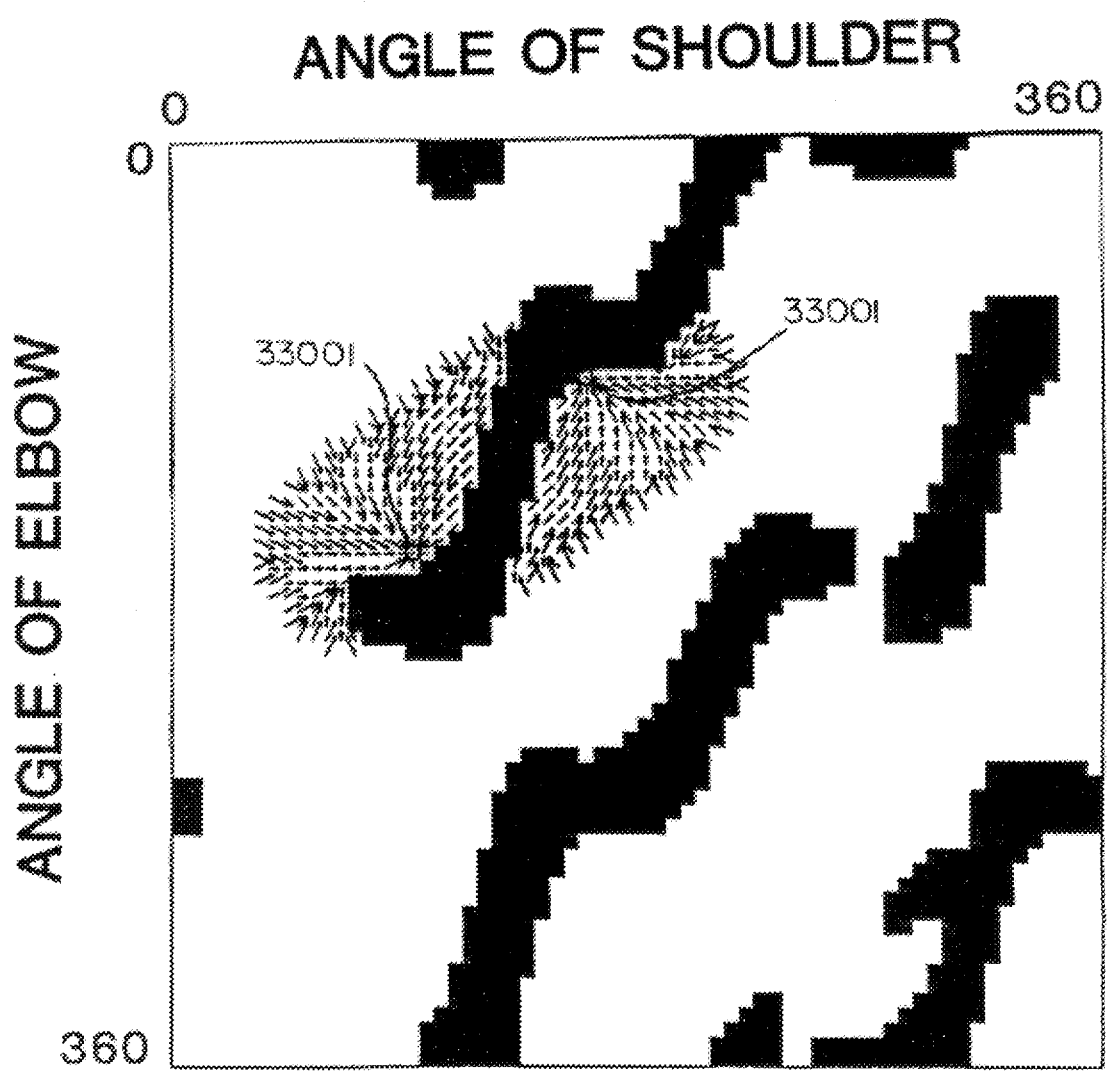
Figure 34:
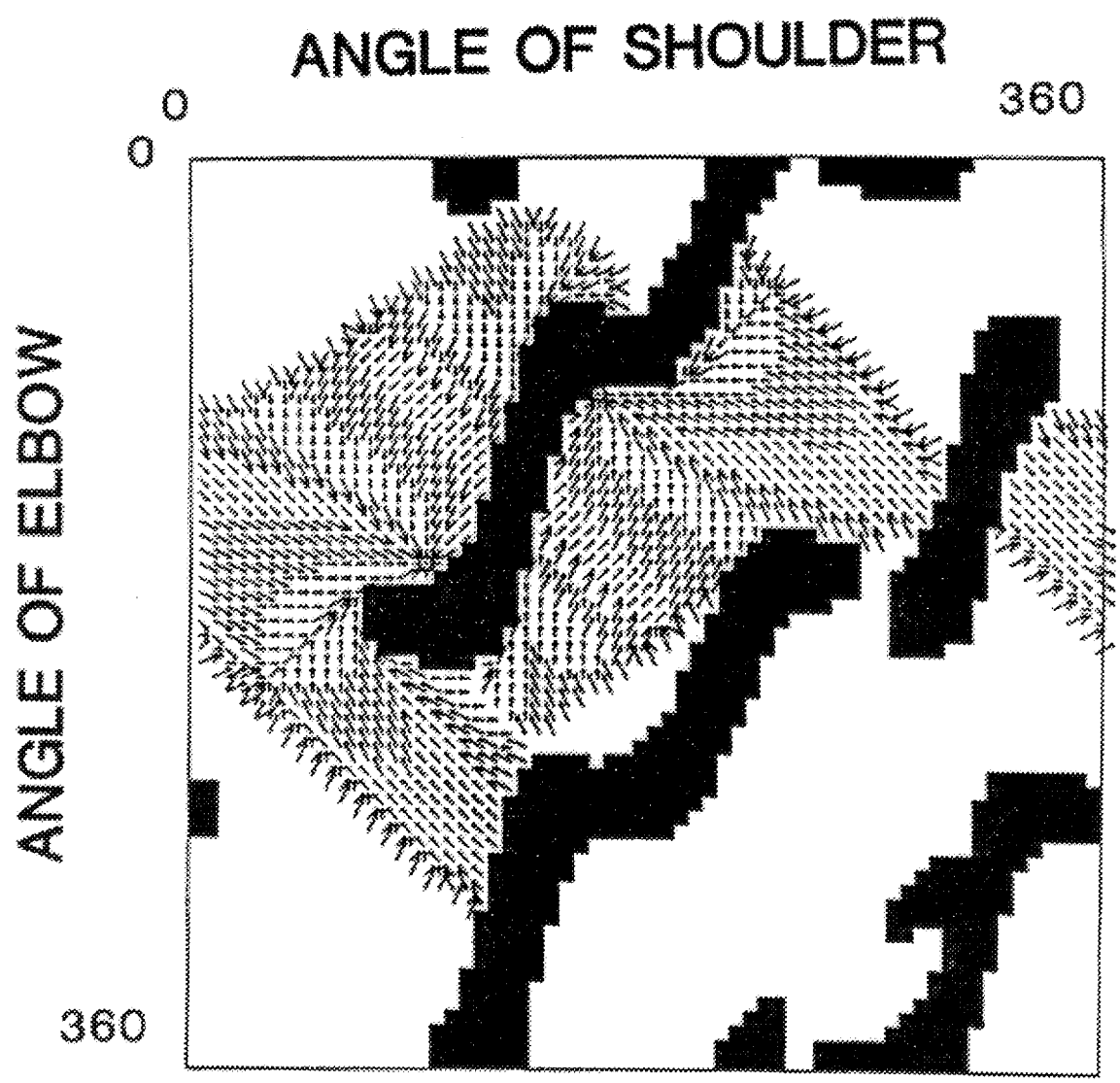
Figure 35:
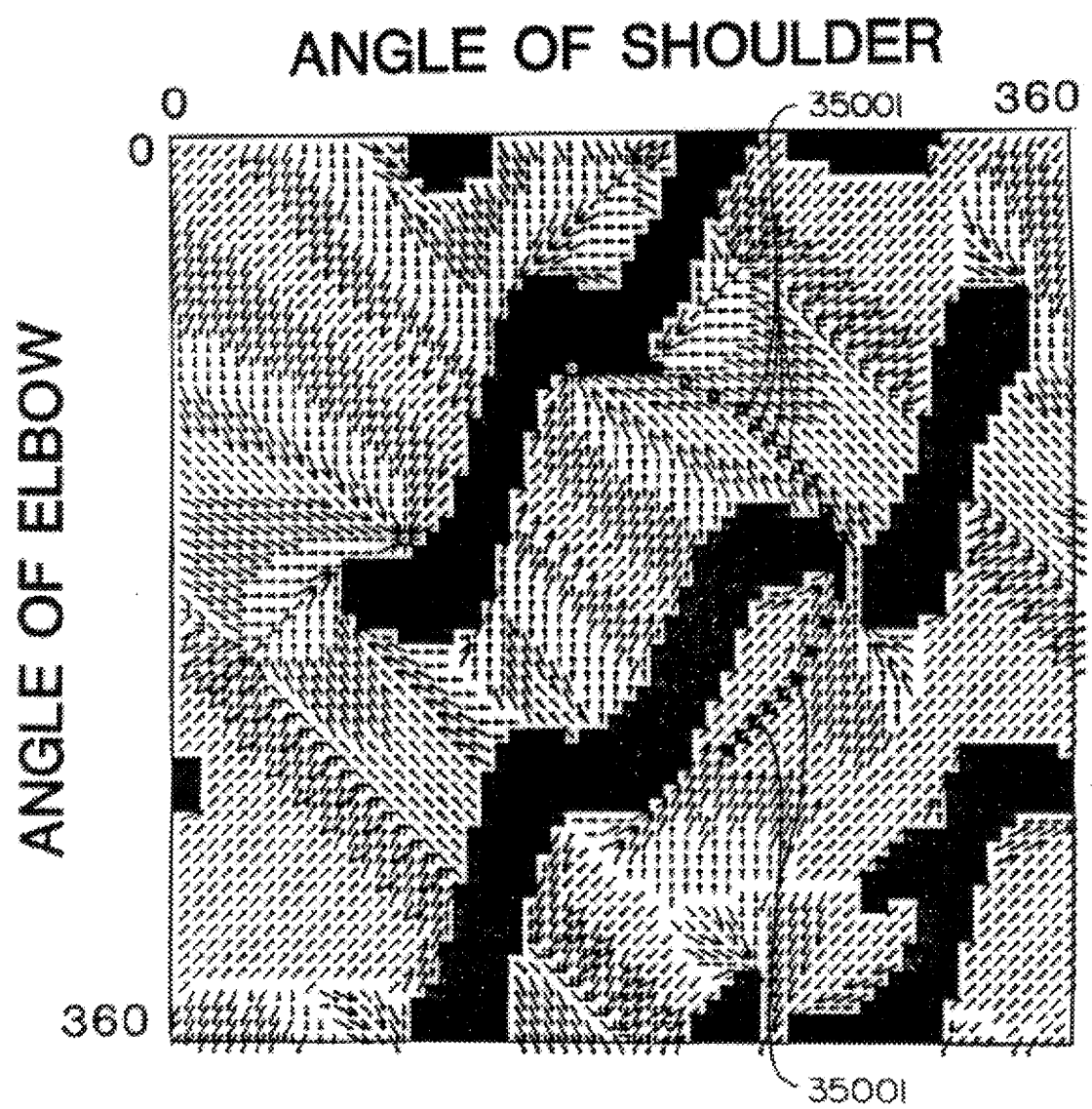
Figure 36:
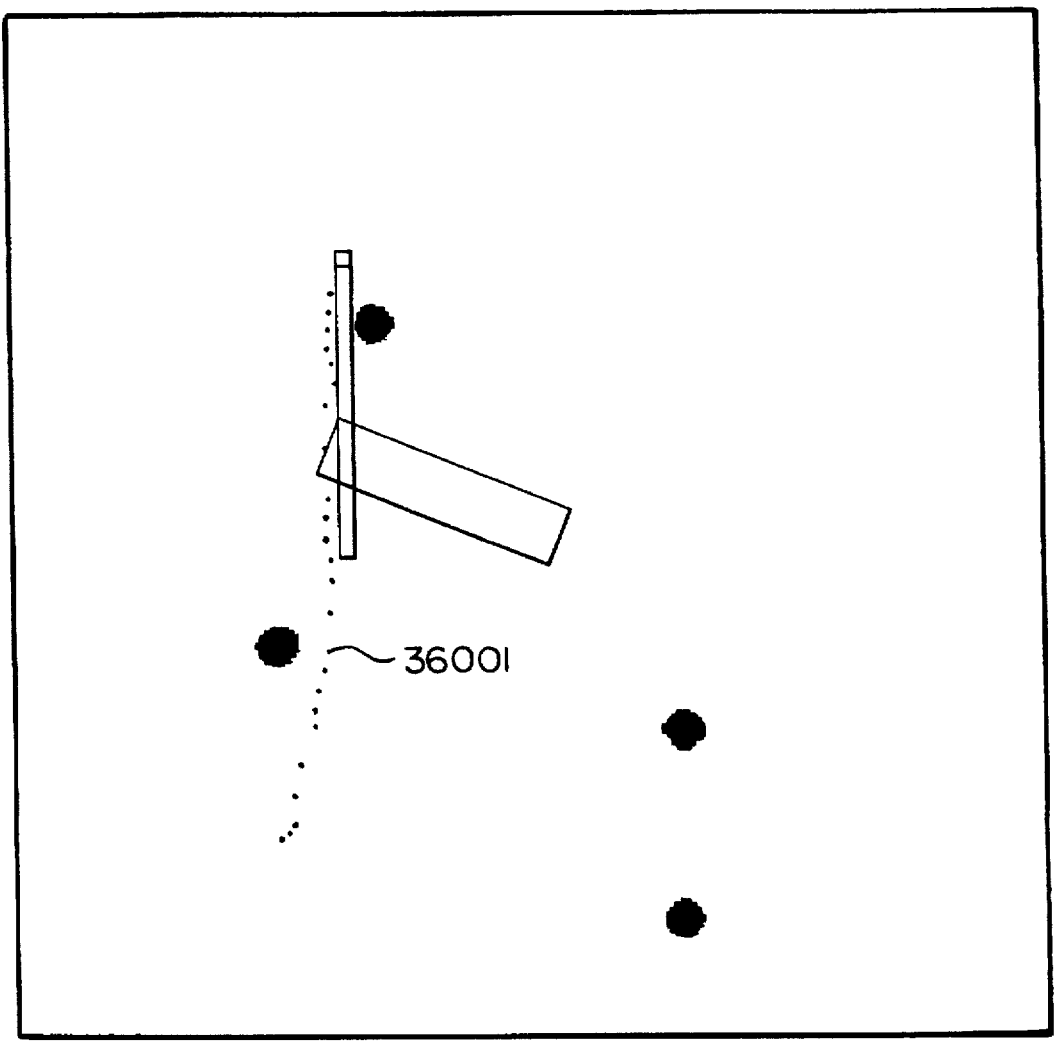
Figure 37:
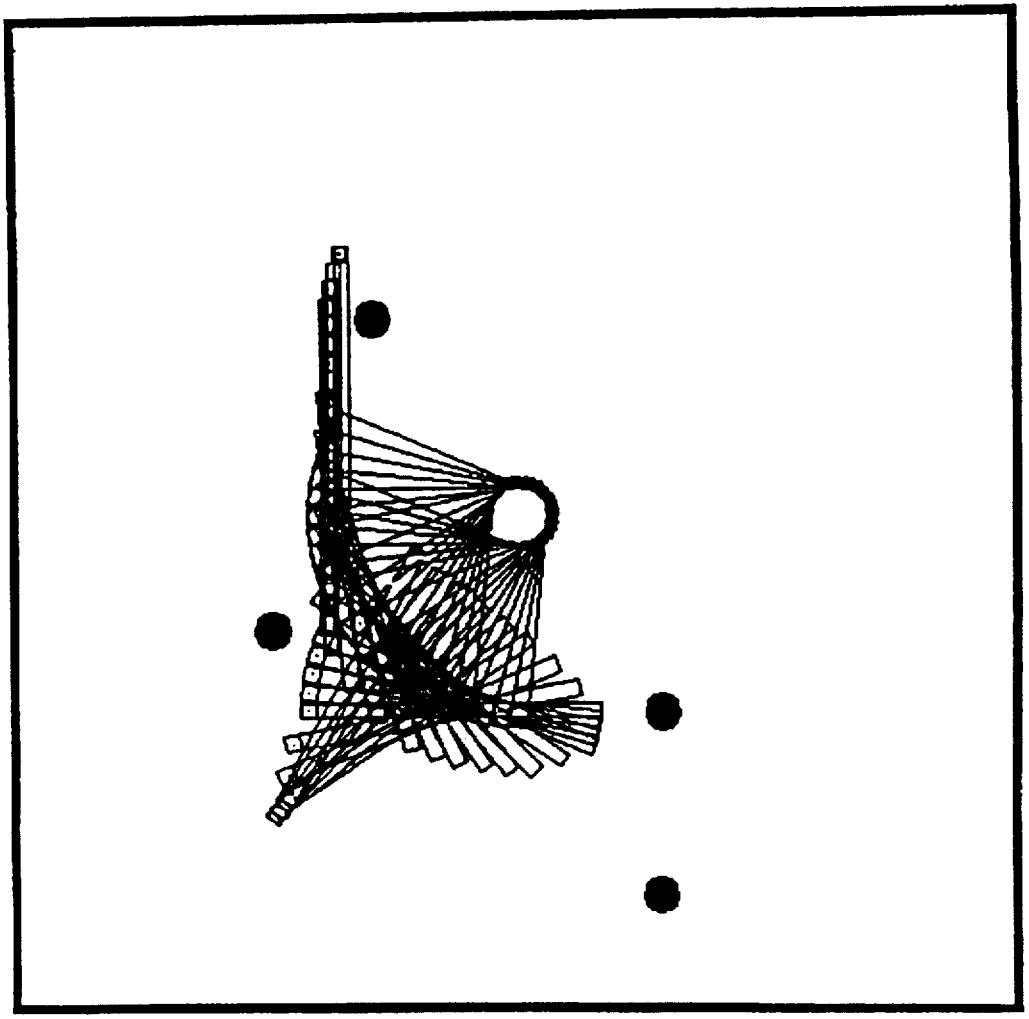

Budding proceeds as before, using the metric of Eq.(2). FIG. 33 and FIG. 34 show two intermediate stages in budding. FIG. 35 shows the final result. The path found in configuration space is indicated by shaded states 35001. Note that the path is a curve in configuration space. FIG. 36 shows the path 36001 of the end effector in task space, and the goal pose reached. Note that 36001 is almost a straight path. The smaller deviations from a straight path are due to the resolution in configuration space and obstacle avoidance. With angle increments of 5.6 degrees one cannot produce points along perfect straight lines. The larger deviations from a straight path are due to the fact that the robot should not only produce the shortest path for the end effector, but also avoid the obstacles. This effect is seen in FIG. 37, which shows all intermediate states of the robot as it moves from start to goal. This simultaneous optimization of collison-free paths with a minimization criterion is an important feature of the method.

Figure 32:
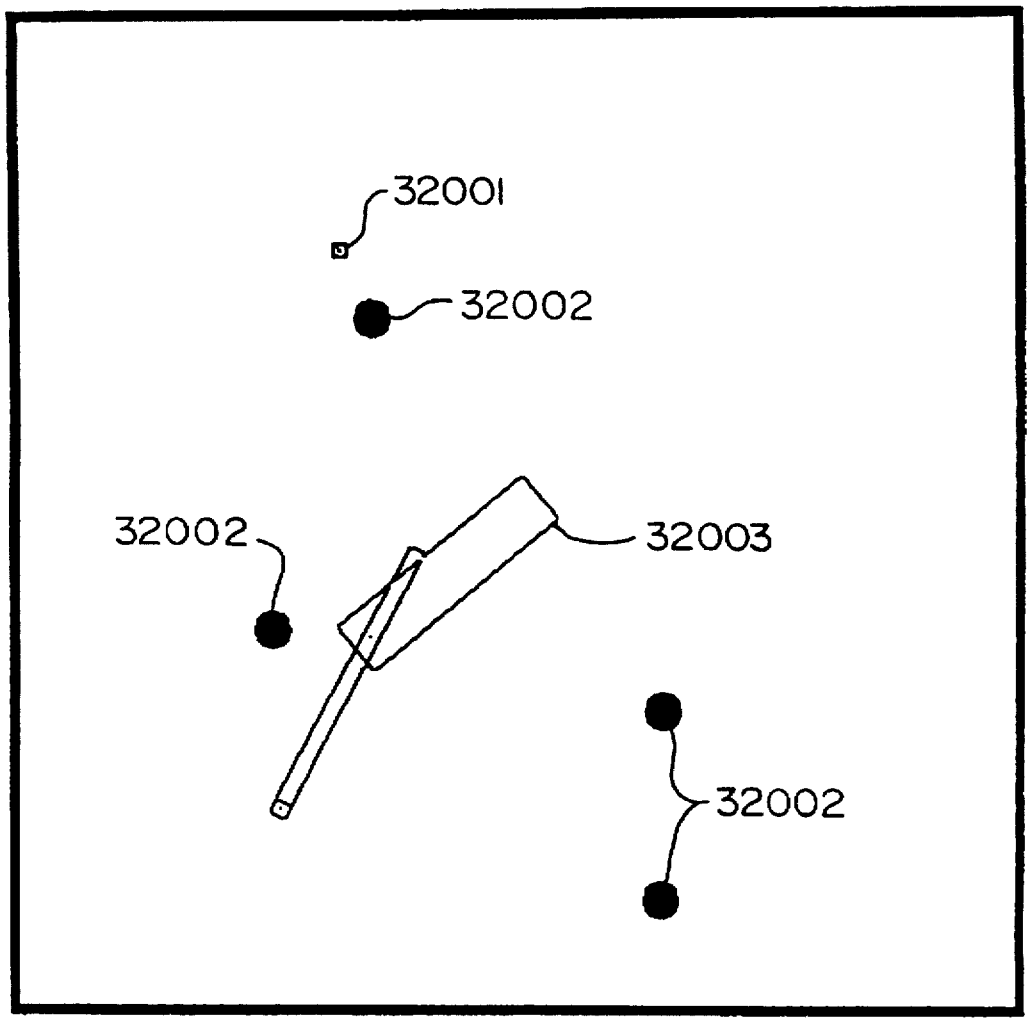
Figure 38:
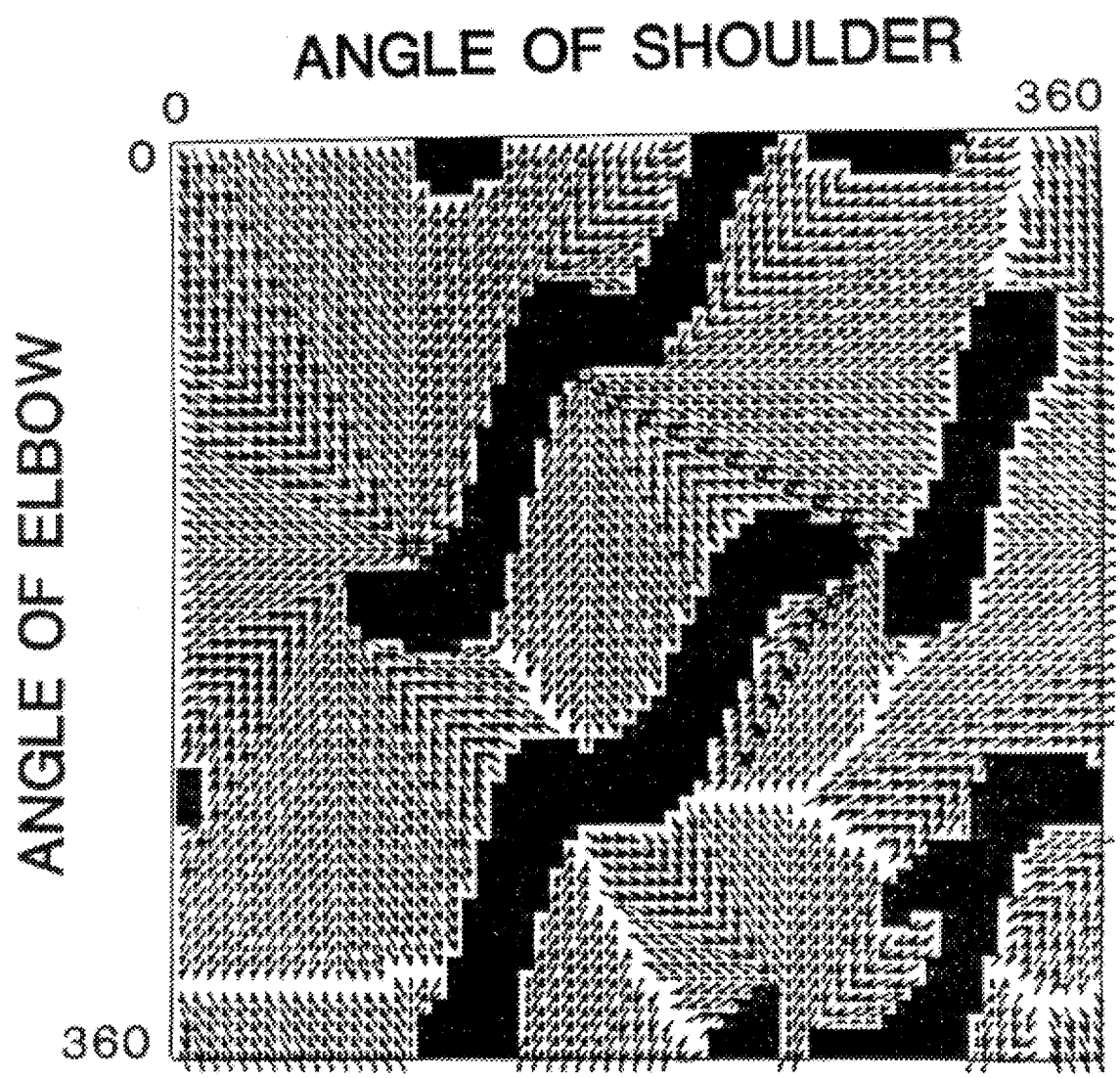
Figure 39:
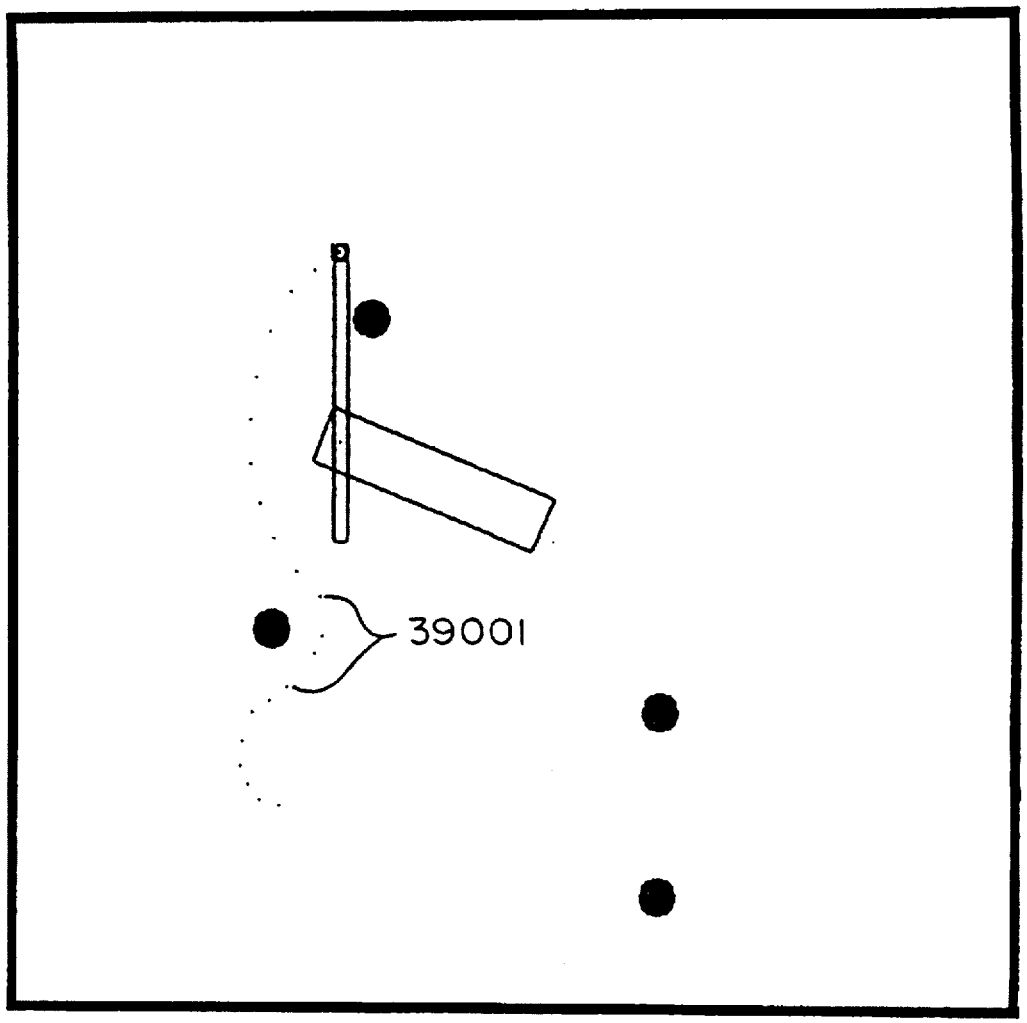

FIG. 38 shows the configuration space corresponding to the same task space as FIG. 32, but using the metric of Eq. (1). FIG. 39 shows the path 39001 found using the configuration space of FIG. 38.

Another important criterion for optimization is "minimum time". A path minimizing time can also be planned for a robot in its configuration space, if the speed with which the robot moves in a particular configuration is known. The time the robot takes to make a transition from state $(i,j)$ in the direction $\overline{(di,dj)}$ can be used as the cost for that transition. The minimal cost paths found by the method are then minimum time paths.

For a special case, one can compute minimum time paths in configuration space. Suppose that the robot has such powerful motors that they can drive the joint at maximum joint velocity all the time. This velocity may be different for each joint. Let the maximum velocity for the upper arm be $V_1$, and for the lower arm $V_2$. Then the time it takes to make a transition from $(i,j)$ by direction arrow $(di,dj)$ is:

$$c(i,j,di,dj) = \max \left\{ \frac{|di|}{V_1}, \frac{|dj|}{V_2} \right\} \qquad \text{Eq. (3)}$$

If this is used as the metric function, then the method will produce minimum time paths.

It will be clear from these examples that diverse metrics in configuration space can be employed to handle a diversity of optimization criteria.

Task dependent constraints can also be accommodated. For example, in carrying a cup containing a liquid, it is important that the cup not be tilted too much. In the configuration space, the states corresponding to a configuration of too much tilt can be made into obstacle regions. They do not correspond to physical obstacles in task space, but to constraints dependent on the task. The transition costs are progressively increased according to their proximity to obstacles regions imposed by the constraints. Such transition costs lead to a tendency to keep the cup upright. This metric will allow the robot to deviate slightly from an upright position, if this is needed for obstacle avoidance, with a tendency to return to the upright position.

E. More complicated robots

Figure 40:
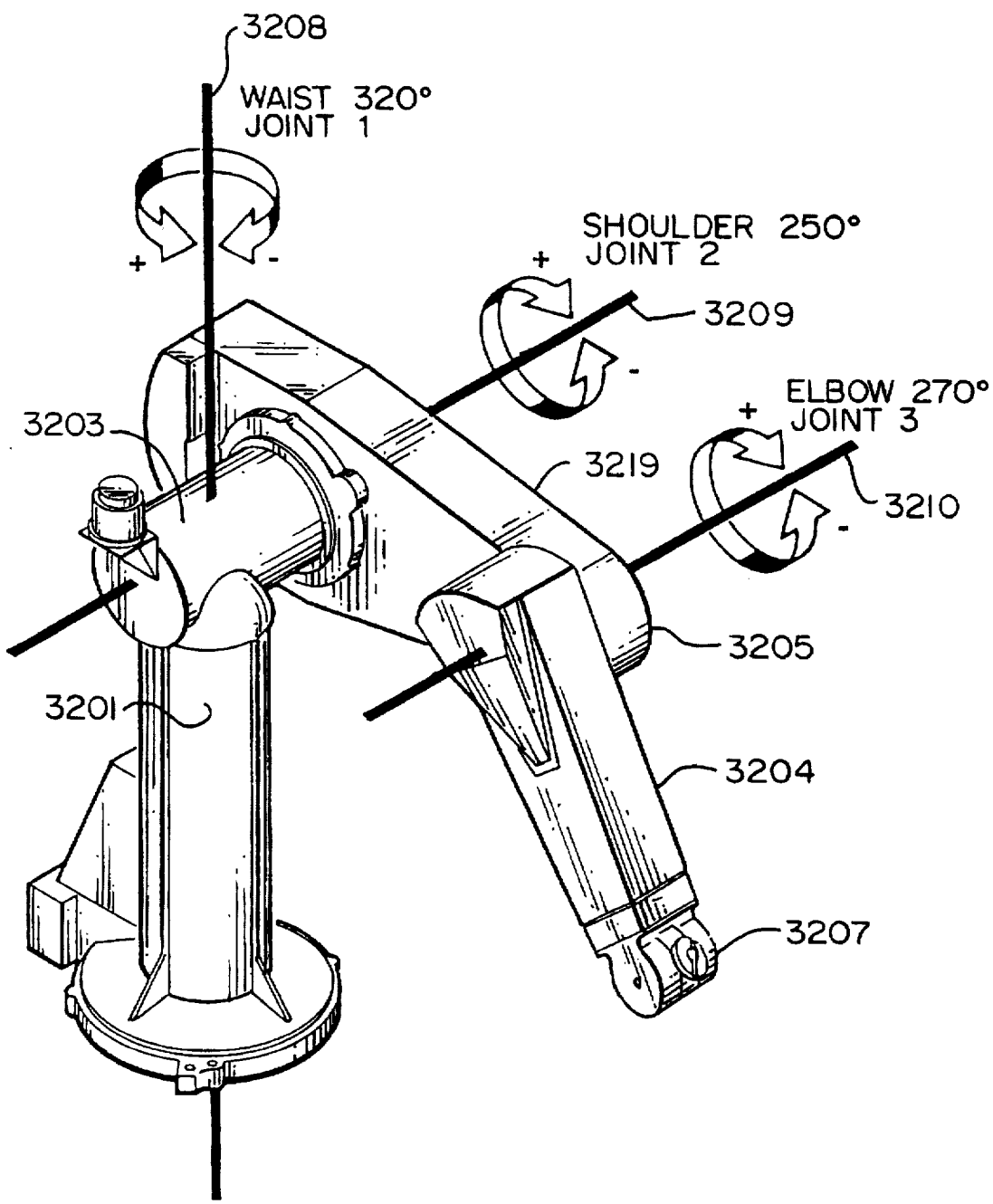
FIG. 40 shows a three-link robot.

FIG. 40 illustrates a three-link robot with three rotational degrees of freedom. The robot has a waist 3201, a shoulder 3203, an upper arm 3219, a forearm 3204, an elbow 3205, and an end effector 3207. FIG. 40 also illustrates the waist angle 3208, the shoulder angle 3209, and the elbow angle 3210.

Figure 41:
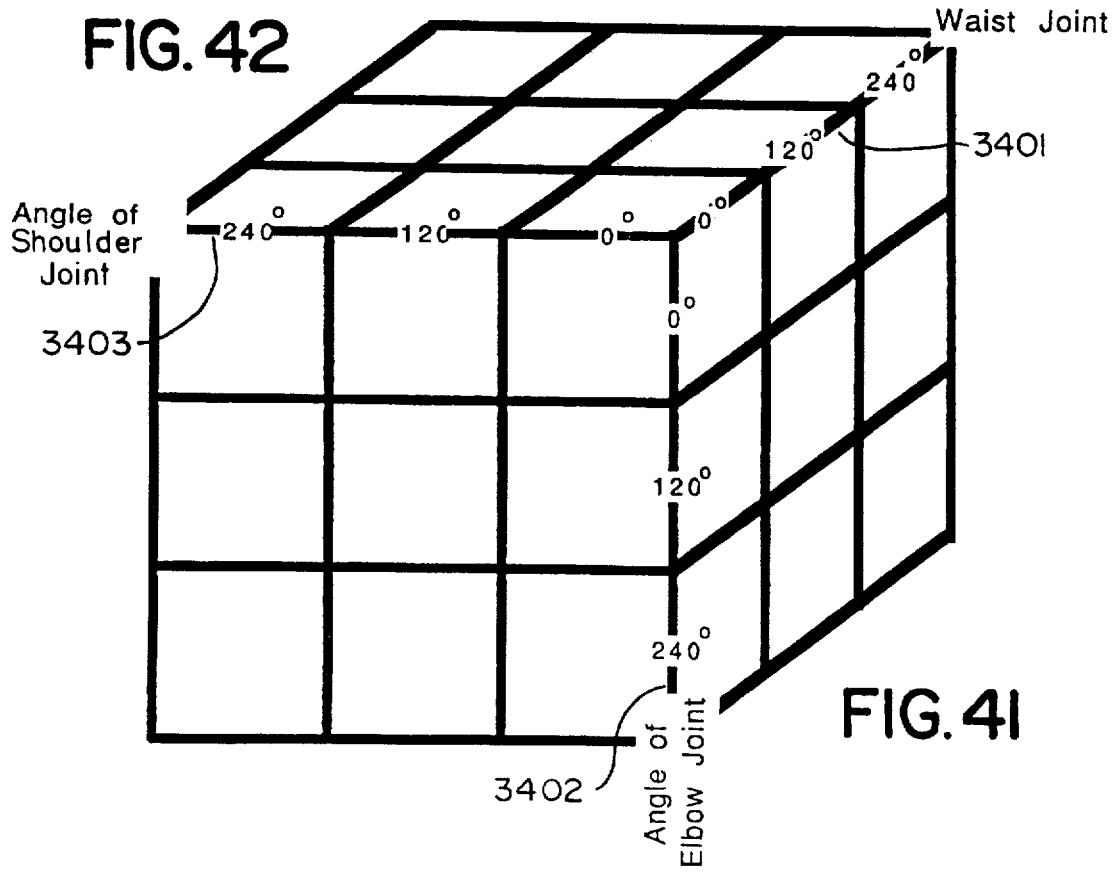
FIG. 41 shows a coarsely discretized three dimensional configuration space.

FIG. 41 illustrates a coarse three-dimensional configuration space corresponding to three rotational degrees of freedom. This configuration space corresponds to the robot of FIG. 40; however it could equally well be used for any robot with three rotational degrees of freedom. The configuration space has three axes: angle of waist 3401, angle of elbow 3402, and angle of shoulder 3403. The axes are divided into units of 120°. Thus the coarse configuration space has 27 states (0°,0°,0°), (0°,0°,120°), (0°,0°,240°), (120°,0°,0°), (120°,0°,120°), (120°,0°,240°), (240°,0°,0°), (240°,0°,120°), (240°,0°,240°), (0°,120°,0°), (0°,120°,120°), (0°,120°,240°), (120°,120°,0°), (120°,120°,120°), (120°,120°,240°), (240°,120°,0°), (240°,120°,120°), (240°,120°,240°), (0°,240°,0°), (0°,240°,120°), (0°,240°,240°), (120°,240°,0°), (120°,240°,120°), (120°,240°,240°), (240°,240°,0°), (240°,240°,120°), (240°,240°,240°). As discussed above, rotational degrees of freedom are periodic. Therefore 360° on any axis is the same as 0° on that axis.

Figure 42:
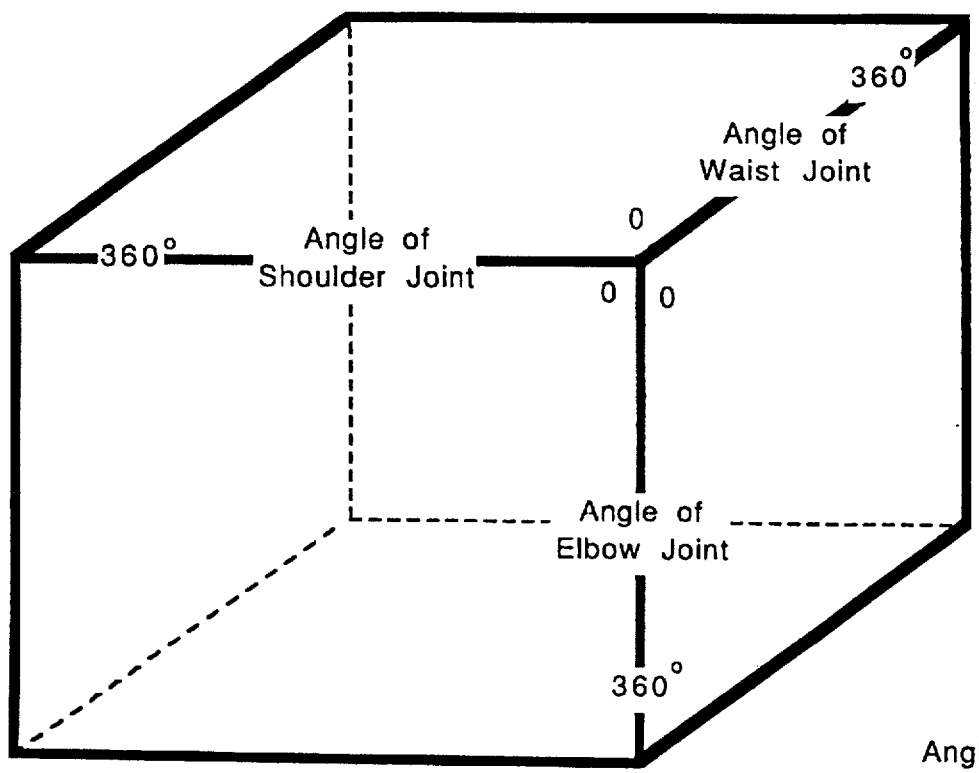
FIG. 42 shows a three dimensional configuration space.

FIG. 42 illustrates a fine configuration space. Here the demarcations between states are too small to fit in the scale of the figure.

The structure of the states in the three dimensional configuration spaces is the same as for the two dimensional configuration space. In other words, each state has a cost_to_goal field and a direction_arrows field; the principal difference being that the set of permissible directions of travel, direction arrows, is different in three dimensions from two dimensions. One set of possible direction arrows is {($\overline{0,0,1}$), ($\overline{0,0,-1}$),($\overline{0,1,0}$), ($\overline{0,-1,0}$), ($\overline{1,0,0}$), ($-1,0,0$)} {(right), (left), (up), (down), (forward), (backward)} which would allow for no diagonal motion. These direction arrows may be characterized as being parallel to the axes of the configuration space. Another set of direction arrows would be {($\overline{0,0,1}$), ($\overline{0,0,-1}$),($\overline{0,1,0}$), ($\overline{0,-1,0}$), ($\overline{1,-0,0}$), ($\overline{-1,0,0}$), ($\overline{0,1,1}$), ($\overline{0,-1,1}$), ($\overline{1,0,1}$), ($\overline{-1,0,1}$), ($\overline{0,1,-1}$), ($\overline{0,-1,-1}$), ($\overline{1,0,-1}$), ($\overline{-1,0,-1}$), ($\overline{1,1,0}$), ($\overline{-1,1,0}$), ($\overline{1,-1,0}$), ($\overline{-1,-1,0}$), ($\overline{1,1,1}$), ($\overline{1,1,-1}$), ($\overline{1,-1,1}$), ($\overline{-1,1,1}$), ($\overline{1,-1,-1}$), ($\overline{-1,-1,1}$), ($\overline{-1,1,-1}$), ($-1,-1,-1$)}. This would allow for motion to all states within a cube of 3 states on a side surrounding the given state. The possible set of direction arrows which would include the equivalent of the knight's move is too long to list conveniently, but anyone with a passing familiarity with permutations can easily generate this set. This last set may be characterized as lying in a cube of five states on a side surrounding the given state, with redundant states removed. It is noted for instance that ($\overline{2,2,2}$) is redundant with ($\overline{1,1,1}$). Therefore ($\overline{2,2,2}$) need not be considered. In general this sort of set of neighbors has been described in mathematics as the set of "visible" points in an n-cube with p states on a side.

Given the configuration space of FIG. 42, paths can be planned for three degrees of freedom using the method illustrated in the flowcharts of FIG. 1a and FIG. 1b and explained above. It is noted that box 17 of FIG. 1b will be affected by the number of degrees of freedom, because more neighbor states are generally used and will therefore have to be checked for each top state when the number of degrees of freedom increases.

To pass into more degrees of freedom is a simple extension of the principles discussed above.

F. Other Kinds of Applications

The previous examples have related to robots. However, robots are not the only objects which can be directed using the method of FIG. 1b.

1. Paths for Emergency Vehicles and Electronic Maps

For instance, the configuration space of FIG. 2 might equally well apply to a task space which is a city street map. The method of FIG. 1b could then be employed to plot the path of an emergency vehicle through the streets. A metric for this application should reflect the time necessary to travel from one point to another. One-way streets would have a certain time-cost for one direction and infinite cost in the illegal direction. Highways would generally have a lower time-cost than small side streets. Since highway blockages due to accidents, bad weather, or automobile failure are commonly reported by radio (broadcast and police) at rush hour, this information might be used as an input to increase expected time-costs on those constricted routes. This would result in the generation of alternate routes by the path planner.

The method of FIGS. 1a and 1b could also be employed with the city street task space to generate electronic maps for automobiles.

2. Emergency Exits From Buildings

Dynamic emergency exit routes can be obtained for buildings that report the location of fire or other emergency. The currently used fixed routes for emergency exits can lead directly to a fire. A dynamic alarm system can report the suspected fire locations directly to a path planning device according to the invention. The path planning device can then light up safe directions for escape routes that lead away from the fire. In this case, the safest escape route may be longer, but away from the fire. In this case 'safety' is the criterion.

3. General Applicability to Numerical Methods

From a mathematical point of view, the method of the present invention finds a discrete approximation to the set of all geodesics perpendicular to a set of goal points in a space variant metric. "Following the direction arrows" is analogous to following the intrinsic gradient. Following the direction arrows from a specific start state yields the geodesic connecting the start state to the closest goal state. A device incorporating this method could be applied to the solution of any problem which requires the finding of such a geodesic.

G. Shortcuts

A number of techniques may be devised to improve the efficiency of the method described with respect to FIGS. 1a and 1b.

One efficiency technique will be referred to herein as early path detection. The early path detection feature makes use of the fact that as soon as the cost waves have been propagated just beyond the starting state, the optimal path can be reported, since no further budding changes will affect the region between the start and goal.

Figure 43:
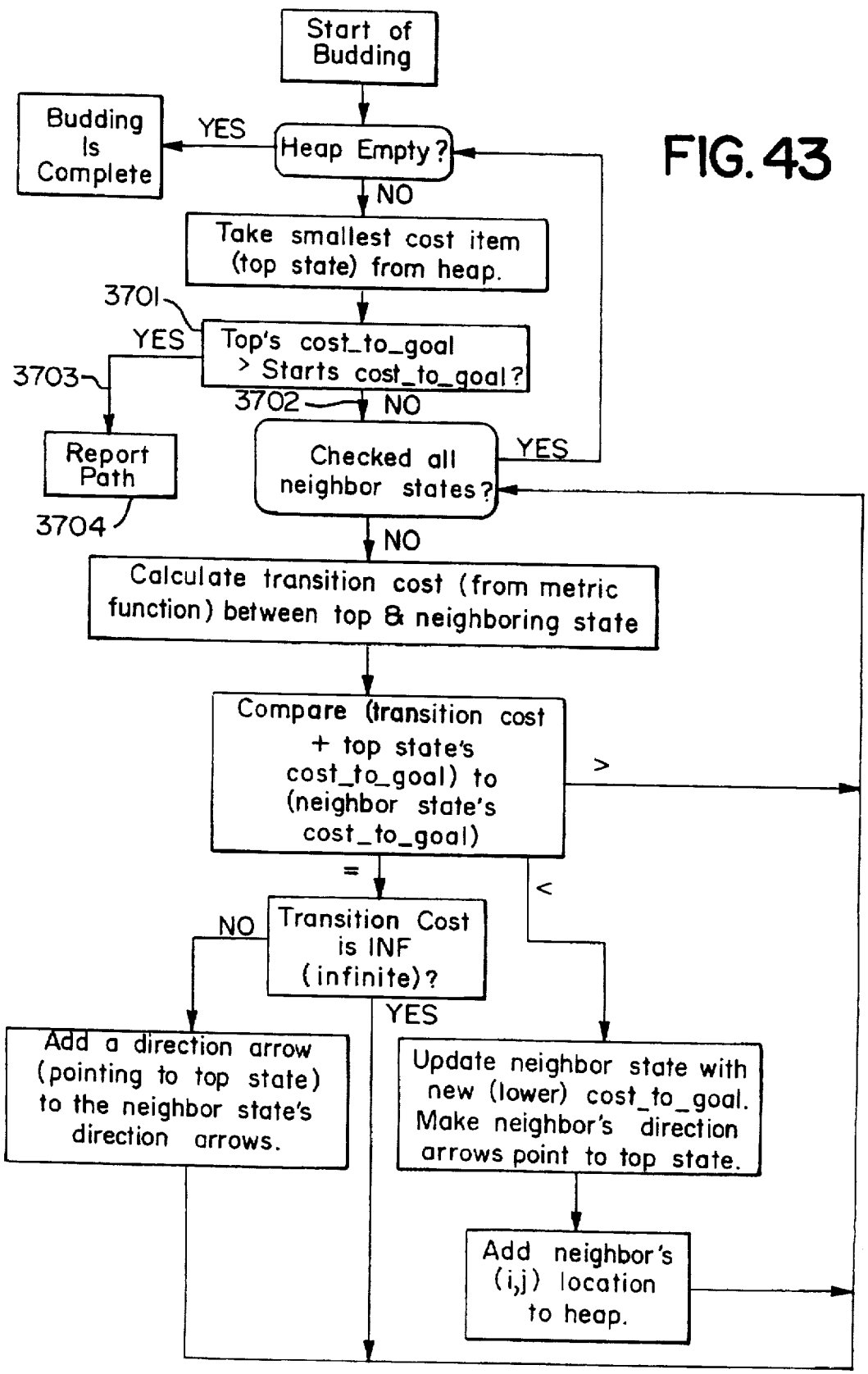
FIG. 43 is a flow chart of an alternate embodiment of the method of path planning.

FIG. 43 shows the additional steps necessary for early path reporting. FIG. 43 is the same as FIG. 1b, except that several steps have been added. In box 3701, the method tests whether the value of the cost_to_goal field of the state at the top of the heap is greater than the cost_to_goal field of the start state. If the result of the test of box 3701 is negative, budding continues as usual, along branch 3702. If the result of the test of box 3701 is positive, the method follows branch 3703 to box 3704 where the path is reported. After the path is reported at box 3704, normal budding continues. It is possible to stop after this early detection if the entire cost field is not needed.

Figure 44:
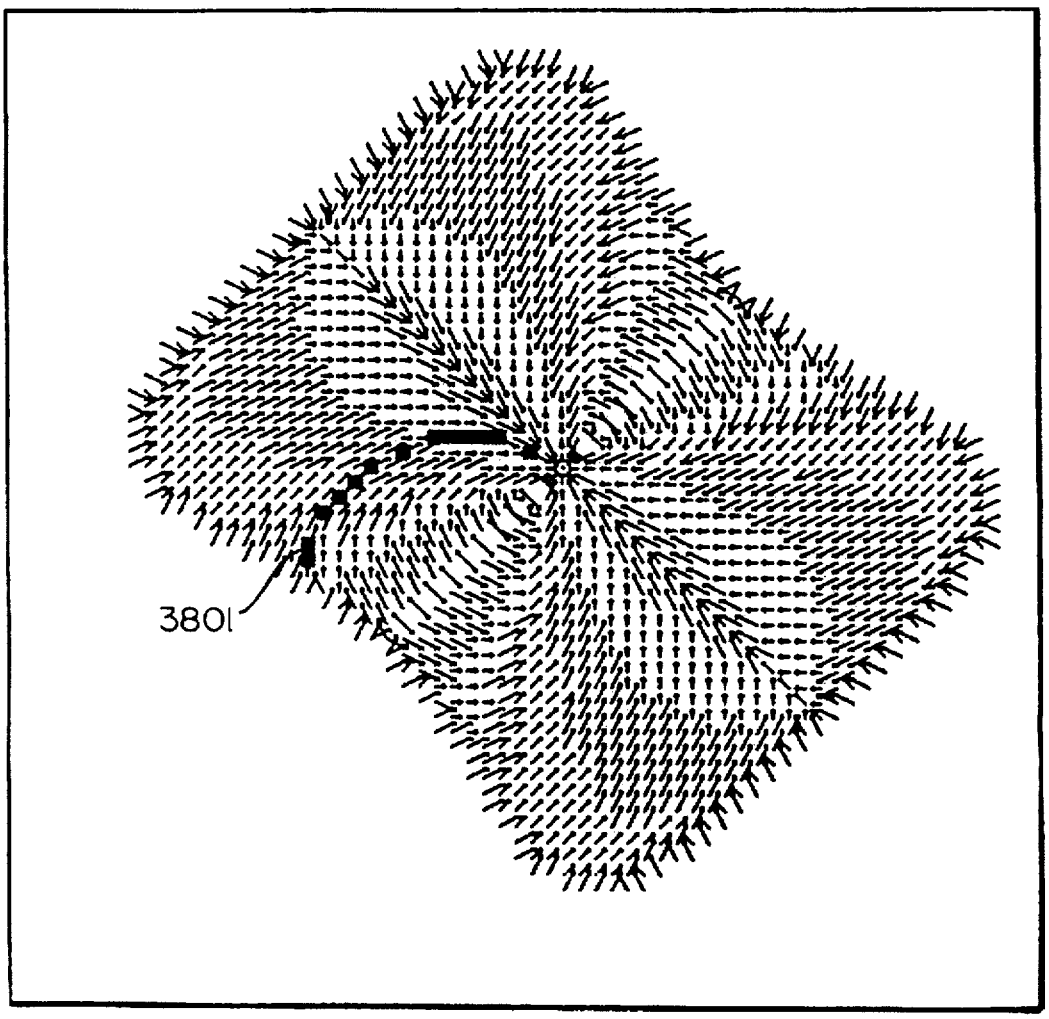
FIG. 44 shows a configuration space budded according to the method of FIG. 43.

FIG. 44 shows an example of configuration space in which the path 3801 has been reported prior to the 'normal' termination of budding.

It is noted that this kind of early path detection is not possible if a queue structure is used during budding, instead of heap because using a queue structure the shortest path cannot be determined until the entire configuration space is budded.

Another efficiency technique is to begin budding from both the goal and the start states. The path then is found when the expanding cost waves meet. Usually, a different metric must be used for budding the start state from that which is used for budding the goal states. This results from the fact that budding out from the start state would be in the actual direction of motion in the task space which is essentially calling the same metric function with the top and neighbor states swapped. By contrast, budding from the goal states is in a direction opposite to motion in the task space.

APPENDIX A defines.h          Tue Aug 11 14:15:08 1987                Page:1

```
include <math.h> define COUPLING 1        /* 1 if coupling to wyatt arm */
define UINT16 unsigned short
#define INT16  short
/***********************************************************/
/*     defines.h                                            */
/*     history:                                             */
/*         created 198609xx Leo Dorst                       */
/*         mod     19861113 Leo + Karen                     */
/***********************************************************/
#define NUMBER       234 /* arbitrary constant for bresenham */
#define LIST         235 /* arbitrary constant for bresenham */
#define COLOR_MAP_SIZE 4 /* current belief is - # bitplanes used */
                         /* number of pixels per centimeter */
#define CENTIMETER   4
#define NUMOBS      10   /* since obstacles are saved in the bitplanes
                            of the array con, the number of obstacles
                            should not exceed sizeof(type of con) */ define XSIZE    64
define YSIZE    64
#define HIRES    1        /* 1 if you want hires screen options, 0 otherwise */
define CMARGIN  20 define CSTEP          0                              /* this includes 1 pixel cell boundary */
define CELL_SIZE      (512/XSIZE)
#define CXSIZE         (2*CMARGIN+XSIZE*(CSTEP+CELL_SIZE)+CSTEP)
#define CYSIZE         (2*CMARGIN+YSIZE*(CSTEP+CELL_SIZE)+CSTEP)
#define PNT_OFFSET     ( CMARGIN + CSTEP + 1 )
#define MAXDIM         16       /* maximum dimension for basic pattern */
#define MAXSIZE        (MAXDIM*MAXDIM/16)
#define WHITEP         0
#define GRAY25         1
#define GRAY50         2
#define GRAY75         3
#define BLACKP         4
#define PATCH_COUNT    5
#define POINTERPATCH   BLACKP   /* patch plotted when pointing to con space */
#define PATHPATCH      BLACKP   /* patch plotted on path in config space */
#define MOVEPATCH      BLACKP   /* patch plotted when moving in con space */
/* #define ICON_SIZE   (CELL_SIZE*CELL_SIZE/sizeof(UINT16)) */
#define ICON_SIZE      16
#define SMICON_SIZE    1
#define OBST_ICON      0
#define GOAL_ICON      1
#define START_ICON     2
#define SMOBST_ICON    3
#define SMGOAL_ICON    4
#define SMSTART_ICON   5
#define ICON_COUNT     6
define DIRECTION_COUNT 16 define INFINITY  (MAXFLOAT/2.)    /* code for infinite values */ define UNCOSTED  (INFINITY * .9999999)
```

```
defines.h         Tue Aug 11 14:15:08 1987                    Page:2 define NOCONSTRAINT   0              /* code for undetermined values */
define GOAL           1              /* code for absence of constraints */
#define NOGOAL         0              /* code for goal points */
#define UNITSTEPX      5              /* unit step size */
#define UNITSTEPY      5              /* unit step size */
#define DIAGONAL       7              /* diagonal step size */
#define XTS            UNITSTEPX
#define YTS            UNITSTEPY
#define DIA            DIAGONAL
#define OBSTACLE      -1              /* obstacle pointer */
#define IP             0              /* initial pointer */
#define LENGTH1        (25*CENTIMETER)
#define LENGTH2F       (26*CENTIMETER)
#define LENGTH2R       (13*CENTIMETER)
#define PI             3.14159
#define PI2            (PI*2.0)
#define ANGLE1RES      ((2.0*PI)/(float)(XSIZE))
#define ANGLE2RES      ((2.0*PI)/(float)(YSIZE))
#define ANGLE1PIX      ((float)(XSIZE*CELL_SIZE)/32768.0)
#define ANGLE2PIX      ((float)(YSIZE*CELL_SIZE)/32768.0)
#define NOBLOCK        0              /* no blocking present */
#define BLOCK          1              /* block present */
#define CARTMARGIN     0
#define CARTWIDTH      (128*CENTIMETER)
#define CARTHEIGHT     (128*CENTIMETER)
#define XBASE          ((CARTWIDTH-2*CARTMARGIN)/2 + CARTMARGIN)
#define YBASE          ((CARTWIDTH-2*CARTMARGIN)/2 + CARTMARGIN)
#define FRAME0_XOFFSET 20
#define FRAME0_YOFFSET 110
#define BLOCK_BUTTON   0
#define START_BUTTON   0
#define GOAL_BUTTON    3
#define DGOAL_BUTTON   1
#define POINTER_BUTTON 2
#define MOVEMODE       0
#define PATHMODE       1
#define NOARM          2
#define STICK_ARM      0
#define BODY_ARM       1
#define FLOW           0
#define NOFLOW         1
#define DOT            0              /* cell data types */
#define SQUEL          1
#define XWALL          2
#define YWALL          4
#define PIX_COLOR(color) ((color)<<5)
#define BLACK          1
#define WHITE          0
#define MAXCOM         10             /* maximum number of commands in string */
#define MAXPATH        (XSIZE+YSIZE)  /* maximum path length */
#ifdef MAXINGSINCOS
#include "/usr/local/interc/include/rt.h"
#endif
#include <stdio.h>
include <math.h>
``` defines.h          Tue Aug 11 14:15:08 1987                    Page:3

```c
#include <errno.h>
#include <pixrect/pixrect_hs.h>
#include <sunwindow/window_hs.h>
#include <suntool/tool_struct.h>
#include <suntool/window.h>
#include <suntool/frame.h>
#include <suntool/canvas.h>
#include <suntool/panel.h>
typedef struct position  { INT16 x, y; }                         SCREEN_POS, GRID_POS;
typedef struct cell      { INT16 x, y, xsize, ysize, type, color;}             CELL;
typedef struct element   { INT16 i, j, type, value; }                       ELEMENT;
typedef struct cartcell  (        INT16 x, y, xsize, ysize, color;)        CARTCELL;
typedef struct cartelement (      INT16 i, j, value; )                  CARTELEMENT;
typedef struct robot_arm (INT16 end1_x,end1_y,end2f_y,end2f_x,end2r_x,end2r_y;
                          double angle1,angle2;} ARM;

typedef char      LOGICAL;
typedef char      COLOR;
typedef UINT16    PIXEL;
typedef struct canvas_handlers (
         void (*reader)();
         void (*feedback)();
) CANVAS_HANDLERS;

typedef struct positionlist (
         GRID_POS **list;
         INT16 current,
               number;
) POSITIONLIST;

#ifdef ONBOARD
#define POOLSIZE 300000
#else
#define POOLSIZE 200
endif define BADALLOC     -1                    /* returned value if alloc is NG */
define DONTSEND      0
#define SEND          1
define PATHLENGTH  300 define INPUT         0
define PROPAGATE     1
#define PREPARE       2
#define GRADIENT      3

/* arm shape parameters */ define W1    (  3.75*CENTIMETER)          /* width arm 1 */
define L11   ( -3.75*CENTIMETER)          /* elbow arm 1 */
#define L12   ( 27.25*CENTIMETER)          /* front arm 1 */
#define L1J   ( 25.0 *CENTIMETER)          /* arm 1: distance to joint */
#define W2    (  1.0 *CENTIMETER)          /* width arm 2 */
#define L21   (-13.0 *CENTIMETER)          /* elbow arm 2 */
define L22   ( 26.0 *CENTIMETER)          /* front arm 2 */ define MAX_GOAL_NUMBER 30
```

A-3

```
defines.h          Tue Aug 11 14:15:08 1987                Page: 4 define YES 1
define NO  0 define KILLGOALS 0
define KEEPGOALS 1 define MOTION   0
define DISTANCE 1
#define EFFORT   2

/*      @(#)cms_rgb.h 1.2 86/10/08 SMI  */

/*
 * Copyright (c) 1983 by Sun Microsystems, Inc.
 */

/*
 * Definition of the colormap segment CMS_RGB,
 * the collection of rgb (red-green-blue) binary combinations.
 */ define CMS_RGB        "rgb"
define CMS_RGBSIZE    8
define NUMCOLORBITS   3 define WHITEC    0
define REDC      1
#define YELLOWC   2
#define GREENC    3
#define CYANC     4
#define BLUEC     5
#define MAGENTAC  6
define BLACKC    7 define cms_rgbsetup(r,g,b) \
    (r)[WHITEC] = 255;   (g)[WHITEC] = 255;   (b)[WHITEC] = 255; \
    (r)[REDC] = 255;     (g)[REDC] = 0;       (b)[REDC] = 0;     \
    (r)[YELLOWC] = 128;  (g)[YELLOWC] = 128;  (b)[YELLOWC] = 0;  \
    (r)[GREENC] = 0;     (g)[GREENC] = 255;   (b)[GREENC] = 0;   \
    (r)[CYANC] = 0;      (g)[CYANC] = 128;    (b)[CYANC] = 128;  \
    (r)[BLUEC] = 0;      (g)[BLUEC] = 0;      (b)[BLUEC] = 255;  \
    (r)[MAGENTAC] = 128; (g)[MAGENTAC] = 0;   (b)[MAGENTAC] = 128; \
    (r)[BLACKC] = 0;     (g)[BLACKC] = 0;     (b)[BLACKC] = 0;

typedef unsigned short VECTTYPE;   /* bit string of direction flags */ typedef struct csnode {
    float cost_to_goal;
    VECTTYPE vector;               /* 16 possible vectors */
} CSNODE;

typedef struct heapnode {
    short x;
    short y;
} HEAPNODE;
```

```
defines.h    Tue Aug 11 14:15:08 1987             Page:5 typedef unsigned int BOTHINDICIES;      /* length of x&y together */ typedef struct dir_node {
    short dx;       /* could be a char !! */
    short dy;
) DIR_NODE;

#define ACCURACY (1e-5)
```

```
externs.h        Tue Aug 11 14:15:08 1987                                    Page:1

/************************************************************************/
/*      externs.h                                                        */
/*      history:                                                         */
/*              created 198609xx Leo Dorst                               */
/*              mod     19861113 Karen Trovato                           */
/************************************************************************/ extern CELL         null_cell;
extern ELEMENT      null_element;
extern GRID_POS     null_position; /* also for SCREEN_POS */
extern CARTCELL     null_cartcell;
extern CARTELEMENT  null_cartelement;
extern ARM          null_arm;

/************************************************************************/
/*      canvas.c        */
/************************************************************************/ extern void     (*reader)();

extern void     init_canvases();
extern void     nulproc();
extern          canvas1_event_proc();
extern          canvas2_event_proc();
extern          message_event_proc();

extern void     basereader();
extern void     tracker();
extern void     reset_handlers();
extern void     point_feedback1();
extern void     point_read1();
extern void     change2_proc();
extern void     change1_proc();
extern void     flow_proc();
extern void     mode_proc();
extern void     redraw_proc();
extern void     speed_proc();
extern void     camera_proc();
extern void     robot_proc();
extern void     demo_proc();
extern void     gain_proc();
extern void     metric_proc();

extern CANVAS_HANDLERS base;
extern CANVAS_HANDLERS canvas1_hand;
extern CANVAS_HANDLERS canvas2_hand;

extern CANVAS_HANDLERS *current;
extern CANVAS_HANDLERS *last_touched;

extern erase_arms();
extern LOGICAL special_point();
/************************************************************************/
/*      print.c */
/************************************************************************/
extern print_xts();
``` externs.h    Tue Aug 11 14:15:08 1987    Page: 2

```
extern print_yts();
extern print_pnt();
extern print_car();
extern print_con();
extern print_ima();
/***********************************************************/
/*    show.c    */
/***********************************************************/
extern show_xts();
extern show_yts();
extern show_goa();
extern show_con();
extern show_car();
extern show_pnt();
extern show_ima();
extern show_start_point();
extern show_goal_point();
extern plot_patch();
extern plot_patch();
extern plot_icon();
extern paint_element2();
extern plot_canvas2();
extern plot_canvas1();
extern clear_canvas1();
extern clear_canvas2();
extern show_arm();
extern plot_path_element();
extern grid_paint2();
extern grid_paint1();
extern ELEMENT *element_of_point1();
extern CARTELEMENT *element_of_point2();
extern CARTCELL * element_to_cell2();
extern CELL * element_to_cell();
extern element_show();
/***********************************************************/
/*    cdt.c    */
/***********************************************************/
extern init_cdt();
extern new_cdt();
extern int Bx();
extern int By();
/***********************************************************/
/*    path.c    */
/***********************************************************/
find_and_draw_shortest_path();
/***********************************************************/
/*    trafo_data.c    */
/***********************************************************/
extern short roundx();
extern short roundy();
extern short periodic_x();
extern short periodic_y();
extern set_arm();
extern print_arm();
extern init_arm();
extern borderline();
``` externs.h    Tue Aug 11 14:15:08 1987    Page: 3

```c
/***************************************************************************/
/*   icons    */
/***************************************************************************/
/* Memory pixrects for cursors          */
/***************************************************************************/
extern short          cursor_array[16];
extern struct pixrect cursor_pr;
extern struct cursor  main_cursor;

/***************************************************************************/
/* Memory pixrects in white, grey and black patterns.     */
/***************************************************************************/
extern unsigned short  white_data[MAXSIZE];
extern unsigned short  gray25_data[MAXSIZE];
extern unsigned short  gray50_data[MAXSIZE];
extern unsigned short  gray75_data[MAXSIZE];
extern unsigned short  black_data[MAXSIZE];
extern struct pixrect  white_patch;
extern struct pixrect  gray25_patch;
extern struct pixrect  gray50_patch;
extern struct pixrect  gray75_patch;
extern struct pixrect  black_patch;
extern struct pixrect  *patch_prs[PATCH_COUNT];
extern struct pixrect  standardobs;
extern unsigned short  obstacle_data[32*32/16];

extern int xts [XSIZE] [YSIZE]; /* horizontal transition strengths */
extern int yts [XSIZE] [YSIZE]; /* vertical transition strengths */
extern int lus [XSIZE][YSIZE];  /* left-up transition strengths (+ right down) */
extern int rus [XSIZE][YSIZE];  /* right-up transition strengths (+ left down) */
extern PIXEL constraint_image [XSIZE] [YSIZE];
                /* interm config    constraint image */
extern PIXEL con [XSIZE] [YSIZE];   /* configuration constraint image */
extern PIXEL goa [XSIZE] [YSIZE];   /* constraint image */
extern PIXEL pnt [XSIZE] [YSIZE];   /* pointer image */
extern int path[2*PATHLENGTH];
extern unsigned int ima [XSIZE] [YSIZE];   /* result image */

/***************************************************************************/
/*   icons    */
/***************************************************************************/
extern struct pixrect goal_icon;
extern struct pixrect obst_icon;
extern struct pixrect start_icon;
extern struct pixrect smgoal_icon;
extern struct pixrect smobst_icon;
extern struct pixrect smstart_icon;
extern unsigned short goal_data[ICON_SIZE];
extern unsigned short obst_data[ICON_SIZE];
extern unsigned short start_data[ICON_SIZE];
extern unsigned short smgoal_data[SMICON_SIZE];
extern unsigned short smobst_data[SMICON_SIZE];
extern unsigned short smstart_data[SMICON_SIZE];
extern struct pixrect *icon_prs[ICON_COUNT];
```

```
externs.h        Tue Aug 11 14:15:08 1987                                                    Page:4

/***************************************************************************/
/*      arrows    */
/*      in order of XP,XN,YP,YN,LU,LD,RU,RD   */
/***************************************************************************/ extern struct pixrect xp_arrow;
extern struct pixrect xn_arrow;
extern struct pixrect yp_arrow;
extern struct pixrect yn_arrow;
extern struct pixrect lu_arrow;
extern struct pixrect ld_arrow;
extern struct pixrect ru_arrow;
extern struct pixrect rd_arrow;
extern unsigned short  xp_data[ICON_SIZE];
extern unsigned short  xn_data[ICON_SIZE];
extern unsigned short  yp_data[ICON_SIZE];
extern unsigned short  yn_data[ICON_SIZE];
extern unsigned short  lu_data[ICON_SIZE];
extern unsigned short  ld_data[ICON_SIZE];
extern unsigned short  ru_data[ICON_SIZE];
extern unsigned short  rd_data[ICON_SIZE];
extern struct pixrect *arrow_prs[DIRECTION_COUNT];

/***************************************************************************/
/* basic point definitions */
/***************************************************************************/ extern   short     istart,jstart,                  /* start point */
extern   short     igoal,jgoal,
extern   short     ilast,jlast;
extern   LOGICAL   new_feedback;
/***************************************************************************/
/* arm definition */
extern   ARM       *arm;

/***************************************************************************/
/* configuration space definitions */
/***************************************************************************/
extern int xts [XSIZE] [YSIZE];  /* horizontal transition strengths */
extern int yts [XSIZE] [YSIZE];  /* vertical transition strengths */
extern int lus [XSIZE][YSIZE];   /* left-up transition strengths (+ right down) */
extern int rus [XSIZE][YSIZE];   /* right-up transition strengths (+ left down) */ extern PIXEL con [XSIZE] [YSIZE];              /* constraint image */
extern PIXEL goa [XSIZE] [YSIZE];              /* goal image */
extern PIXEL pnt [XSIZE] [YSIZE];              /* pointer image */
extern unsigned int lma [XSIZE] [YSIZE];       /* result image */ extern   int x_increment[DIRECTION_COUNT];
extern   int y_increment[DIRECTION_COUNT];

/***************************************************************************/
/* canvas treatment: cell dimensions */
```

```
externs.h              Tue Aug 11 14:15:08 1997                                    Page:5

/*************************************************************************************/
extern Frame            frame0;
extern Frame            message_frame;
extern Canvas           canvas1;
extern Pixwin           *canvas1_pw;
extern struct pixrect   *canvas1_pr;

extern Canvas           canvas2;
extern Pixwin           *canvas2_pw;
extern struct pixrect   *canvas2_pr;

extern Panel            panel;
extern Panel            panel2;
extern Panel            message_panel;
extern Panel_item       goal_button;
extern Panel_item       start_button;
extern Panel_item       change1_item;
extern Panel_item       change2_item;
extern Panel_item       mode_item;
extern Panel_item       flow_item;
extern Panel_item       redraw_item;
extern Panel_item       speed_item;
extern Panel_item       metric_item;
extern Panel_item       gain_item;
extern Panel_item       camera_item;
extern Panel_item       robot_item;
extern Panel_item       message_item;
extern Panel_item       message_item;
extern Panel_item       prog_item1;
extern Panel_item       prog_item2;
extern Panel_item       demo_item;

extern short            change2;
extern short            change1;
extern short            mode;
extern short            redraw;
extern short            flow;
extern short            speed;
extern short            camera;
extern short            robot;
extern short            gain;
extern float            (*metric_fcn)();   /* ptr to any of the metric fcns */ extern u_char rmap[COLOR_MAP_SIZE], gmap[COLOR_MAP_SIZE], bmap[COLOR_MAP_SIZE];

extern short present_obstacle;
extern SCREEN_POS obs_pos[NUMOBS];
extern int rad8;
extern int angleobs;
extern int obs_ang1, obs_ang2, obs_l1_plus, obs_l1_minus;
extern short oldevent_x, oldevent_y;

extern int obs_ang1,obs_ang2;   /* results of l2f(rinterp_obs appear here */
extern int nobs,l1;             /* useful values for debug */
extern int obs_l1_plus,obs_l1_minus; /* result of l1_interp_obs appears here*/
``` externs.h         Tue Aug 11 14:15:08 1987        Page:6

```c
extern int rad8,angleobs;                  /* radius scaled up by 8 */
extern int lnk2_front[14][2][13];  /* obstacle point descriptors (lnk2 front) */
extern int del_l2f[14][2][13];     /* pt 0 absolute, and d01,d02 relat positions */
extern int lnk2_rear[10][2][13];   /* obstacle point descriptors (lnk2 rear) */
extern int del_l2r[10][2][13];     /* pt 0 absolute, and d01,d02 relat positions */
extern int llnk1_obs[16];          /* llnk1 obstacle data +/1 dtheta bound */
extern unsigned int bitmask[32];   /* bit masks for obstacle codes */ extern short pathlength;

extern short lookupx[256][256];
extern short lookupy[256][256];
extern LOGICAL regeneration_needed;
extern short i_shown_arm, j_shown_arm;
extern LOGICAL arm_shown;
extern LOGICAL feedback;

extern GRID_POS task_goal[MAX_GOAL_NUMBER];
extern short    num_goals;
extern LOGICAL path_drawn;
extern CSNODE configspace[XSIZE][YSIZE];
extern bud();
extern init_goal();

extern int firsttime;
extern un_bud();                                    /* in bud.c */
extern un_look();                                   /* in bud.c */
extern remove_goal();                               /* in bud.c */
extern delete_from_heap();
extern add_to_heap();
extern coordinates_of();                            /* in bud.c */
extern double celltoangle_x();   /* in trafo_data.c */
extern double celltoangle_y();   /* in trafo_data.c */
extern unsigned char red[CMS_RGBSIZE];
extern unsigned char green[CMS_RGBSIZE];
extern unsigned char blue[CMS_RGBSIZE];
extern unsigned char red1[CMS_RGBSIZE];
extern unsigned char green1[CMS_RGBSIZE];
extern unsigned char blue1[CMS_RGBSIZE];
extern DIR_MODE direction[DIRECTION_COUNT];
extern float metric_value();  /* in metric.c */
extern float dl1_task_straight[XSIZE];
extern float dl1_task_straight[XSIZE];
extern float dl2_task_straight[XSIZE];
extern float dl2_task_straight[XSIZE];
extern float effort();  /* in metric.c */
extern float task_straight();  /* in metric.c */
extern float config_straight();  /* in metric.c */
```

```
globals.h         Tue Aug 11 14:15:08 1987                              Page:1

/***************************************************************************/
/*      globals.h                                                           */
/*      history:                                                            */
/*              created 198609xx Leo Dorst                                  */
/*              mcd     19861113 Karen Trovato                              */
/***************************************************************************/

/***************************************************************************/
/* type definitions */
/***************************************************************************/

CELL            null_cell       = {0,0,0,0,0,0};
ELEMENT         null_element    = {0,0,0};
GRID_POS        null_position   = {0,0};        /* also for SCREEN_POS */
CARTCELL        null_cartcell   = {0,0,0,0,0};
CARTELEMENT     null_cartelement = {0,0,0};
ARM             null_arm        = {0,0,0,0,0,0,0,0};

/* pertaining to color - kit */
static u_char rmap[COLOR_MAP_SIZE];
              gmap[COLOR_MAP_SIZE];
              bmap[COLOR_MAP_SIZE];
              /* r[x],g[x],b[x] is assigned a color for each bit plane */

/*****  ********************************************************************/
/* mem:  pixrects for cursors                                        */
static short cursor_array[16] = {
    0x8000,0xC000,0xE000,0xF000,0xF800,0xFC00,0xFE00,0xF000,
    0xD800,0x9800,0x0C00,0x0C00,0x0600,0x0600,0x0300,0x0300
};
mpr_static (cursor_pr,16,16,1,cursor_array);
struct cursor main_cursor = { 0,0,PIX_SRC|PIX_DST,&cursor_pr };
/* memory pixrects in white, grey and black patterns.             */
/***************************************************************************/ static unsigned short  white_data[MAXSIZE] = {
    0x0000, 0x0000, 0x0000, 0x0000, 0x0000, 0x0000, 0x0000, 0x0000,
    0x0000, 0x0000, 0x0000, 0x0000, 0x0000, 0x0000, 0x0000, 0x0000
};
mpr_static(white_patch, MAXDIM, MAXDIM, 1, white_data);

static unsigned short  gray25_data[MAXSIZE] = {
    0x8888, 0x2222, 0x4444, 0x1111, 0x8888, 0x2222, 0x4444, 0x1111,
    0x8888, 0x2222, 0x4444, 0x1111, 0x8888, 0x2222, 0x4444, 0x1111
};
mpr_static(gray25_patch, MAXDIM, MAXDIM, 1, gray25_data);
```

```
globals.h           Tue Aug 11 14:15:08 1987                Page: 2 static unsigned short   gray50_data[MAXSIZE] = {
        0xAAAA, 0x5555, 0xAAAA, 0x5555, 0xAAAA, 0x5555, 0xAAAA, 0x5555,
        0xAAAA, 0x5555, 0xAAAA, 0x5555, 0xAAAA, 0x5555, 0xAAAA, 0x5555
        };
mpr_static(gray50_patch, MAXDIM, MAXDIM, 1, gray50_data);

static unsigned short   gray75_data[MAXSIZE] = {
        0x7777, 0xDDDD, 0xBBBB, 0xEEEE, 0x7777, 0xDDDD, 0xBBBB, 0xEEEE,
        0x7777, 0xDDDD, 0xBBBB, 0xEEEE, 0x7777, 0xDDDD, 0xBBBB, 0xEEEE
        };
mpr_static(gray75_patch, MAXDIM, MAXDIM, 1, gray75_data);

static unsigned short   black_data[MAXSIZE] = {
        0xFFFF, 0xFFFF, 0xFFFF, 0xFFFF, 0xFFFF, 0xFFFF, 0xFFFF, 0xFFFF,
        0xFFFF, 0xFFFF, 0xFFFF, 0xFFFF, 0xFFFF, 0xFFFF, 0xFFFF, 0xFFFF
        };
mpr_static(black_patch, MAXDIM, MAXDIM, 1, black_data);

struct pixrect *patch_prs[PATCH_COUNT] =
        { &white_patch, &gray25_patch, &gray50_patch,
          &gray75_patch, &black_patch};

/********************************************************************/
/*      icons  */
/********************************************************************/
static unsigned short goal_data[ICON_SIZE] = {
/* the 16*16 goal icon
        0xE007,0xC3C3,0x8FF1,0x1C38,0x300C,0x318C,0x63C6,0x6666,
        0x6666,0x63C6,0x318C,0x300C,0x1C38,0x8FF1,0xC3C3,0xE007 };
*/
        0xFF00,0xE300,0x8100,0x9900,0x8100,0xE300,0xFF00,
        0x0000,0x0000,0x0000,0x0000,0x0000,0x0000,0x0000,0x0000};
mpr_static (goal_icon,CELL_SIZE,CELL_SIZE,1,goal_data);

static unsigned short obst_data[ICON_SIZE] = {
        0x0000,0x7FFE,0x7FFE,0x783E,0x7C7E,0x6EF6,0x67E6,0x63C6,
        0x63C6,0x67E6,0x6EF6,0x7C7E,0x783E,0x7FFE,0x7FFE,0x0000 };
mpr_static (obst_icon,CELL_SIZE,CELL_SIZE,1,obst_data);

static unsigned short start_data[ICON_SIZE] = {
        0xF99F,0xF3CF,0xE7E3,0xC003,0x8001,0x27E4,0x67E6,0xE667,
        0xE667,0x67E6,0x27E4,0x8001,0xC003,0xC7E3,0xF3CF,0xF99F };
mpr_static (start_icon,CELL_SIZE,CELL_SIZE,1,start_data);

static unsigned short smgoal_data[SMICON_SIZE] = { 0x6FF6 };
/* 0x7EFF, 0xC3DB, 0xDBC3, 0xFF7E }; */
mpr_static (smgoal_icon,CELL_SIZE,CELL_SIZE,1,smgoal_data);

static unsigned short smobst_data[SMICON_SIZE] = { 0x9669 };
/* 0xC3E7, 0x7E3C, 0x3C7E, 0xE7C3 }; */
mpr_static (smobst_icon,CELL_SIZE,CELL_SIZE,1,smobst_data);
```

```
globals.h                Tue Aug 11 14:15:08 1987                Page:3 static unsigned short  smstart_data[SMICON_SIZE] = ( 0xF99F );
/* 0xFFFF, 0xC3C3, 0xFFFF ); */
mpr_static (smstar_icon,CELL_SIZE,CELL_SIZE,1,smstart_data);

struct pixrect *icon_prs[ICON_COUNT] =
    ( &obst_icon,&goal_icon,&star_icon,
      &smobst_icon, &smgoal_icon, &smstar_icon);

/*****************************************************************/
/*          icon of standardobstacle                              */
/*****************************************************************/
static unsigned short  obstacle_data[32*32/16] = (
    0x01F0,0x0000,0x0FFE,0x0000,0x1FFF,0x0000,0x3FFF,0x0000,
    0x7FFF,0xC000,0x7FFF,0xC000,0x7FFF,0xE000,0x7FFF,0xC000,
    0xFFFF,0xE000,0xFFFF,0xE000,0xFFFF,0xE000,0xFFFF,0xE000,
    0xFFFF,0xE000,0x7FFF,0xC000,0x7FFF,0xC000,0x7FFF,0xC000,
    0x3FFF,0x8000,0x1FFF,0x0000,0x0FFE,0x0000,0x01F0,0x0000,
    0x0000,0x0000,0x0000,0x0000,0x0000,0x0000,0x0000,0x0000,
    0x0000,0x0000,0x0000,0x0000,0x0000,0x0000,0x0000,0x0000,
    0x0000,0x0000,0x0000,0x0000,0x0000,0x0000,0x0000,0x0000
);
mpr_static (standardobs,32,32,1,obstacle_data);
/*****************************************************************/
/* basic array definitions */
/*****************************************************************/
short      istart,jstart;
short      igoal,jgoal;
short      ilast,jlast;
LOGICAL    new_feedback;
int xts [XSIZE] [YSIZE];              /* horizontal transition strengths */
int yts [XSIZE] [YSIZE];              /* vertical transition strengths */
int lus [XSIZE] [YSIZE];   /* left-up transition strengths (+ right down) */
int rus [XSIZE] [YSIZE];   /* right-up transition strengths (+ left down) */
PIXEL constraint_image [XSIZE] [YSIZE];      /* constraint image */
PIXEL con[XSIZE][YSIZE];
PIXEL goa [XSIZE] [YSIZE];                   /* constraint image */
int path[2*PATHLENGTH];

unsigned int lma [XSIZE] [YSIZE];            /* result image */

/*****************************************************************/
/* codes for constants in arrays */
/*****************************************************************/

/*****************************************************************/
/* arm definition */
/*****************************************************************/
ARM    *arm;

/*****************************************************************/
/* canvas treatment: cell dimensions */
/*****************************************************************/
``` globals.h    Tue Aug 11 14:15:00 1987    Page:4

```
Frame          frame0;
Frame          message_frame;
Canvas         canvas1;
Pixwin         *canvas1_pw;
struct pixrect *canvas1_pr;
Canvas         canvas2;
Pixwin         *canvas2_pw;
struct pixrect *canvas2_pr;
Panel          panel;
Panel          panel2;
Panel          message_panel;
Panel_item     goal_button;
Panel_item     start_button;
Panel_item     change1_item;
Panel_item     change2_item;
Panel_item     mode_item;
Panel_item     flow_item;
Panel_item     redraw_item;
Panel_item     speed_item;
Panel_item     gain_item;
Panel_item     metric_item;
Panel_item     camera_item;
Panel_item     robot_item;
Panel_item     message_item;
Panel_item     prog_item1;
Panel_item     prog_item2;
Panel_item     demo_item;

short change2;
short change1;
short mode;
short redraw;
short flow;
short speed;
float (*metric_fcn)();  /* ptr to any of the metric fcns */
short gain;
short camera;
short robot;

/*************************************************/
short present_obstacle;            /* present obstacle treated */
SCREEN_POS obs_pos[NUMOBS];
int rad8;                          /* 8 times radius of obstacle */
int angleobs;                      /* angle of obstacle */
int obs_ang1,obs_ang2,obs_ll_plus,obs_ll_minus;
                                   /* return variables of interpolation routines */
/*************************************************/
short oldevent_x,oldevent_y;
/*************************************************/
/* interpol */
/*************************************************/
int obs_ang1,obs_ang2;             /* results of 12f/rinterp_obs appear here */
int nobs,ll;                       /* useful values for debug */
int obs_ll_plus,obs_ll_minus;      /* result of ll_interp_obs appears here*/
```

```
globals.h            Tue Aug 11 14:15:08 1987                    Page:5 int rad8,angleobs;
    int link2_front[14][2][13];      /* radius scaled up by 8 */
    int del_l2f[14][2][13];          /* obstacle point descriptors (link2 front) */
    int link2_rear[10][2][13];       /* pt 0 absolute, and d01,d02 relnt positions */
    int del_l2r[10][2][13];          /* obstacle point descriptors (link2 rear) */
    int linkl_obs[16];               /* pt 0 absolute, and d01,d02 relnt positions */
    unsigned int bitmask[32];        /* linkl obstacle data +/1 dtheta bound */
                                     /* bit masks for obstacle codes */ short pathlength;

short lookupx[256][256];
short lookupy[256][256];
LOGICAL regeneration_needed;
short l_shown_arm, j_shown_arm;
LOGICAL arm_shown;
LOGICAL feedback;

GRID_POS task_goal[MAX_GOAL_NUMBER];
short    num_goals;
LOGICAL  path_drawn;

CSNODE configspace[XSIZE][YSIZE];
int firstime;
unsigned char red[CMS_RGBSIZE];
unsigned char green[CMS_RGBSIZE];
unsigned char blue[CMS_RGBSIZE];
unsigned char red1[CMS_RGBSIZE];
unsigned char green1[CMS_RGBSIZE];
unsigned char blue1[CMS_RGBSIZE];

/* directions are (dx,dy) */
/* directions must be in pairs s.t. even & (even+1) */
/* represent opposing vectors */

DIR_NODE direction[DIRECTION_COUNT] = {  1,0,     /* 0- right */
                                        -1,0,    /* 1- left */
                                         0,1,    /* 2- up */
                                         0,-1,   /* 3- down */
                                         1,1,    /* 4- rt, up */
                                         1,-1,   /* 5- rt, dn */
                                        -1,1,    /* 6- lt, up */
                                        -1,-1,   /* 7- rt, dn */
                                         2,1,-2,-1,
                                         1,2,-1,-2,
                                        -1,2,1,-2,
                                        -2,1,2,-1};

/* in order of XP,XN,YP,YN,LU,LD,RU,RD */ int x_increment[DIRECTION_COUNT] = { 1,-1,0,0,1,-1,-1,1,2,-2,1,-1,-1,1,-2,2};
int y_increment[DIRECTION_COUNT] = { 0,0,1,-1,1,1,-1,-1,1,2,-2,1,-1,-2,-2,1,-1};
float dl1_task_straight[XSIZE];
float dl1_task_straight[XSIZE];
float dl2_task_straight[XSIZE];
float dl2_task_straight[XSIZE];
``` borderline.c    Tue Aug 11 14:15:10 1987    Page:1

```c
#include "defines.h"
include "externs.h"
#define abs(x) ((x)>0) ? (x) : -(x)

borderline (x1,y1,x2,y2,connectivity)
short   x1,y1,
        x2,y2,
        connectivity;   /* 4 or 8 */
{
    register short
        ind1,ind2,          /* recomputed end points */
        dep1,dep2,
        d_ind,d_dep,
        dx,dy,
        incr1,              /* increment if d < 0 */
        incr2,              /* increment if d >= 0 */
        incr_dep,           /* increment the dependent variable;
                               either 1 (positive slope) or -1 (neg.) */
        d,                  /* determines if the dep var should be increment */
        ind,                /* the current value of the independent variable */
        dep,                /* the current value of the dependent variable */
        ind_end,            /* the stopping point of the independent variable */
        x,y,                /* the x and y value of the pixel */
        pery;
    char
        c4,
        x_is_ind,
        reverse_start;

if ( connectivity == 4) c4 = 1; else c4 =0;

if ((dx = (x2-x1)) < 0) dx = -dx;
    if ((dy = (y2-y1)) < 0) dy = -dy;

if (dy<dx) {
        x_is_ind = 1; /* x independent variable */
        ind1 = x1; dep1 = y1;
        ind2 = x2; dep2 = y2;
        d_ind = dx; d_dep = dy;
    } else {
        x_is_ind = 0;
        ind1 = y1; dep1 = x1;
        ind2 = y2; dep2 = x2;
        d_ind = dy; d_dep = dx;
    }

/*
     * Find which point has the lowest independent variable and use it
     * as the starting point.
     */
    if (ind1 > ind2) {
        reverse_start = 1;
        ind = ind2;
        dep = dep2;
        ind_end = ind1;     if (c4) ind_end += d_dep;
        incr_dep = (dep2 > dep1) ? -1 : 1;
    } else {
``` borderline.c    Tue Aug 11 14:15:10 1987                                    Page:2

```
        reverse_start = 0;
        ind = ind1;
        dep = dep1;
        ind_end = ind2;      if (c4) ind_end += d_dep;
        incr_dep = (dep1 > dep2) ? -1 : 1;
}

/* initialisation of actual process parameters */ if (c4) d_ind += d_dep;
d = 2 * d_dep - d_ind;    /* calulate the initial d value */
incr1 = 2 * d_dep;
incr2 = 2 * (d_dep - d_ind);

do {
    /*
     * x and y are assigned depending on whether x is the dependent or
     * independent variable.
     */
    if (x_is_ind) {
        x = ind;
        y = dep;
        if (c4) {              if (reverse_start)      x -= abs(dep-dep2);
                               else                    x -= abs(dep1-dep);
        }
    } else {
        x = dep;
        y = ind;
        if (c4) {              if (reverse_start)      y -= abs(dep-dep2);
                               else                    y -= abs(dep1-dep);
        }
    }

/* insert point treatment routine here */ pery = periodic_y(y);
    if (y != pery)  constraint_image[periodic_x(x)][pery] = 2;
    else            constraint_image[periodic_x(x)][pery] = 1;

if (d < 0)
        d += incr1;
    else {
        dep += incr_dep;
        d += incr2;
    }
} while (ind++ < ind_end);
} clear_constraint_image()
{
    register x,y;

x = XSIZE;
    while (--x>=0) {
        y = YSIZE;
        while (--y>=0) {
```

```
borderline.c      Tue Aug 11 14:15:10 1987                    Page:3 constraint_image[x][y] = 0;
            }
        }
} fill_contour(add)
short add;
{
    short x,y,y11,y12,y21,y22,y31,y32;
    short numobs;

numobs = 0;
    for (x=0; x<XSIZE; x++) {
        for (y=0; y<YSIZE; y++) { if (constraint_image[x][y] != 0) break; }
        if (y == YSIZE) goto next;    /* empty column */
        y11 = y;

for (y=y11; y<YSIZE; y++) { if (constraint_image[x][y] == 0) break; }
        y12 = y;                       /* y1 is the y of the first 0 after line */
        if (y12 == YSIZE) {
            numobs = 1;
            goto treat_obs;
        } for (y=y12; y<YSIZE; y++) { if (constraint_image[x][y] != 0) break; }
        y21 = y;
        if (y21 == YSIZE) {
            numobs = 1;
            goto treat_obs;
        } for (y=y21; y<YSIZE; y++) { if (constraint_image[x][y] == 0) break; }
        y22 = y;
        if (y22 == YSIZE) {
            numobs = 2;
            goto treat_obs;
        } for (y=y22; y<YSIZE; y++) { if (constraint_image[x][y] != 0) break; }
        y31 = y;
        if (y31 == YSIZE) {
            numobs = 2;
            goto treat_obs;
        } for (y=y31; y<YSIZE; y++) { if (constraint_image[x][y] == 0) break; }
        y32 = y;
        if (y32 == YSIZE) {
            numobs = 3;
            goto treat_obs;
        } printf("\nWHOOPS! more than 3 lines ? How can that be ?");
        printf("x=%d,numobs:%d\n",x,numobs);
        goto next;

treat_obs:
        printf("x=%d,numobs:%d\n",x,numobs);
        printf(
/*
```

A-JS

```
borderline.c     Tue Aug 11 14:15:10 1987                   Page:4

"y11,y12,y21,y22,y31,y32,%d,%d,%d,%d,%d,%d,%d\n",
                       y11,y12,y21,y22,y31,y32);
*/
            switch (numobs) {
            case 1:
                    for (y=y11; y<y12; y++) {
                            con[x][y] += add;
                    }
                    break;
            case 2: if ((y11 == 0) && (y22 == YSIZE)) {
                            for (y=y11; y<y12; y++) con[x][y] += add;
                            for (y=y21; y<y22; y++) con[x][y] += add;
                    } else if (constraint_image[x][y11] == constraint_image[x][y21]) {
                            for (y=y11; y<y22; y++) con[x][y] += add;
                    } else {
                            for (y=0;  y<y12; y++)    con[x][y] += add;
                            for (y=y21; y<YSIZE; y++) con[x][y] += add;
                    }
/*
                    if (constraint_image[x][y11] == 2) {
                            for (y=0; y<y12; y++)    con[x][y] += add;
                            for (y=y21; y<YSIZE; y++) con[x][y] += add;
                    } else if (constraint_image[x][y21] == 2) {
                            for (y=0; y<y12; y++)    con[x][y] += add;
                            for (y=y21; y<YSIZE; y++) con[x][y] += add;
*/
                    break;
            case 3: if (constraint_image[x][y11] == constraint_image[x][y21]) {
                            for (y=y11; y<y22; y++) con[x][y] += add;
                            for (y=y31; y<y32; y++) con[x][y] += add;
                    } else {
                            for (y=y11; y<y12; y++) con[x][y] += add;
                            for (y=y21; y<y32; y++) con[x][y] += add;
                    }
                    break;
            }
        next:;
            y = YSIZE;
            while (--y>=0)  constraint_image[x][y] = 0;
        }
} fill_link1_contour(x1,x2,add)
short x1,x2,add;
{
        register short per1,per2,x,y;

per1 = periodic_x(x2);
        per2 = periodic_x(x1);

if (per1 <= per2) {     /* only one strip */
                for (x=per1; x<= per2; x++) {
```

```
borderline.c    Tue Aug 11 14:15:10 1987                    Page:5 for (y=0; y<YSIZE; y++) {
                        con[x][y] += add;
                    }
        } else {    /* two strips left and right */
            for (x=0; x<= pcr2; x++) {
                for (y=0; y<YSIZE; y++) {
                    con[x][y] += add;
                }
            }
            for (x=pcr1; x< XSIZE; x++) {
                for (y=0; y<YSIZE; y++) {
                    con[x][y] += add;
                }
            }
        }
    }
}
```

```
bud.c    Tue Aug 11 14:15:10 1987                Page:1 include <stdio.h>
include <math.h>
#include "defines.h"
include "externs.h"

define MAXHEAP 2048 static HEAPNODE heap[MAXHEAP+1];   /* heap uses locations 1-> MAXHEAP */
                                    /* location 0 isn't used to hasten indexing */ static BOTHINDICIES *fastaccess = (BOTHINDICIES *)heap;
                                    /* ptr to x&y of heap */ static int bottom_of_heap;

static int budcounter;

remove_goal(gx,gy)
int gx,gy;
{
        configspace[gx][gy].cost_to_goal = UNCOSTED;
        configspace[gx][gy].vector = (unsigned)0;
        /* goal doesn't point anywhere */
} points_to(home_x,home_y,dir,newx,newy)
int home_x,home_y,dir;
int *newx,*newy;
/* given an x,y & direction, return the x & y pointed to */
{
        *newx = (XSIZE + home_x + direction[dir].dx) % XSIZE;
        *newy = (YSIZE + home_y + direction[dir].dy) % YSIZE;
} budinit()
{
        int x,y;
        bottom_of_heap = 1; /* next free spot in heap */

/* clear all nodes that are not obstacles */
        for(x=0;x<XSIZE;x++)
                for(y=0;y<YSIZE;y++)
                {
                        if(configspace[x][y].cost_to_goal != INFINITY)
                        {
                                configspace[x][y].cost_to_goal=UNCOSTED;
                                configspace[x][y].vector=(unsigned)0;
                        }
                }
} add_to_heap(localx,localy)
short localx, localy;
/* add the config space indicies to the heap */
/* this heap code keeps the lowest valued node at the top */
{
``` bud.c          Tue Aug 11 14:15:10 1987          Page:2

```c
float new_child_cost;
int child,parent;          /* indicies into heap */ if((child = bottom_of_heap) >= MAXHEAP)
    printf("PANIC: hit bottom of heap.%d.\n",bottom_of_heap);

new_child_cost = configspace[(int)localx][(int)localy].cost_to_goal;
                           /* node cost we're putting in*/ while((parent = (child>>1)) /* parent = child/2 */
    && (configspace[heap[parent].x][heap[parent].y].cost_to_goal >
        new_child_cost))
{
    /* swap child up swapping parent down*/
    /*****************************************/
    *(fastaccess + child) = *(fastaccess +parent);
    child = parent;
} heap[child].x = localx;/* put the child into the open node */
heap[child].y = localy;/* put the child into the open node */ bottom_of_heap++;
} int delete_from_heap(xcoord,ycoord)
int *xcoord, *ycoord;
/* returns TRUE (1) if sucessful, FALSE (0) else */
{
    /* return the lowest value node (at heap[1]) and reheap */ register int parent,rchild,lchild;     /* indicies into heap */
    register HEAPNODE *nodeptr;

HEAPNODE *picked_node;
    int heap_height, i;
    float picked_node_cost;
    float f_heap_height;
    double doublenodes;
    float leftchild_val, rightchild_val;

if(bottom_of_heap == 1) /* there are no items in heap */
        return(FALSE);

/* bottom of heap WAS the first free spot in heap */
    bottom_of_heap--;
    /* NOW bottom is pointing to last full spot in heap */

*xcoord = (int)(heap[1].x); *ycoord = (int)(heap[1].y);

if(bottom_of_heap == 1) /* theres one item in heap */
        return(TRUE);       /* don't bother re-heaping */
    /* otherwise, pull off the node at the bottom most edge */
    picked_node = &heap[bottom_of_heap];

picked_node_cost =
        configspace[(int)(picked_node->x)][(int)(picked_node->y)].cost_to_goal;
```

```
bud.c    Tue Aug 11 14:15:10 1987    Page:3 parent=1;

doublenodes = bottom_of_heap;
f_heap_height = (float)(logb(doublenodes));
heap_height = (int)(f_heap_height);
/* heap_height will tell us the max # of checks to freely make */ for(i=1;i<heap_height;i++)
{
    /* keep swapping down with the smaller of the 2 children */
    /* until can't swap or at bottom edge of heap */ lchild= parent << 1;      /* parent*2 */
    rchild= lchild + 1;       /* parent*2 + 1 */ nodeptr = &(heap[lchild]);
    leftchild_val = configspace[nodeptr->x][nodeptr->y].cost_to_goal;
    nodeptr = &(heap[rchild]);
    rightchild_val = configspace[nodeptr->x][nodeptr->y].cost_to_goal;

if(rightchild_val < leftchild_val)
    {
        if(rightchild_val < picked_node_cost)
        {
            /* swap up right child */
            *(fastaccess + parent) = *(fastaccess +rchild);
            parent=rchild;
        }
        else
        {
            /* found picked node a home in heap */
            heap[parent]= (*picked_node);
            return(TRUE);
        }
    }
    else
    {
        if(leftchild_val < picked_node_cost)
        {
            /* swap up left child */
            *(fastaccess + parent) = *(fastaccess +lchild);
            parent=lchild;
        }
        else
        {
            heap[parent]= (*picked_node);
            return(YES);
        }
    }
}

/* if we got here, then we're at the bottom edge of the heap */
/* have to deal with 'missing children' */ lchild= parent << 1;    /* parent*2 */
```

```
bud.c        Tue Aug 11 14:15:10 1987             Page:4 rchild= lchild + 1;      /* parent*2 + 1 */ if(bottom_of_heap > rchild)       /* both children exist */
    {
        nodeptr = &(heap[lchild]);
        leftchild_val = configspace[nodeptr->x][nodeptr->y].cost_to_goal;

nodeptr = &(heap[rchild]);
        rightchild_val = configspace[nodeptr->x][nodeptr->y].cost_to_goal;

if(rightchild_val < leftchild_val)
        {
            if(rightchild_val < picked_node_cost)
            {
                /* swap up right child */
                *(fastaccess + parent) = *(fastaccess +rchild);

heap[rchild]= (*picked_node);
                return(TRUE);
            }
            else
            {
                heap[parent]= (*picked_node);
                return(TRUE);
            }
        }
        else
        {
            if(leftchild_val < picked_node_cost)
            {
                /* swap up left child */
                *(fastaccess + parent) = *(fastaccess +lchild);

heap[lchild]= (*picked_node);

return(TRUE);
            }
            else
            {
                heap[parent]= (*picked_node);
                return(TRUE);
            }
        }
    }
    else if(bottom_of_heap <= lchild)     /* no children exist */
    {
        heap[parent]= (*picked_node);
        return(TRUE);
    }
    else                              /* only left child exists */
    {
        nodeptr = &(heap[lchild]);
        leftchild_val = configspace[nodeptr->x][nodeptr->y].cost_to_goal;

if(leftchild_val < picked_node_cost)
``` bud.c    Tue Aug 11 14:15:10 1987    Page:5

```
                {
                        /* swap up left child */
                        *(fastaccess + parent) = *(fastaccess +lchild);
                        heap[lchild]= (*picked_node);
                        return(TRUE);
                }
                else
                {
                        heap[parent]= (*picked_node);
                        return(TRUE);
                }
        }
} look(xcoord,ycoord,dir)
int xcoord, ycoord;
int dir;
{
        int newx, newy;
        float transition_cost;
        VECTTYPE newvector;
        float cost_to_newnode;
        register CSNODE *new_csptr;       /* pt to the new node */ points_to(xcoord,ycoord,dir,&newx,&newy);

if((con[newx][newy] != NOCONSTRAINT)
                return;

/* else, trying to go to an unconstrained state */
        transition_cost = (*metric_fcn)(dir,newx,newy);

cost_to_newnode = transition_cost +
                configspace[xcoord][ycoord].cost_to_goal;

if(dir & 01) /* odd, so opposite is one less */
                newvector = (VECTTYPE)(01 << (dir-1));
        else
                newvector = (VECTTYPE)(01 << (dir+1));
        new_csptr = &(configspace[newx][newy]);

if((cost_to_newnode - new_csptr->cost_to_goal) < -ACCURACY )
        {
                /* this is best path, overwrite cost & vector*/
                new_csptr->cost_to_goal = cost_to_newnode;
                new_csptr->vector = newvector;

add_to_heap((short)newx,(short)newy);

}
        else if(abs(cost_to_newnode - new_csptr->cost_to_goal) < ACCURACY)
        {
                /* add our vector to the existing vectors */
                /*if(con[newx][newy] != NOCONSTRAINT)*/
                new_csptr->vector |= newvector;
```

```
bud.c    Tue Aug 11 14:15:10 1987                    Page:6

} bud()     /* bud out till all nodes are visited */
{
    VECTTYPE lookvector;    /* vector of directions to look in */
    int indexx, indexy;
    int i;    /* direction in the ordinal sense eg. 1,2,3,4,5 */ budcounter=0;

while(delete_from_heap(&indexx,&indexy))
    /* is legal node- i.e. non zero */
    {
        /* bud the whole space */
        /* look where we didn't come from*/
        lookvector=~(configspace[indexx][indexy].vector);
        for (i=0;i<DIRECTION_COUNT; i++)
        {
            if(lookvector & (01 << i))
                look(indexx,indexy,i);  /* 2^i is direction */
        }
        budcounter++;
    }
    printf("budded out %d times\n",budcounter);
}
``` canvas.c        Tue Aug 11 14:15:10 1987                                        Page:1

```
#include "defines.h"
include "externs.h"

/*******************************************************************************
        canvas.c
        canvases declaration and initialization
history:
        created 198609xx Leo Dorst
        mod     19861113 Leo + Karen
*******************************************************************************/ init_canvases()
{
        frame0 = window_create(NULL, FRAME,
                FRAME_LABEL,
"Task Space                              FRAME0_XOFFSET,     -- PATH PLANNING DEMONSTRATION --
                WIN_X,                  FRAME0_XOFFSET,
                WIN_Y,                  FRAME0_YOFFSET,
                FRAME_SHOW_LABEL,       TRUE,
                0);
#define PANEL_HEIGHT 150
        panel = window_create(frame0,PANEL,
                WIN_X,                  0,
                WIN_Y,                  3,
                WIN_HEIGHT,             PANEL_HEIGHT,
                WIN_WIDTH,              CARTWIDTH,
                WIN_CURSOR,             &main_cursor,
                0);
        canvas1 = window_create(frame0, CANVAS,
                WIN_Y,                  3,
                WIN_RIGHT_OF,           panel,
                WIN_HEIGHT,             CYSIZE,
                WIN_WIDTH,              (CXSIZE+4),
                WIN_EVENT_PROC,         canvas1_event_proc,
                WIN_CONSUME_PICK_EVENTS,WIN_NO_EVENTS,
                                        LOC_WINEXIT,LOC_WINENTER,LOC_DRAG,
                                        MS_LEFT,MS_RIGHT,MS_MIDDLE,
                                        WIN_UP_EVENTS,0,
                WIN_CURSOR,             &main_cursor,
                0);
        canvas2 = window_create(frame0, CANVAS,
                WIN_HEIGHT,             CARTHEIGHT,
                WIN_WIDTH,              CARTWIDTH,
                WIN_X,                  0,
                WIN_BELOW,              panel,
                WIN_EVENT_PROC,         canvas2_event_proc,
                WIN_CONSUME_PICK_EVENTS,WIN_NO_EVENTS,
                                        LOC_WINEXIT,LOC_WINENTER,LOC_DRAG,
                                        MS_LEFT,MS_RIGHT,MS_MIDDLE,
                                        WIN_UP_EVENTS,0,
                WIN_CURSOR,             &main_cursor,
                0);
        message_frame = window_create(frame0,FRAME,
                WIN_X,                  (CARTWIDTH/4),
                WIN_Y,                  (CARTHEIGHT/2),
                WIN_EVENT_PROC,         message_event_proc,
```

Configuration Space

A-27

```
canvas.c         Tue Aug 11 14:15:10 1987                Page: 2

0);
message_panel = window_create(message_frame,PANEL,0);
panel2 = window_create(frame0,PANEL,
        WIN_BELOW,               canvas1,
        WIN_RIGHT_OF,            canvas2,
        WIN_HEIGHT,              (PANEL_HEIGHT+CARTHEIGHT-CYSIZE),
        0);
prog_item1 = panel_create_item(panel2,PANEL_CHOICE,
        PANEL_LABEL_X,           5,
        PANEL_LABEL_Y,           ((PANEL_HEIGHT+CARTHEIGHT-CYSIZE)/2-8),
        PANEL_FEEDBACK,          PANEL_INVERTED,
        PANEL_CHOICE_STRINGS,
        "Your Move ","Propagating Waves ",
        "Preparing Graphics ","Following Gradient ",0,
        0);
change2_item = panel_create_item(panel,PANEL_CHOICE,
        PANEL_LABEL_X,           10,
        PANEL_LABEL_Y,           4,
        PANEL_LABEL_STRING,      "Path Computation:  ",
        PANEL_FEEDBACK,          PANEL_INVERTED,
        PANEL_CHOICE_STRINGS,    "Now"," ",0,
        PANEL_NOTIFY_PROC,       change2_proc,
        0);
change1_item = panel_create_item(panel,PANEL_CHOICE,
        PANEL_LABEL_X,           10,
        PANEL_LABEL_Y,           24,
        PANEL_LABEL_STRING,      "Configuration Space Mouse: ",
        PANEL_FEEDBACK,          PANEL_INVERTED,
        PANEL_CHOICE_STRINGS,    "Start","Goal",/*"Double_Goal*/"Pointer",0,
        PANEL_NOTIFY_PROC,       change1_proc,
        0);
mode_item = panel_create_item(panel,PANEL_CHOICE,
        PANEL_LABEL_X,           10,
        PANEL_LABEL_Y,           44,
        PANEL_LABEL_STRING,      "Arm Display Mode:  ",
        PANEL_FEEDBACK,          PANEL_INVERTED,
        PANEL_CHOICE_STRINGS,    "Moving arm","Arm path",0,
        PANEL_NOTIFY_PROC,       mode_proc,
        0);
speed_item = panel_create_item(panel, PANEL_SLIDER,
        PANEL_LABEL_X,           10,
        PANEL_LABEL_Y,           67,
        PANEL_LABEL_STRING,      "Display Speed  ",
        PANEL_FEEDBACK,          PANEL_INVERTED,
        PANEL_VALUE,             100,
        PANEL_MIN_VALUE,         1,
        PANEL_MAX_VALUE,         100,
        PANEL_SHOW_RANGE,        FALSE,
        PANEL_SHOW_VALUE,        TRUE,
        PANEL_NOTIFY_LEVEL,      PANEL_DONE,
        PANEL_NOTIFY_PROC,       speed_proc,
        0);
message_item = panel_create_item(message_panel,PANEL_MESSAGE,
        PANEL_ITEM_X,            5,
        PANEL_ITEM_Y,            10,
        PANEL_LABEL_STRING,
``` canvas.c        Tue Aug 11 14:15:10 1987        Page:3

```
                "No path to the goal(s) possible !",
                PANEL_NOTIFY_PROC,      message_event_proc,
                0);
        flow_item = panel_create_item(panel,PANEL_CHOICE,
                PANEL_LABEL_X,          10,
                PANEL_LABEL_Y,          84,
                PANEL_LABEL_STRING,     "Show Flow Pattern: ",
                PANEL_FEEDBACK,         PANEL_INVERTED,
                PANEL_CHOICE_STRINGS,   "Yes","No",0,
                PANEL_NOTIFY_PROC,      flow_proc,
                0);
        metric_item = panel_create_item(panel,PANEL_CHOICE,
                PANEL_LABEL_X,          10,
                PANEL_LABEL_Y,          104,
                PANEL_LABEL_STRING,     "Criterion: Minimum ",
                PANEL_FEEDBACK,         PANEL_INVERTED,
                PANEL_CHOICE_STRINGS,   "Motion","Distance","Effort",0,
                PANEL_NOTIFY_PROC,      metric_proc,
                0);
        demo_item = panel_create_item(panel,PANEL_CHOICE,
                PANEL_LABEL_X,          10,
                PANEL_LABEL_Y,          124,
                PANEL_LABEL_STRING,     "Demonstration Pattern: ",
                PANEL_FEEDBACK,         PANEL_INVERTED,
                PANEL_CHOICE_STRINGS,   "Clean","Video"," ",0,
                PANEL_NOTIFY_PROC,      demo_proc,
                0);
        canvas1_pw = canvas_pixwin(canvas1);
        canvas2_pw = canvas_pixwin(canvas2);
        window_fit(frame0);
        window_fit(message_panel);
        window_fit(message_frame);
        init_colors();
        set_prog_item(INPUT);
        panel_set_value(change1_item,POINTER_BUTTON);
        panel_set_value(change2_item,1);
        panel_set_value(demo_item,2);
        panel_set_value(mode_item,1);
        mode = PATHMODE;
        change1 = POINTER_BUTTON;
        redraw = BODY_ARM;
        flow = TRUE;
        feedback = FALSE;
        metric_fcn = config_straight;
        speed = 100;
        robot = DONTSEND;
        regeneration_needed = FALSE;
}

/****************************************************/
/*      canvas handlers   */
/****************************************************/ void nullproc() { return; } static canvas2_event_proc (win,event)
``` canvas.c         Tue Aug 11 14:15:10 1987         Page: 4

```c
    Window  win;
    Event   *event;
{
    remove_message();
    switch (event_id(event)) {
    case LOC_WINEXIT:
        reset_handlers();
        return;
    case MS_LEFT:
    case MS_MIDDLE:
    case MS_RIGHT:
        if (event_is_down(event)) {
            remove_cursor2();
            obs_select(event);
        }
        if (event_is_up(event)) {
            add_cursor2();
            obs_read(event);
        }
        break;
    case LOC_DRAG:
        obs_feedback(event);
        break;
    }
} static
canvas1_event_proc (win,event)
    Window  win;
    Event   *event;
{
    remove_message();
    switch (event_id(event)) {
    case MS_LEFT:
    case MS_MIDDLE:
    case MS_RIGHT:
        if (event_is_down(event)) {
            remove_cursor1();
            point_select(event);
        }
        if (event_is_up(event)) {
            add_cursor1();
            point_read1(event);
        }
        break;
    case LOC_DRAG:
        point_feedback(event);
        break;
    case LOC_WINEXIT:
        reset_handlers();
        break;
    }
} void basereader() {;}
void tracker() {;}
```

```
canvas.c        Tue Aug 11 14:15:10 1987                Page:5 void reset_handlers() {, } obs_select(event)
    Event    *event;
{
    register short    i;
    int x,y;

/* scan for obstacle */
    /* take lowest obstacle number satisfying closeness criteria */
    x = event_x(event);
    y = (CARTHEIGHT - event_y(event));

for (i=0; i<NUMOBS; i++) {
        if ( (abs(obs_pos[i].x - x) < 5*CENTIMETER) &&
             (abs(obs_pos[i].y - y) < 5*CENTIMETER) ) {
                present_obstacle = i;
                oldevent_x = obs_pos[i].x;
                oldevent_y = obs_pos[i].y;
                return;
        }
    }
} obs_read(event)
    Event    *event;
{
    /* remove old trafo and add new one */
    update_joint_space_for(present_obstacle,-1,0,0);
    obs_pos[present_obstacle].x = event_x(event);
    obs_pos[present_obstacle].y = (CARTHEIGHT-event_y(event));
    update_joint_space_for(present_obstacle,1,0,0);
    regeneration_needed = TRUE;
} obs_feedback(event)
    Event    *event;
{
    show_obs_icon(oldevent_x,oldevent_y,(PIX_SRC^PIX_DST)|PIX_COLOR(BLACKC));
    update_joint_space_for(present_obstacle,0,oldevent_x,oldevent_y);
    oldevent_x = event_x(event);
    oldevent_y = CARTHEIGHT-event_y(event);
    show_obs_icon(oldevent_x,oldevent_y,(PIX_SRC^PIX_DST)|PIX_COLOR(BLACKC));
    update_joint_space_for(present_obstacle,0,oldevent_x,oldevent_y);
} point_select(event)
    Event    *event;
{
    ELEMENT    *elem,*element_of_point1();

if ( (elem = element_of_point1(event)) == NULL) return;
    ilast = elem->i;
    jlast = elem->j;
``` canvas.c        Tue Aug 11 14:15:10 1987         Page: 6

```
        plot_canvas2();
        plot_point1(ilast,jlast);
        plot_arm(ilast,jlast,PIX_SRC^PIX_DST);
        feedback = FALSE;
} void point_feedback1(event)
        Event   *event;
{
        ELEMENT        *elem,*element_of_point1();

if (new_feedback) {
                plot_point1(ilast,jlast);
                erase_arms();
                new_feedback = FALSE;
        } else {
                plot_point1(ilast,jlast);
                plot_arm(ilast,jlast,PIX_SRC^PIX_DST,BLACKP);
        }
        if ( (elem = element_of_point1(event)) == NULL) return;
        ilast = elem->i;
        jlast = elem->j;
        plot_point1(ilast,jlast);
        plot_arm(ilast,jlast,PIX_SRC^PIX_DST,BLACKP);
        feedback = TRUE;
} void point_read1(event)
        Event   *event;
{
        ELEMENT        *elem,*element_of_point1();
        register short  i,j;

new_feedback = TRUE;

if ( (elem = element_of_point1(event)) == NULL) return;
        i = elem->i;
        j = elem->j;

switch(change1) {
                case START_BUTTON:
                        show_arm(i,j,PIX_SRC,BLACK);
                        if (con[i][j] != NOCONSTRAINT ) {
                                show_message();
                                return;
                        }
                        plot_point1(i,j);
                        if (regeneration_needed) {
                                plot_point1(i,j);
                                exor_old_path();
                                istart = i; jstart = j;
                                regenerate();
                                set_prog_item(GRADIENT);
                        } else {
```

A-32

```
canvas.c          Tue Aug 11 14:15:10 1987         Page:7                    A-33 set_prog_item(GRADIENT);
            exor_old_path();
            istart = i; jstart = j;
        }
        find_and_draw_shortest_path();
        set_prog_item(INPUT);
        reset_handlers();
        break;
    case GOAL_BUTTON:
        show_arm(i,j,PIX_SRC,BLACK);
        i_shown_arm = i; j_shown_arm = j;
        if (configspace[i][j] == NOCONSTRAINT) return;
        if (goal[i][j] == GOAL) {
            goal[i][j] = NOGOAL;
            configspace[i][j].cost_to_goal = UNCOSTED;
            configspace[i][j].vector = (int) IP;
            /* reset everything but goals & obstacles */
            plot_patch(i,j,PIX_SRC,WHITEP);
            remove_goal_in_task_space(i,j);
        } else {
            goal[i][j] = GOAL;
            configspace[i][j].vector = IP;
            configspace[i][j].cost_to_goal = 0;
            add_to_heap(i,j);
            show_goal_point(i,j,PIX_SRC);
            add_goal_in_task_space(i,j);
        }
        regeneration_needed = TRUE;
        reset_handlers();
        break;
    case DGOAL_BUTTON:
        if (goal[i][j] == GOAL) {
            goal[i][j] = NOGOAL;
            plot_patch(i,j,PIX_SRC,WHITEP);
            configspace[i][j].cost_to_goal = UNCOSTED;
            configspace[i][j].vector = (int) IP;
            remove_goal_in_task_space(i,j);
        } else {
            goal[i][j] = GOAL;
            configspace[i][j].vector = IP;
            configspace[i][j].cost_to_goal = 0;
            add_to_heap(i,j);
            show_goal_point(i,j,PIX_SRC);
            add_goal_in_task_space(i,j);
        }
        if (i != j) {
            show_arm(j,i,PIX_SRC,BLACKP);
            if (goal[j][i] == GOAL) {
                goal[j][i] = NOGOAL;
                configspace[j][i].vector = IP;
                configspace[j][i].cost_to_goal = UNCOSTED;
                plot_patch(j,i,PIX_SRC,WHITEP);
            } else {
                goal[j][i] = GOAL;
                configspace[j][i].vector = IP;
                configspace[j][i].cost_to_goal = 0;
``` canvas.c          Tue Aug 11 14:15:10 1987                Page: 8

```
                    add_to_heap(j,1);
                    show_goal_point(i,j,PIX_SRC);
                }
                exor_old_path();
                plot_canvas2();
                show_arm(istart,jstart,PIX_SRC^PIX_DST,BLACK);
                regeneration_needed = TRUE;
                reset_handlers();
                break;
        case POINTER_BUTTON:
                plot_point1(i,j);
                report_about(i,j);
                break;
        }
} report_about(i,j)
int i,j;
{
        /* when the user uses the pointer button */
        /* print out cost & vector at that state */
        printf("pt[%d,%d], cost=%f, vect=%x(x)\n",i,j,
               configspace[i][j].cost_to_goal,
               configspace[i][j].vector);
} exor_old_path()
{
        short save_mode;

if (!path_drawn) return;
        save_mode = mode;
        mode = NORM;
        find_and_draw_shortest_path();
        mode = save_mode;
        path_drawn = FALSE;
} plot_path_point(i,j)
short i,j;
{
        plot_patch(i,j,(PIX_SRC^PIX_DST)|PIX_COLOR(REDC),BLACKP);
} void change2_proc(choice_item,value,event)
Panel_item      choice_item;
int             value;
Event           *event;
{
        change2 = value;

erase_arms();
        show_arm(istart,jstart,PIX_SRC,BLACK);
        if (regeneration_needed) {
               regenerate();
```

```
canvas.c        Tue Aug 11 14:15:10 1987                 Page:9 set_prog_item(GRADIENT);
                /* show_arm(istart,jstart,PIX_SRC^PIX_DST,WHITE); */
                show_arm(istart,jstart,PIX_SRC^PIX_DST,BLACK);
                find_and_draw_shortest_path();
        } else {
                set_prog_item(GRADIENT);
                exor_old_path();
                show_arm(istart,jstart,PIX_SRC^PIX_DST,BLACK);
                find_and_draw_shortest_path();
        }
        set_prog_item(INPUT);
        panel_set_value(change2_item,1);
} void change1_proc(choice_item,value,event)
Panel_item      choice_item;
int             value;
Event           *event;
{
        switch (value) {
        case 0: change1 = START_BUTTON;
                panel_set_value(change2_item,1);
                break;
        case 1: change1 = DGOAL_BUTTON;
                panel_set_value(change2_item,1);
                break;
        case 2: change1 = POINTER_BUTTON;
                panel_set_value(change2_item,1);
                break;
        case 3: change1 = GOAL_BUTTON;
                panel_set_value(change2_item,1);
                break;
        }
} void flow_proc(mode_item,value,event)
Panel_item      mode_item;
int             value;
Event           *event;
{
        switch (value) {
        case 0: flow = TRUE;
                break;
        case 1: flow = FALSE;
                break;
        }
        if (regeneration_needed) regenerate();
        set_prog_item(PREPARE);
        plot_canvas1();
        set_prog_item(GRADIENT);
```

```
canvas.c          Tue Aug 11 14:15:10 1987                    Page: 10 find_and_draw_shortest_path();
        set_prog_item(INPUT);
} void mode_proc(mode_item,value,event)
Panel_item     mode_item;
int            value;
Event          *event;
{
        switch (value) {
        case 0:   mode = MOVEMODE;
                  break;

case 1:   mode = PATHMODE;
                  break;
        }
        if (regeneration_needed)  {
                regenerate();
                set_prog_item(GRADIENT);
        } else {
                set_prog_item(GRADIENT);
                exor_old_path();
        }
        find_and_draw_shortest_path();
        set_prog_item(INPUT);
} void redraw_proc(redraw_item,value,event)
Panel_item     redraw_item;
int            value;
Event          *event;
{
        switch (value) {
        case 0:   redraw = STICK_ARM;
                  break;

case 1:   redraw = BODY_ARM;
                  break;
        }
        if (regeneration_needed)  {
                regenerate();
                set_prog_item(GRADIENT);
        } else {
                set_prog_item(GRADIENT);
                exor_old_path();
        }
        find_and_draw_shortest_path();
        set_prog_item(INPUT);
} void speed_proc(speed_item,value,event)
```

```
canvas.c         Tue Aug 11 14:15:10 1987                                  Page:11

Panel_item      speed_item;
int             value;
Event           *event;
{       speed = value; } void metric_proc(metric_item,value,event)
Panel_item      metric_item;
int             value;
Event           *event;
{
        switch(value) {
        case MOTION:
                metric_fcn = config_straight;
                break;
        case DISTANCE:
                metric_fcn = task_straight;
                break;
        case EFFORT:
                metric_fcn = effort;
                break;
        }
        regeneration_needed = TRUE;
} void demo_proc(demo_item,value,event)
Panel_item      demo_item;
int             value;
Event           *event;
{
        short i;

set_prog_item(INPUT);
        switch (value) {
        case 0: /* Clear */
                clear_vectors_and_costs(KILLGOALS); /* set up buddcr */
                init_con();
                clear_constraint_image();
                init_obs();
                init_goal(1,1);
                init_stat();
                break;
        case 1: /* Video Pattern */
                clear_vectors_and_costs(KILLGOALS); /* set up buddcr */
                init_con();
                clear_constraint_image();
                init_obs();
                obs_pos[NUMOBS-1].x = 152;
                obs_pos[NUMOBS-1].y = 343;
                obs_pos[NUMOBS-2].x = 132;
                obs_pos[NUMOBS-2].y = 220;
                obs_pos[NUMOBS-3].x = 215;
                obs_pos[NUMOBS-3].y = 130;
                obs_pos[NUMOBS-4].x = 354;
                obs_pos[NUMOBS-4].y = 173;
                obs_pos[NUMOBS-5].x = 361;
                obs_pos[NUMOBS-5].y = 315;
```

```
canvas.c            Tue Aug 11 14:15:10 1987                Page:12 for (i=0; i<NUMJOINS; i++) update_joint_space_for(i,1);
        init_goal(0,0);
        istart = 0; jstart = YSIZE/2;
        break;
    }
    set_prog_item(PREPARE);
    plot_canvas1();
    plot_canvas2();
    show_arm(istart,jstart,PIX_SRC,BLACK);
    set_prog_item(PROPAGATE);
    regenerate();
    set_prog_item(GRADIENT);
    find_and_draw_shortest_path();
    set_prog_item(INPUT);
    panel_set_value(demo_item,2);
} clear_vectors_and_costs(should_keep_goals)
int should_keep_goals;
{
    register CSNODE *csptr;
    int x,y;
    for(x=0;x<XSIZE;x++)
        for(y=0;y<YSIZE;y++)
        {
            csptr= &(configspace[x][y]);
            /* don't touch goals, or obstacles */
            if(csptr->cost_to_goal == 0)/* goal */
            {
                if(should_keep_goals == KILLGOALS)
                    csptr->cost_to_goal=
                        UNCOSTED;
                else /* add this goal */
                    add_to_heap(x,y);
                csptr->vector=0;
            }
            else if(con[x][y] == NOCONSTRAINT)
            {
                csptr->cost_to_goal= UNCOSTED;
                csptr->vector=0;
            }
            else if(con[x][y])/* is an obstacle, ensure blocking */
            {
                csptr->cost_to_goal= INFINITY;
                csptr->vector=0;
            }
        }
} regenerate()    /* regenerate landscapes */
{
    set_prog_item(PROPAGATE);
    clear_vectors_and_costs(KEEPGOALS);
    bud(istart,jstart);
```

```
canvas.c        Tue Aug 11 14:15:10 1987                      Page:13 set_prog_item(PREPARE);
        plot_canvas1();
        plot_canvas2();
        regeneration_needed = FALSE;
} show_message()
{
        window_set(message_frame,WIN_SHOW,TRUE,0);
} remove_message()
{
        window_set(message_frame,WIN_SHOW,FALSE,0);
        pw_batch_on(canvas1_pw);
        pw_batch_off(canvas1_pw);
} message_event_proc(win,event)
Window          win;
Event           *event;
{
        switch (event_id(event)) {
        case MS_LEFT:
        case MS_MIDDLE:
        case MS_RIGHT:
                remove_message();
        }
} plot_point1(i,j)/* exor point in configuration space, dependent on modes */
short i,j;
{
        int op;
        op = (PIX_SRC^PIX_DST)|PIX_COLOR(REDC);
        if (!low) {
                plot_patch(i,j,op,BLACKP);
                if ((change1 == DGOAL_BUTTON) && (i != j))
                        plot_patch(j,i,op,BLACKP);
        } else {
                plot_patch(i,j,op,POINTERPATCH);
                if ((change1 == DGOAL_BUTTON) && (i != j))
                        plot_patch(j,i,op,POINTERPATCH);
        }
} plot_arm(i,j,op,color)
short i,j,op,color;
{
        show_arm(i,j,op,color);
        if ((change1 == DGOAL_BUTTON) && (i != j)) show_arm(j,i,op,color);
} set_prog_item(number)
short number;
{
``` canvas.c                Tue Aug 11 14:15:10 1987                Page:14

```
    switch (number) {
    case INPUT:
            panel_set_value(prog_item1,0);
            break;
    case PROPAGATE:
            panel_set_value(prog_item1,1);
            break;
    case PREPARE:
            panel_set_value(prog_item1,2);
            break;
    case GRADIENT:
            panel_set_value(prog_item1,3);
            break;
    }
} remove_goal_in_task_space(i,j)
short i,j;
{
    int k;
    short gx,gy;
    double angle1,angle2;
    double cos1,sin1,cos2,sin2;

angle1 = -i*ANGLE1RES;  /* wyatt coordinates */
    angle2 = -j*ANGLE2RES;  /* wyatt coordinates */
    cos1 = cos(angle1);
    sin1 = sin(angle1);
    cos2 = cos(angle2);
    sin2 = sin(angle2);
    gx = XBASE+(short)(L1J*cos1) + (short)( (L22-W2)*cos2+.5);
    gy = YBASE+(short)(L1J*sin1) + (short)( (L22-W2)*sin2+.5);

for (k=0; k<num_goals; k++) {
        if (task_goal[k].x == gx && task_goal[k].y == gy) {
            num_goals -= 1;
            task_goal[k].x = task_goal[num_goals].x;
            task_goal[k].y = task_goal[num_goals].y;
            break;
        }
    } pw_rop(canvas2_pw,
        gx-(CELL_SIZE/2),gy-(CELL_SIZE/2),CELL_SIZE,CELL_SIZE,
        PIX_SRC^PIX_DST,icon_prs[GOAL_ICON],0,0);
} add_goal_in_task_space(i,j)
short i,j;
{
    short gx,gy;
    double angle1,angle2;
    double cos1,sin1,cos2,sin2;

if (num_goals == MAX_GOAL_NUMBER-1) {
        printf(" No more goals can be added; %d is the maximum\n",
```

```
canvas.c         Tue Aug 11 14:15:10 1987                                Page:15

MAX_GOAL_NUMBER);

angle1 = -i*ANGLEIRES;  /* wyatt coordinates */
    angle2 = -j*ANGLEJRES;  /* wyatt coordinates */
    cos1 = cos(angle1);
    sin1 = sin(angle1);
    cos2 = cos(angle2);
    sin2 = sin(angle2);
    gx = XBASE*(short)((I1J*cos1) + (short)( (I22-W2)*cos2 + .5);
    gy = YBASE*(short)((I1J*sin1) + (short)( (I22-W2)*sin2 + .5);

task_goal[num_goals].x = gx;
    task_goal[num_goals].y = gy;
    num_goals += 1;
} pw_batch_on(canvas2_pw);
pw_rop(canvas2_pw,
    gx-(CELL_SIZE/2),gy-(CELL_SIZE/2),CELL_SIZE,CELL_SIZE,
    (PIX_SRC^PIX_DST)|PIX_COLOR(GREENC),icon_prs[GOAL_ICON],0,0);
pw_batch_off(canvas2_pw);
} remove_cursor1()
{
    Cursor cursor;
    cursor = window_get(canvas1,WIN_CURSOR);
    cursor_set (cursor,CURSOR_OP,PIX_DST,0);
    window_set(canvas1,WIN_CURSOR,cursor,0);
} add_cursor1()
{
    Cursor cursor;
    cursor = window_get(canvas1,WIN_CURSOR);
    cursor_set (cursor,CURSOR_OP,PIX_DST^PIX_SRC,0);
    window_set(canvas1,WIN_CURSOR,cursor,0);
} remove_cursor2()
{
    Cursor cursor;
    cursor = window_get(canvas2,WIN_CURSOR);
    cursor_set (cursor,CURSOR_OP,PIX_DST,0);
    window_set(canvas2,WIN_CURSOR,cursor,0);
} add_cursor2()
{
    Cursor cursor;
    cursor = window_get(canvas2,WIN_CURSOR);
    cursor_set (cursor,CURSOR_OP,PIX_DST^PIX_SRC,0);
    window_set(canvas2,WIN_CURSOR,cursor,0);
}
```

```
demo.c   Tue Aug 11 14:15:10 1987                                    Page:1 include "defines.h"
include "externs.h"
#include "globals.h"
/**************************************************************
        armdemo2.c
        history :       created 19860912         Leo Dorst
                        modified 19861113        Leo + Karen
***************************************************************/ main()
{
        budinit();
        init_metrics();
        clear_constraint_image();
        init_canvases();
        prepare_trafo_data();
        init_sta();
        init_transitions();
        init_goal(1,1);
        init_con();
        bud(istart,jstart);
        plot_canvas2();
        plot_canvas1();
        window_set(canvas2_pw,WIN_SHOW,TRUE,0);
        window_set(canvas1_pw,WIN_SHOW,TRUE,0);
        find_and_draw_shortest_path();
        window_main_loop(frame0);
}
```

```
init.c    Tue Aug 11 14:15:11 1987                Page:1 include "defines.h"
include "externs.h"
/*******************************************************************
        init.c
        initialisation routines
        history
                created 198609xx Leo Dorst
                mod     19861113 Leo Dorst
*******************************************************************/
init_sta()      /* initialize start point */
{
        istart = XSIZE/2-1; jstart = YSIZE/2-1;
} init_goals_in_task_space()
{
        num_goals = 0;
} init_goal(i,j)
short i,j;
{
        init_goa();
        configspace[i][j].cost_to_goal = 0;
        configspace[i][j].vector = 0;    /* goal doesn't point anywhere */
        add_to_heap(i,j);
        goal[i][j] = GOAL;
        add_goal_in_task_space(i,j);
} init_obs()      /* place the obstacles in line on the top of the screen */
{
        register short i;

for (i=0; i<NUMOBS; i++) {
                obs_pos[i].x = 15;
                obs_pos[i].y = 15 + 24*i;
        }
} init_transitions()
{
        init_xts();
        init_yts();
        init_lus();
        init_rus();
} init_lus()  /* initializes array lus[][] */
{
        register short i,j;

for (i=0; i<XSIZE; i++) {
                for (j=0; j<YSIZE; j++) {
                        lus[i][j] = DIAGONAL;
                }
```

```
init.c  Tue Aug 11 14:15:11 1987                    Page:2

} init_rus()  /* initializes array rus[][] */
{
    register short i,j;

for (i=0; i<XSIZE; i++) {
        for (j=0; j<YSIZE; j++) {
            rus[i][j] = DIAGONAL;
        }
    }
} init_xts()  /* initializes array xts[][] */
{
    register short i,j;

for (i=0; i<XSIZE; i++) {
        for (j=0; j<YSIZE; j++) {
            xts[i][j] = UNITSTEPX;
        }
    }
} init_yts()  /* initializes array yts[][] */
{
    register short i,j;

for (i=0; i<XSIZE; i++) {
        for (j=0; j<YSIZE; j++) {
            yts[i][j] = UNITSTEPY;
        }
    }
} init_con()  /* initializes array con[][] */
{
    register short i,j;

for (i=0; i<XSIZE; i++) {
        for (j=0; j<YSIZE; j++) {
            con[i][j] = NOCONSTRAINT;
        }
    }
}

/*************************  LOOK HERE!   ||| ******************************/
/****************************************  vvv ******************************/
make_con_and_xts_and_yts_agree()  /* only binary now */
{
    register short i,j;

for (i=0; i<XSIZE; i++)
        for (j=0; j<YSIZE; j++)
            if (configspace[i][j].cost_to_goal == INFINITY) {
                xts[i][j]   = INFINITY;
                xts[i+1][j] = INFINITY;
```

```
init.c    Tue Aug 11 14:15:11 1987                         Page:3 ytsl[i][j]     = INFINITY;
                                ytsl[i][j+1]   = INFINITY;

} init_pnt()  /* Initializes array pnt[][] */
{
    register short i,j;

for (i=0; i<XSIZE; i++)
        for (j=0; j<YSIZE; j++)
            configspace[i][j].vector = 1P;   /* Initial pointer */
} init_goa()  /* Initializes array goa[][] */
{
    register short i,j;

for (i=0; i<XSIZE; i++)
        for (j=0; j<YSIZE; j++)
            goa[i][j] = NOGOAL;              /* Initial pointer */
    init_goals_in_task_space();
} init_lma()  /* Initializes array lma[][] */
{
    register short i,j;

for (i=0; i<XSIZE; i++)
        for (j=0; j<YSIZE; j++)
            if (goa[i][j] == GOAL) lma[i][j] = GOAL;
            else                   lma[i][j] = INFINITY;
} init_colors()
{
/*
    cms_rgbsetup(red1,green1,blue1);
    pw_setcmsname(canvas2_pw,"rgb2");
    pw_putcolormap(canvas2_pw,0,CMS_RGBSIZE,red1,green1,blue1);
*/
    cms_rgbsetup(red,green,blue);
    pw_setcmsname(canvas1_pw,"rgb1");
    pw_putcolormap(canvas1_pw,0,CMS_RGBSIZE,red,green,blue);
} init_metrics()
{
    int i;

/* init task_straight_metric */
    /* this is in fact only correct if XSIZE == YSIZE */
    /* since onyl then is one allowed to use the same celltoangle */
    if (XSIZE == YSIZE) {
        for (i=0; i<XSIZE; i++) {
```

```
init.c Tue Aug 11 14:15:11 1987                Page:4 dl1_task_straight[i] =
      ( sqrt(2. + 2. * cos( celltoangle_x(i))));
    dl1_task_straight[i] =
      ( sqrt(2. - 2. * cos( celltoangle_x(i))));
    dl2_task_straight[i] =
      ( sqrt(5. + 4. * cos( celltoangle_x(i))));
    dl2_task_straight[i] =
      ( sqrt(5. - 4. * cos( celltoangle_x(i))));

}

}

}
```

A-46

```
interpol.c        Tue Aug 11 14:15:11 1987                    Page:1

/* subrs to define obstacles and perform obstacle interpolation */
/* uses table look-ups and integer arithmetic */
#include "defines.h"
include "externs.h"
#include <stdio.h>

/* wrap-around constant for encoders */
#define WRAP 32768
#define BIT1ON 0x01;       /* useful mask */

/* fnc to define obstacle data */
/**************************************************************/
def_obstacles()
{
  int k,i,j;

/* define a set of obstacle codes, 0 through 30 */
  bitmask[0]=BIT1ON;
  for (i=0;i<NUMOBS;i++) bitmask[i+1]=bitmask[i]<<1;

/* define an obstacle boundary */
  /* first index==> obstacle radius, nrad */
  /* second index==> theta1 (=0), theta2 (=1); third index = point# */
  /* obstacle number 0 ==> radius = 8 cm = min allowed radius */
  /* obstacle number 12 ==> radius = 54 cm = max reach of link2 */

/* obstacle radius = 8cm */
  link2_front[0][0][0]= -4800;
  link2_front[0][0][1]= -9800;
  link2_front[0][0][2]= -9800;
  link2_front[0][0][3]= -9000;
  link2_front[0][0][4]= -4800;
  link2_front[0][0][5]= -4800;
  link2_front[0][1][0]= 11300;
  link2_front[0][1][1]= 6000;
  link2_front[0][1][2]= 5000;
  link2_front[0][1][3]= 5000;
  link2_front[0][1][4]= 8800;
  link2_front[0][1][5]= -11300;

/* obstacle radius = 10cm */
  link2_front[1][0][0]= -3300;
  link2_front[1][0][1]= -9300;
  link2_front[1][0][2]= -9300;
  link2_front[1][0][3]= -8300;
  link2_front[1][0][4]= -3600;
  link2_front[1][0][5]= -3600;
  link2_front[1][1][0]= 12500;
  link2_front[1][1][1]= 6000;
  link2_front[1][1][2]= 5000;
  link2_front[1][1][3]= 5000;
  link2_front[1][1][4]= 9500;
  link2_front[1][1][5]= -12500;

/* obstacle radius = 14 cm */
```

```
interpol.c                Tue Aug 11 14:35:11 1987                Page:2 link2_front[2][0][0]= -2400;
link2_front[2][0][1]= -8000;
link2_front[2][0][2]= -8000;
link2_front[2][0][3]= -7000;
link2_front[2][0][4]= -2400;
link2_front[2][0][5]= -2400;
link2_front[2][1][0]= -13000;
link2_front[2][1][1]= 6000;
link2_front[2][1][2]= 5300;
link2_front[2][1][3]= 5300;
link2_front[2][1][4]= 9500;
link2_front[2][1][5]= -13000;

/* obstacle radius = 18cm */
link2_front[3][0][0]= -1800;
link2_front[3][0][1]= -7500;
link2_front[3][0][2]= -7500;
link2_front[3][0][3]= -6500;
link2_front[3][0][4]= -1800;
link2_front[3][0][5]= -1800;
link2_front[3][1][0]= -13000;
link2_front[3][1][1]= 6000;
link2_front[3][1][2]= 5100;
link2_front[3][1][3]= 5100;
link2_front[3][1][4]= 8600;
link2_front[3][1][5]= -13000;

/* obstacle radius = 22cm */
link2_front[4][0][0]= -1400;
link2_front[4][0][1]= -6800;
link2_front[4][0][2]= -6800;
link2_front[4][0][3]= -6000;
link2_front[4][0][4]= -1400;
link2_front[4][0][5]= -1400;
link2_front[4][1][0]= 12300;
link2_front[4][1][1]= 5800;
link2_front[4][1][2]= 4800;
link2_front[4][1][3]= 4800;
link2_front[4][1][4]= 7000;
link2_front[4][1][5]= -12300;

/* obstacle radius = 26cm */
link2_front[5][0][0]= -1300;
link2_front[5][0][1]= -6200;
link2_front[5][0][2]= -6200;
link2_front[5][0][3]= -3000;
link2_front[5][0][4]= -1300;
link2_front[5][0][5]= -1300;
link2_front[5][1][0]= 9900;
link2_front[5][1][1]= 5600;
link2_front[5][1][2]= 4300;
link2_front[5][1][3]= 5000;
link2_front[5][1][4]= 3600;
link2_front[5][1][5]= -9900;

/* obstacle radius = 30cm */
```

```
interpol.c        Tue Aug 11 14:15:11 1987        Page:3 link2_front[6][0][0]= -2300;
link2_front[6][0][1]= -5600;
link2_front[6][0][2]= -5600;
link2_front[6][0][3]= -3000;
link2_front[6][0][4]= -1300;
link2_front[6][0][5]=   400;
link2_front[6][1][0]=  5700;
link2_front[6][1][1]=  5700;
link2_front[6][1][2]=  4000;
link2_front[6][1][3]=  4000;
link2_front[6][1][4]=  2000;
link2_front[6][1][5]= -6700;

/* obstacle radius = 34cm */
link2_front[7][0][0]= -2300;
link2_front[7][0][1]= -5100;
link2_front[7][0][2]= -5100;
link2_front[7][0][3]= -2800;
link2_front[7][0][4]= -1800;
link2_front[7][0][5]=  1000;
link2_front[7][1][0]=  5400;
link2_front[7][1][1]=  5000;
link2_front[7][1][2]=  3600;
link2_front[7][1][3]=  3100;
link2_front[7][1][4]=  2200;
link2_front[7][1][5]= -4500;

/* obstacle radius = 38cm */
link2_front[8][0][0]= -2600;
link2_front[8][0][1]= -4400;
link2_front[8][0][2]= -4400;
link2_front[8][0][3]= -2300;
link2_front[8][0][4]= -1400;
link2_front[8][0][5]=   700;
link2_front[8][1][0]=  4600;
link2_front[8][1][1]=  4600;
link2_front[8][1][2]=  3200;
link2_front[8][1][3]=  2200;
link2_front[8][1][4]=  1000;
link2_front[8][1][5]= -3000;

/* obstacle radius = 42cm */
link2_front[9][0][0]= -2800;
link2_front[9][0][1]= -3800;
link2_front[9][0][2]= -3800;
link2_front[9][0][3]= -2000;
link2_front[9][0][4]= -1000;
link2_front[9][0][5]=   800;
link2_front[9][1][0]=  3900;
link2_front[9][1][1]=  3800;
link2_front[9][1][2]=  2700;
link2_front[9][1][3]=  1300;
link2_front[9][1][4]=   200;
link2_front[9][1][5]= -2400;

/* obstacle radius = 46cm */
```

```
interpol.c       Tue Aug 11 14:15:11 1987                                                     Page:4 link2_front[10][0][0]= -2300;
link2_front[10][0][1]= -3000;
link2_front[10][0][2]= -3000;
link2_front[10][0][3]= -1500;
link2_front[10][0][4]= -900;
link2_front[10][0][5]= 1100;
link2_front[10][1][0]= 3000;
link2_front[10][1][1]= 3000;
link2_front[10][1][2]= 2000;
link2_front[10][1][3]= 700;
link2_front[10][1][4]= 0;
link2_front[10][1][5]= -2300;

/* obstacle radius = 50cm */
link2_front[11][0][0]= -1500;
link2_front[11][0][1]= -2200;
link2_front[11][0][2]= -2200;
link2_front[11][0][3]= -1900;
link2_front[11][0][4]= -800;
link2_front[11][0][5]= 700;
link2_front[11][1][0]= 2100;
link2_front[11][1][1]= 2100;
link2_front[11][1][2]= 1700;
link2_front[11][1][3]= 1000;
link2_front[11][1][4]= 0;
link2_front[11][1][5]= -1700;

/* obstacle radius = 52cm */
link2_front[12][0][0]= -1000;
link2_front[12][0][1]= -1400;
link2_front[12][0][2]= -1400;
link2_front[12][0][3]= -900;
link2_front[12][0][4]= -700;
link2_front[12][0][5]= 200;
link2_front[12][1][0]= 1400;
link2_front[12][1][1]= 1400;
link2_front[12][1][2]= 1000;
link2_front[12][1][3]= 200;
link2_front[12][1][4]= 0;
link2_front[12][1][5]= -800;

/* obstacle radius = 54cm */
link2_front[13][0][0]= -500;
link2_front[13][0][1]= -700;
link2_front[13][0][2]= -700;
link2_front[13][0][3]= -500;
link2_front[13][0][4]= 0;
link2_front[13][1][0]= 200;
link2_front[13][1][1]= 700;
link2_front[13][1][2]= 700;
link2_front[13][1][3]= 300;
link2_front[13][1][4]= -500;
link2_front[13][1][5]= -700;

/* use odd-symmetry to fill in rest of matrices */
```

```
interpol.c         Tue Aug 11 14:15:11 1997              Page:5 for (k=0;k<14;k++) {
    for (i=0;i<2;i++) {
        for (j=0;j<7;j++) {
            link2_front[k][i][j+6]= -link2_front[k][i][j];
        }
    }
}

/* stuff "del" tables with d01, d02 */
for (k=0;k<14;k++) {
    for (i=0;i<2;i++) {
        del_l2c[k][i][0]=link2_front[k][i][0];
        for (j=0;j<12;j++) {
            del_l2f[k][i][j+1]= link2_front[k][i][j+1]-link2_front[k][i][j];
        }
    }
}

/* done with defining link-2, front obstacle boundaries; */
/* also need to define link-2 rear and link 1 obstacle boundaries */

/* obstacle radius = 12cm + epsilon    */
link2_rear[0][0][0]=  -2800;
link2_rear[0][0][1]=  -3000;
link2_rear[0][0][2]=  -3000;
link2_rear[0][0][3]=  -2900;
link2_rear[0][0][4]=  -2800;
link2_rear[0][0][5]=  -2800;
link2_rear[0][1][0]=  12200  +16384;
link2_rear[0][1][1]=  11800  +16384;
link2_rear[0][1][2]=  10800  +16384;
link2_rear[0][1][3]=  10700  +16384;
link2_rear[0][1][4]=  10600  +16384;
link2_rear[0][1][5]=  -12200 +16384;

/* obstacle radius = 14cm  */
link2_rear[1][0][0]=  -2500;
link2_rear[1][0][1]=  -3400;
link2_rear[1][0][2]=  -3400;
link2_rear[1][0][3]=  -3000;
link2_rear[1][0][4]=  -2500;
link2_rear[1][0][5]=  -2500;
link2_rear[1][1][0]=  12800  +16384;
link2_rear[1][1][1]=  11000  +16384;
link2_rear[1][1][2]=   9500  +16384;
link2_rear[1][1][3]=   9500  +16384;
link2_rear[1][1][4]=  10000  +16384;
link2_rear[1][1][5]= -12800  +16384;

/* obstacle radius = 18cm  */
link2_rear[2][0][0]=  -1800;
link2_rear[2][0][1]=  -3600;
link2_rear[2][0][2]=  -3600;
link2_rear[2][0][3]=  -2800;
link2_rear[2][0][4]=  -1800;
link2_rear[2][0][5]=  -1800;
link2_rear[2][1][0]=  12800  +16384;
```

```
interpol.c                    Tue Aug 11 14:15:11 1987                    Page:6 link2_rear[2][1][1]=  9800    +16384;
link2_rear[2][1][2]=  7900    +16384;
link2_rear[2][1][3]=  7900    +16384;
link2_rear[2][1][4]=  9000    +16384;
link2_rear[2][1][5]=-12800    +16384;

/* obstacle radius = 22cm */
link2_rear[3][0][0]= -1600;
link2_rear[3][0][1]= -3500;
link2_rear[3][0][2]= -3500;
link2_rear[3][0][3]= -2500;
link2_rear[3][0][4]= -1600;
link2_rear[3][0][5]= -1600;
link2_rear[3][1][0]= 12800    +16384;
link2_rear[3][1][1]=  8500    +16384;
link2_rear[3][1][2]=  6300    +16384;
link2_rear[3][1][3]=  6300    +16384;
link2_rear[3][1][4]=  6100    +16384;
link2_rear[3][1][5]=-12800    +16384;

/* obstacle radius = 26cm */
link2_rear[4][0][0]= -1300;
link2_rear[4][0][1]= -3300;
link2_rear[4][0][2]= -3300;
link2_rear[4][0][3]= -2300;
link2_rear[4][0][4]= -1300;
link2_rear[4][0][5]= -1300;
link2_rear[4][1][0]= 10000    +16384;
link2_rear[4][1][1]=  7700    +16384;
link2_rear[4][1][2]=  5000    +16384;
link2_rear[4][1][3]=  4700    +16384;
link2_rear[4][1][4]=  3300    +16384;
link2_rear[4][1][5]=-10000    +16384;

/* obstacle radius = 30cm */
link2_rear[5][0][0]= -1600;
link2_rear[5][0][1]= -2800;
link2_rear[5][0][2]= -2800;
link2_rear[5][0][3]= -2000;
link2_rear[5][0][4]= -1000;
link2_rear[5][0][5]=   500;
link2_rear[5][1][0]=  7000    +16384;
link2_rear[5][1][1]=  6300    +16384;
link2_rear[5][1][2]=  4200    +16384;
link2_rear[5][1][3]=  3000    +16384;
link2_rear[5][1][4]=     0   +16384;
link2_rear[5][1][5]= -7000    +16384;

/* obstacle radius = 34cm */
link2_rear[6][0][0]= -1800;
link2_rear[6][0][1]= -2300;
link2_rear[6][0][2]= -2300;
link2_rear[6][0][3]= -1800;
link2_rear[6][0][4]= -1000;
link2_rear[6][0][5]=     0;
link2_rear[6][1][0]=  5000    +16384;
```

```
interpol.c        Tue Aug 11 14:15:11 1987                     Page:7 link2_rear[6][1][1]= 4800  +16384;
link2_rear[6][1][2]= 3100  +16384;
link2_rear[6][1][3]= 1800  +16384;
link2_rear[6][1][4]= 500   +16384;
link2_rear[6][1][5]= -3200 +16384;

/* obstacle radius = 38cm */
link2_rear[7][0][0]= -900;
link2_rear[7][0][1]= -1500;
link2_rear[7][0][2]= -1500;
link2_rear[7][0][3]= -1000;
link2_rear[7][0][4]= -300;
link2_rear[7][0][5]= 200;
link2_rear[7][1][0]= 3200  +16384;
link2_rear[7][1][1]= 3200  +16384;
link2_rear[7][1][2]= 1600  +16384;
link2_rear[7][1][3]= 400   +16384;
link2_rear[7][1][4]= -1000 +16384;
link2_rear[7][1][5]= -2000 +16384;

/* obstacle radius = 40cm */
link2_rear[8][0][0]= -300;
link2_rear[8][0][1]= -800;
link2_rear[8][0][2]= -800;
link2_rear[8][0][3]= -600;
link2_rear[8][0][4]= -300;
link2_rear[8][0][5]= 0;
link2_rear[8][1][0]= 1800  +16384;
link2_rear[8][1][1]= 1800  +16384;
link2_rear[8][1][2]= 600   +16384;
link2_rear[8][1][3]= 0     +16384;
link2_rear[8][1][4]= -600  +16384;
link2_rear[8][1][5]= -1100 +16384;

/* obstacle radius = 40.5cm - epsilon */
link2_rear[9][0][0]= -300;
link2_rear[9][0][1]= -700;
link2_rear[9][0][2]= -700;
link2_rear[9][0][3]= -400;
link2_rear[9][0][4]= -200;
link2_rear[9][0][5]= 0;
link2_rear[9][1][0]= 1400  +16384;
link2_rear[9][1][1]= 1400  +16384;
link2_rear[9][1][2]= 300   +16384;
link2_rear[9][1][3]= -200  +16384;
link2_rear[9][1][4]= -600  +16384;
link2_rear[9][1][5]= -1100 +16384;

/* use odd-symmetry to fill in rest of matrices */
for (k=0;k<10;k++) {
    for (j=0;j<7;j++) {
        link2_rear[k][0][j+6]= -link2_rear[k][0][j];
        link2_rear[k][1][j+6]= -(link2_rear[k][1][j]-16384)+16384;
    }
}
``` interpol.c                Tue Aug 11 14:15:11 1987                Page:8

```
/**** stuff "del" tables with d01, d02 */
for (k=0;k<10;k++) {
    for (i=0;i<12;i++) {
        del_l2r[k][i][0]=link2_rear[k][i][0];
        for (j=0;j<12;j++)
            del_l2r[k][i][j+1]=
                link2_rear[k][i][j+1]-link2_rear[k][i][j];
    }
}

/* definitions for link1: radial interpolation done in */
/* "l1_interp_obs()" */
link1_obs[15]=1100;
link1_obs[14]=1180;
link1_obs[13]=1300;
link1_obs[12]=1330;
link1_obs[11]=1400;
link1_obs[10]=1560;
link1_obs[9]=1800;
link1_obs[8]=1930;
link1_obs[7]=2450;
link1_obs[6]=2570;
link1_obs[5]=3600;
link1_obs[4]=4800;
link1_obs[3]=11070;

return;
}

/* end def_obstacles */

/* link2, front */
/* function to interpolate boundary points of obstacles */
/* accepts lookup table indices and numbered corner pt; */
/* returns interpolated corner pt as obs_ang1 and obs_ang2 */
/* in encoder units */
/* if obs too close to shoulder, returns -1 */
/* if obs beyond link2 reach, returns 0 */
/* if valid obs within link2 reach, returns 1*/ int l2f_interp_obs(icorner)
int icorner;
{
    int ncase;

/*look-up radius is 8* cm */  /* use radius to determine case number */
    ncase= rad8>>4;
    switch(ncase) {
        /* here if radius greater than reach */
        default: return(0);
        /* first 4 cases if obs within 8cm of shoulder==> too close */
        case 0: case 1: case 2: case 3: return(0);
        case 4:                /* between 8 and 10 cm */
            nobs=0;
            /* integer interpolation factor is 32x float ratio */
            i1= (rad8-64)<<1;
```

```
interpol.c       Tue Aug 11 14:15:11 1987                    Page: 9 goto interp;
    case 5: case 6:                    /* between 10 and 14 cm */
        nobs=1;
        l1= (rad8-80);
        goto interp;
    case 7: case 8:                    /* between 14 and 18 cm */
        nobs=2;
        l1= (rad8-112);
        goto interp;
    case 9: case 10:                   /* between 18 and 22 cm */
        nobs=3;
        l1= (rad8-144);
        goto interp;
    case 11: case 12:                  /* between 22 and 26 cm */
        nobs=4;
        l1= (rad8-176);
        goto interp;
    case 13: case 14:                  /* between 26 and 30 cm */
        nobs=5;
        l1= (rad8-208);
        goto interp;
    case 15: case 16:                  /* between 30 and 34 cm */
        nobs=6;
        l1= (rad8-240);
        goto interp;
    case 17: case 18:                  /* between 34 and 38 cm */
        nobs=7;
        l1= (rad8-272);
        goto interp;
    case 19: case 20:                  /* between 38 and 42 cm */
        nobs=8;
        l1= (rad8-304);
        goto interp;
    case 21: case 22:                  /* between 42 and 46 cm */
        nobs=9;
        l1= (rad8-336);
        goto interp;
    case 23: case 24:                  /* between 46 and 50 cm */
        nobs=10;
        l1= (rad8-368);
        goto interp;
    case 25:                           /* between 50 and 52 cm */
        nobs=11;
        l1= (rad8-400);
        goto interp;
    case 26:                           /* between 52 and 54 cm */
        nobs=12;
        l1= (rad8-416);
        goto interp;
    /* done with cases; do interpolation */
    }

/* have assigned integer iterpolation factor, l1 */
    /* want to interpolate point "icorner" */ interp:
```

Interpol.c    Tue Aug 11 14:15:11 1987    Page:10

```
        if((icorner<0)||(icorner>12)) return(0);
        obs_ang1= del_12f[nobs][0][icorner]+
            (((l1*(del_12f[nobs+1][0][icorner]-del_12f[nobs][0][icorner]))
            >>5);
        obs_ang2 = del_12f[nobs][1][icorner]+
            (((l1*(del_12f[nobs+1][1][icorner]-del_12f[nobs][1][icorner]))
            >>5);

/* done w/ corner pt interpolation; return 1 to signal all O.K. */
        return(1);
}

/******************************************************************/
/* link2, rear*/
/* function to interpolate boundary points of obstacles */
/* accepts lookup table indices and numbered corner pt; */
/* returns interpolated corner pt as obs_ang1 and obs_ang2 */
/*    in encoder units */
/* if obs out of reach of link2 rear, returns 0 */
/* if valid obs within link2 rear reach, returns 1*/ int l2r_interp_obs(icorner)
int icorner;
{
    int ncase;

/*look-up radius, rad8, is 8* cm */
/* use radius to determine case number */
    ncase= rad8>>4;
    switch(ncase)
    {
        /* here if obs out of reach */
        default: return(0);
        /* between 12 and 14 cm */
        case 6:
            nobs=0;
            /* integer interpolation factor is 32x float ratio */
            l1= (rad8-96)<<1;
            goto interp;
        /* between 14 and 18 cm */
        case 7: case 8:
            nobs=1;
            l1= (rad8-112);
            goto interp;
        /* between 18 and 22 cm */
        case 9: case 10:
            nobs=2;
            l1= (rad8-144);
            goto interp;
        /* between 22 and 26 cm */
        case 11: case 12:
            nobs=3;
            l1= (rad8-176);
            goto interp;
        /* between 26 and 30 cm */
        case 13: case 14:
```

```
interpol.c     Tue Aug 11 14:15:11 1987                    Page: 11 nobs=4;
        l1= (rad8-208);
        goto interp;
/* between 30 and 34 cm */
case 15: case 16:
        nobs=5;
        l1= (rad8-240);
        goto interp;
/* between 34 and 38 cm */
case 17: case 18:
        nobs=6;
        l1= (rad8-272);
        goto interp;
/* between 38 and 40 cm */
case 19:
        nobs=7;
        l1= (rad8-304)<<1;
        goto interp;
/* between 40 and 42 cm */
case 20:
        /* check if r>40.5 ==> out of reach */
        if (rad8>324) return(0);
        else { nobs=8;
               l1= (rad8-320)<<3;
               goto interp;}
/* end of cases */
}

/* have assigned integer iterpolation factor, l1 */
/* want to interpolate point "icorner" */
interp:
        if((icorner(0)||(icorner>12)) return(0);
        obs_ang1= del_l2r[nobs][0][icorner]+
                (((l1*(del_l2r[nobs+1][0][icorner]-del_l2r[nobs][0][icorner]))>>5);
        obs_ang2 = del_l2r[nobs][1][icorner]+
                (((l1*(del_l2r[nobs+1][1][icorner]-del_l2r[nobs][1][icorner]))>>5);

/* done w/ corner pt interpolation; return 1 to signal all O.K. */
        return(1);
}

/*****************************************************************/
/* function to interpolate link1 obstacles */
/* accepts lookup table indices and returns interpolated
   obs_l1_plus and obs_l1_minus (in encoder units) for
   link1 cw rot, ccw rot, respectively */ int l1_interp_obs()
{
        int index;
        int interp_factor;
        int ivar;

/*look-up radius, rad0, is 0* cm */

/* check if out of elbow reach, if out of reach, return 0 */
``` interpol.c    Tue Aug 11 14:15:11 1987                Page: 12

```
        If((rad8>242) return(0);

/* check if too close to shoulder */
        If((rad8<8*CENTIMETER) {
                /* within reach of rear of link1; stall at +/-180 deg */
                /* don't include angleobs offset */
                obs_l1_plus=(-8192+WRAP)%WRAP;
                obs_l1_minus=(8192+WRAP)%WRAP;
                return(1);
        }

/* here if obstacle between 7.8cm and 31cm */
/* compute obstacle index number from radius */
/* 29cm is 14th index */
        index= (rad8-8)>>4;
        ivar = (index<<4) +8;
        interp_factor=rad8-ivar;

/* interpolation factor is 16 times larger than float value */
        ivar= ((link1_obs[index+1]-link1_obs[index])*interp_factor)>>4;
        ivar+= link1_obs[index];
        obs_l1_plus= (-ivar+WRAP)%WRAP;
        obs_l1_minus= ivar;

return(1);

}
``` metric.c        Tue Aug 11 14:15:11 1987        Page:1

```c
#include <math.h>
#include "defines.h"
include "externs.h"

#define RELMASS 5.

float effort(direction,x,y)
        /* metric for dynamics under constant energy for wyatt arm*/
{
        switch(direction) {
        case 0:
        case 1:         return(RELMASS);

case 2:
        case 3:         return(1.);

case 4:
        case 5:
        case 6:
        case 7:         return(((float)(sqrt(1.+RELMASS*RELMASS))));

case 8:
        case 9:
        case 14:
        case 15:        return(((float)(sqrt(4.*RELMASS*RELMASS+1.))));

case 10:
        case 11:
        case 12:
        case 13:        return(((float)(sqrt(RELMASS*RELMASS+4.))));

}
} float task_straight(direction,x,y)
        /* metric for straight movement in task space by wyatt arm*/
int direction, x, y;
{
        if (direction < 4) {
                return(1.0);
        } else {
                switch(direction) {
                case 4:
                case 5:         return(((float)d11_task_straight[abs(x-y)]);

case 6:
                case 7:         return(((float)d11_task_straight[abs(x-y)]);

case 8:
                case 9:
                case 10:
                case 11:        return(((float)d12_task_straight[abs(x-y)]);

case 12:
                case 13:
                case 14:
```

```
metric.c        Tue Aug 11 14:15:11 1987          Page:2 case 15:
                return(((float)di2_task_straight(abs(x-y)));
            }
} float config_straight(direction,x,y)
    /* metric for straight motion in config space */
short direction;
{
    if (direction < 4)
        return (1.);
    else if (direction < 8)
        return (sqrt(2.));
    else return(sqrt(5.));
} double celltoangle_x(x)
int x;
{
    return( (double)(x)/(double)(XSIZE)*PI2);
} double celltoangle_y(y)
int y;
{
    return( (double)(y)/(double)(YSIZE)*PI2);
}
``` path.c    Tue Aug 11 14:15:11 1987                                                                Page:1

```
#include "defines.h"
include "externs.h"

short ip,jp,ipp,jpp,pointer,num;
/******************************************************************************
        path.c
        path following
                created 198609xx Leo Dorst
                mod     19861114 Leo Dorst
******************************************************************************/ int Bx(x)
INT16 x;
{
        if (x < 0) x += XSIZE;
        if (x >= XSIZE) x -= XSIZE;
        return(x);
} int By(y)
INT16 y;
{
        if (y < 0) y += YSIZE;
        if (y >= YSIZE) y -= YSIZE;
        return(y);
} find_and_draw_shortest_path()
{
        erase_arms();
        num=0;
        ip = istart;
        ipp = istart;
        jp = jstart;
        jpp = jstart;

/* this is really patchwork... */
        switch (mode) {
        case MOVEMODE:
                plot_point1(ip,jp);             /* remove POINTERPATCH */
                plot_path_point(ip,jp);         /* substitute path-PATCH */
                show_arm(istart,jstart,PIX_SRC^PIX_DST,BLACK));
                break;
        case PATHMODE:
                show_arm(istart,jstart,PIX_SRC^PIX_DST,BLACK);
                break;
        case NOARM:
                break;
        } if (((pointer = configspace[ip][jp].vector) == OBSTACLE)
                && (mode != NOARM)) {
                show_message();
                return;
        }
}
```

```
path.c    Tue Aug 11 14:15:11 1987                Page:2 plot_path_point(ip,jp);
if ( (pointer == IP) && (mode != NOARM) ) {
    show_message();
    switch(mode) {
    case MOVEMODE:
    case PATHMODE:
            arm_shown = TRUE;
            i_shown_arm = ip;
            j_shown_arm = jp;
            break;
    default:
            arm_shown = FALSE;
    }
    return;
}
if (mode != NOARM) delay(10);
while ((pointer = configspace([ip][jp].vector) != IP ) {
    take_step();
}
show_goal_point(ip,jp,PIX_SRC|PIX_COLOR(MAGENTAC));
if (mode == MOVEMODE) {
    arm_shown = TRUE;
    i_shown_arm = ip;
    j_shown_arm = jp;
} else {
    arm_shown = FALSE;
}
if (robot == SEND) {
    store_path_point();
    pathlength = num;
}
if (mode != NOARM) path_drawn = TRUE; else path_drawn = FALSE;
} take_step()
{
short k;
short iinc,jinc;
int ipnew, jpnew;

iinc = jinc = 0;
for(k=0; k<DIRECTION_COUNT; k++) {
    if (pointer & ( 0x1 << k)) {
        iinc += x_increment[k];
        jinc += y_increment[k];
    }
}
ipnew = (short) Bx(ip+iinc);
jpnew = (short) By(jp+jinc);
if ((iinc ==0 && jinc ==0)||
    (con[ipnew][jpnew] != NOCONSTRAINT)) { /* take first step */
        /* con-test is dirty, might lead to jiggles */
    for(k=0; k<DIRECTION_COUNT; k++) {
        if (pointer & ( 0x1 << k)) {
            ip = (short)Bx(ip+x_increment[k]);
            jp = (short)By(jp+y_increment[k]);
```

```
path.c  Tue Aug 11 14:15:11 1987                    Page:3 do_step();
                    return;
                }
        } else { /* take total stop */
            ip = ipnew;
            jp = jpnew;
            do_step();
            return;
        }
    }
/* the old-fashioned way
    for(k=0; k<DIRECTION_COUNT; k++) {
        if (pointer & ( 0x1 << k)) {
            ip = (short)Bx(ip+x_increment[k]);
            jp = (short)By(jp+y_increment[k]);
            do_step();
            return;
        }
    }
*/
} delay(times)
short times;
{
    int i,j;
    i = speed;
    while (i++ < 100) for (j=0; j<(times*500); j++);
} store_path_point()
{
    if (num > PATHLENGTH) {
        printf("path longer than can be stored\n");
        return;
    }
    path[2*num  ] = cellangle_x(ip);
    path[2*num+1] = cellangle_y(jp);
} do_step()
{
    int op;
    if (robot == SEND) {
        store_path_point();
        num++;
    }
    switch(mode) {
    case MOVEMODE:
        if (speed != 100) delay(1);
        show_arm(ipp,jpp,PIX_SRC^PIX_DST,BLACK); /* erase previous */
        ipp = ip;
        jpp = jp;
        show_arm(ipp,jpp,PIX_SRC^PIX_DST,BLACK);
        plot_path_point(ip,jp);
```

A-63

```
path.c   Tue Aug 11 14:15:11 1987                                    Page:4 break;
     case PATHMODE:
          if (speed != 100) delay(1);
          show_arm(ip,jp,PIX_SRC,BLACK);
          plot_path_point(ip,jp);
          break;
     case NOARM:
          plot_path_point(ip,jp);
          break;
     }
} take_step_new()  /* taking into account double steps */
{
     short k;
     int iinc,jinc;

iinc =0;
     jinc =0;
     for(k=0; k<DIRECTION_COUNT; k++){
          if (pointer & ( 0x1 << k)){
               iinc += x_increment[k];
               jinc += y_increment[k];
          }
     } ip = (short)Bx(ip+iinc);
     jp = (short)By(jp+jinc);

/*
     if (iinc < 0) aiinc = -iinc; else aiinc = iinc;
     if (jinc < 0) ajinc = -jinc; else ajinc = jinc;
     if ( !(aiinc == 2 && ajinc == 1) && !(aiinc == 1 && ajinc == 2) ) {
          for(k=0; k<DIRECTION_COUNT; k++){
               if (pointer & ( 0x1 << k)) {
                    ip = (short)Bx(ip+x_increment[k]);
                    jp = (short)By(jp+y_increment[k]);
                    do_step();
                    goto step_taken;
               }
          }
step_taken;
     } else {
          if (aiinc == 2) {
               ip = (short)Bx(ip+(aiinc/iinc));
               jp = (short)By(jp+jinc);
               do_step();
               ip = (short)Bx(ip+(aiinc/iinc));
               do_step();
          } else {
               ip = (short)Bx(ip+iinc);
               jp = (short)By(jp+(ajinc/jinc));
               do_step();
               jp = (short)By(jp+(ajinc/jinc));
               do_step();
          }
     }
*/
}
```

```
*/
}
```

```
print.c Tue Aug 11 14:15:11 1987                                   Page:1 include "defines.h"
include "externs.h"
/***********************************************************************/
/*      print.c                                                        */
/*      print arrays                                                   */
/*              created 198609xx Leo Dorst                             */
/*              mod     19861114 Leo Dorst                             */
/***********************************************************************/
print_xts()     /* show the xts array */
{
        register short i,j;
        PIXEL h;

printf("\nxts\n");
        for ( j=0; j<YSIZE; j++) {
                for ( i=0; i<XSIZE-1; i++) {
                        if ((h=xts[i][j]) == INFINITY) printf("* ");
                        else printf("%d ",h);
                }
                printf("\n");
        }
} print_yts()     /* show the yts array */
{
        register short i,j;
        PIXEL v;

printf("\nyts\n");
        for ( j=0; j<YSIZE+1; j++) {
                for ( i=0; i<XSIZE; i++) {
                        if ((v=yts[i][j]) == INFINITY) printf("* ");
                        else printf("%d ",v);
                }
                printf("\n");
        }
} print_pnt()     /* show the pnt array */
/* not valid anymore because of multivalued pointers */
{
        register short i,j;

printf("\npnt\n");
        for ( j=0; j<YSIZE; j++) {
                for ( i=0; i<XSIZE; i++) {
                        printf("%0.4x ",configspace[i][j].vector);
                }
                printf("\n");
        }
} print_con()     /* show the con array */
{
        register short i,j;
        float co;
```

```
print.c Tue Aug 11 14:15:11 1987                Page:2 printf("\ncon\n");
    printf("    ");
    for ( i=0; i<XSIZE; i++)
        printf("%5d",i);
    printf("\n");
    for(i=0;i<40;i++)
        printf("--");
    printf("\n");

for ( j=0; j<YSIZE; j++) {
        printf("%2d ",j);
        for ( i=0; i<XSIZE; i++) {
            co=configspace[i][j].cost_to_goal;
            if ((int)co == (int)UNCOSTED) printf("  U  ");
            else if ((int)co == (int)INFINITY) printf(" INF ");
            else printf("%5.1f",co);
        }
        printf("\n");
    }
} print_ima()       /* show the ima array */
{
    register short i,j;
    PIXEL im;

printf("\nima\n");
    for ( j=0; j<YSIZE; j++) {
        for ( i=0; i<XSIZE; i++) {
            if ((im=ima[i][j]) == INFINITY) printf("* ");
            else printf("%d ",im);
        }
        printf("\n");
    }
} print_obs()
{
    int i;

for (i=0; i<NUMOBS; i++) {
        printf("obs_pos[%d] = (%d,%d) -> (%f,%f)\n",
            i,(obs_pos[i].x),(obs_pos[i].y));
    }
}
```

A-67

```
show.c   Tue Aug 11 14:15:12 1987                                    Page:1 include "defines.h"
include "externs.h"
/***************************************************************/
/*      show.c                                                   */
/*      sunshow arrays */
/*              created 198609xx Leo Dorst                       */
/*              mod     19861114 Leo Dorst                       */
/***************************************************************/ show_goal()       /* show goal points */ /* faster than individual calls
                     of 'show_goal_point' */
{
        register short  i,j;
        register int    x,y,inc;

inc = CELL_SIZE + CSTEP;
        y = PNT_OFFSET - inc;
        for ( j=0; j<YSIZE; j++) {
                y += inc;
                x = PNT_OFFSET - inc;
                for ( i=0; i<XSIZE; i++) {
                        x += inc;
                        if (goal[i][j] == GOAL) {
                                pw_rop(canvas1_pw,x,y, CELL_SIZE,CELL_SIZE,
                                        PIX_SRC, icon_prs[GOAL_ICON],0,0);
                        }
                }
        }
} show_start_point(op)
int op;
{
        plot_icon(istart,jstart,op,START_ICON);
} show_goal_point(i,j,op)
short i,j;
{
        register ii,jj;
        int fop;
        ii = CHARGIN + i*(CELL_SIZE + CSTEP) +1;
        jj = CHARGIN + j*(CELL_SIZE + CSTEP) +1;
        fop = (PIX_SRC | PIX_COLOR(GREENC));
        pw_rop(canvas1_pw,ii,jj,CELL_SIZE,CELL_SIZE,fop,icon_prs[GOAL_ICON],0,0);
} show_con()       /* show con array on sun */
{
        register short  i,j;
        register int    x,y,inc;

inc = CELL_SIZE + CSTEP;
        y = CHARGIN + CSTEP + 1 - inc;
        for ( j=0; j<YSIZE; j++) {
``` show.c   Tue Aug 11 14:15:12 1987                    Page:2

```c
        y += inc;
        x = CHARGIN + CSTEP + 1 - inc;
        for ( i=0; i<XSIZE; i++) {
            x += inc;
            if (con[i][j] != NOCONSTRAINT) {
                pw_replrop(canvas1_pw, x,y, CELL_SIZE,CELL_SIZE,
                    PIX_SRC | PIX_COLOR(BLACKC),patch_prs[BLACKP],0,0);
            }
        }
    }

/*
    for (i=0; i<255; i++)
    for(j=0; j<10;j++) {
    pw_put(canvas2_pw,i,j,(unsigned char)i);
    pw_put(canvas1_pw,i,j,(unsigned char)i);
    }
*/
} show_obs()
{
    register short i;
    for (i=0;i<NUMOBS;i++) {
        show_obs_icon(obs_pos[i].x,obs_pos[i].y,PIX_SRC|PIX_COLOR(BLACKC));
    }

/*
    for (i=0; i<255; i++)
    for(j=0; j<10;j++) {
    pw_put(canvas2_pw,i,j+10,(unsigned char)i);
    pw_put(canvas1_pw,i,j+10,(unsigned char)i);
    }
*/
} show_obs_icon(x,y,op)
short x,y;
int op;
{
    pw_rop(canvas2_pw, x-10,(CARTHEIGHT-y)-10,20,20, op,&standardobs,0,0);
} show_pnt()      /* show pnt array on sun */
{
    register short i,j,k;
    register short pointer;

for ( i=0; i<XSIZE; i++)
        for ( j=0; j<YSIZE; j++) {
            switch (pointer = configspace[i][j].vector) {
                case OBSTACLE:
                    plot_patch(i,j,PIX_SRC,BLACKP);
                    break;
                case IP:        /* unmodified, so GOAL or unreachable */
                    break;
                default:
```

```
show.c   Tue Aug 11 14:15:12 1987           Page:3 for(k=0; k<DIRECTION_COUNT; k++) {
                        if (pointer & ( 0x1 << k))
                            plot_arrow(i,j,PIX_SRC|PIX_DST,k);
                    }
                    break;
                }
            }
        }
    }
} plot_patch(i,j,op,type) /* plot icon of type at i,j using operation op */
short i,j,type;
int op;
{
    register ii,jj;
    ii = CHARGIN + i*(CELL_SIZE + CSTEP) +1;
    jj = CHARGIN + j*(CELL_SIZE + CSTEP) +1;
    pw_rop(canvas1_pw,ii,jj,CELL_SIZE,CELL_SIZE,op,patch_prs[type],0,0);
} plot_arrow(i,j,op,type)
short i,j,type;
int op;
{
    register ii,jj;
    ii = 1*(CELL_SIZE +CSTEP) + (CHARGIN + CELL_SIZE/2 ) +1;
    jj = j*(CELL_SIZE +CSTEP) + (CHARGIN + CELL_SIZE/2 ) +1;
#define GAP 3
    pw_vector(canvas1_pw,
        ii+x_increment[type]*GAP,
        jj+y_increment[type]*GAP,
        ii+x_increment[type]*CELL_SIZE,
        jj+y_increment[type]*CELL_SIZE,
        op,BLUEC);
} plot_icon(i,j,op,type) /* plot icon of type at i,j using operation op */
short i,j,type;
int op;
{
    register ii,jj;
    ii = CHARGIN + i*(CELL_SIZE + CSTEP) +1;
    jj = CHARGIN + j*(CELL_SIZE + CSTEP) +1;
    /*
    op = PIX_SRC|PIX_COLOR(GREENC);
    */
    pw_rop(canvas1_pw,ii,jj,CELL_SIZE,CELL_SIZE,op,icon_prs[type],0,0);
} border_draw1()
{
    pw_vector(canvas1_pw,
        CHARGIN,CHARGIN,CXSIZE-CHARGIN,CHARGIN,PIX_SRC |
        PIX_COLOR(BLACKC),1);
```

```
show.c   Tue Aug 11 14:15:12 1987                    Page:4 pw_vector(canvas1_pw,
                CMARGIN,CMARGIN,CXSIZE-CMARGIN,PIX_SRC |
                PIX_COLOR(BLACKC),1);
        pw_vector(canvas1_pw,
                CXSIZE-CMARGIN+1,CMARGIN,CXSIZE-CMARGIN+1,CYSIZE-CMARGIN+1,
                PIX_SRC | PIX_COLOR(BLACKC),1);
        pw_vector(canvas1_pw,
                CMARGIN,CYSIZE-CMARGIN+1,CXSIZE-CMARGIN+1,CYSIZE-CMARGIN+1,
                PIX_SRC | PIX_COLOR(BLACKC),1);
} plot_canvas2()
{
        pw_batch_on(canvas2_pw);
        init_colors();
        clear_canvas2();
        show_obs();
        plot_goals_in_task_space();
        pw_batch_off(canvas2_pw);
} plot_canvas1()
{
        pw_batch_on(canvas1_pw);
        init_colors();
        clear_canvas1();
        border_draw1();
/*
        if (flow) grid_paint1();
*/
        show_con();
        if (flow) show_pnt();
        show_goal();
        pw_batch_off(canvas1_pw);
} clear_canvas1()
{
        pw_rop(canvas1_pw,0,0,CXSIZE,CYSIZE,PIX_COLOR(WHITEC),NULL,0,0);
}
clear_canvas2()
{
        pw_rop(canvas2_pw,0,0,CARTWIDTH,CARTHEIGHT,PIX_COLOR(WHITEC),NULL,0,0);
} show_arm(i,j,op,color)
short   i,j,color;
int op;
{
        double  angle1,angle2;
        double  cos1,sin1,cos2,sin2;
        short   l10_x,l10_y,l11_x,l11_y,l12_x,l12_y,l13_x,l13_y;
        short   l20_x,l20_y,l21_x,l21_y,l22_x,l22_y,l23_x,l23_y;
        short   l24_x,l24_y,l25_x,l25_y;
        short   end1_x,end1_y,end2f_x,end2f_y,end2r_x,end2r_y;
        short   end2_x,end2_y;
```

```
show.c    Tue Aug 11 14:15:12 1987                            Page:5 int fop;
fop = (op | PIX_COLOR(color));

angle1 = -i*ANGLE1RES;  /* wyatt coordinates */
angle2 = -j*ANGLE2RES;  /* wyatt coordinates */ switch (redraw) {
case STICK_ARM:
    end1_x  = XBASE+(short)((double)(LENGTH)*cos(angle1)+0.5);
    end1_y  = YBASE+(short)((double)(LENGTH)*sin(angle1)+0.5);
    end2f_x = end1_x + (short)((double)(LENGTH2F)*cos(angle2)+0.5);
    end2f_y = end1_y + (short)((double)(LENGTH2F)*sin(angle2)+0.5);
    end2r_x = end1_x - (short)((double)(LENGTH2R)*cos(angle2)+0.5);
    end2r_y = end1_y - (short)((double)(LENGTH2R)*sin(angle2)+0.5);
    pw_batch_on(canvas2_pw);
    pw_vector(canvas2_pw, XBASE,YBASE,end1_x,end1_y,fop,BLACKC);
    pw_vector(canvas2_pw, end2f_x,end2f_y,end2r_x,end2r_y,fop,BLACKC);
    pw_batch_off(canvas2_pw);
    break;

case BODY_ARM:
    cos1 = cos(angle1);
    sin1 = sin(angle1);
    cos2 = cos(angle2);
    sin2 = sin(angle2);
    l10_x = XBASE + (short)( L11*cos1 - W1*sin1+0.5);
    l10_y = YBASE + (short)( L11*sin1 + W1*cos1+0.5);
    l11_x = XBASE + (short)( L11*cos1 + W1*sin1+0.5);
    l11_y = YBASE + (short)( L11*sin1 - W1*cos1+0.5);
    l12_x = XBASE + (short)( L12*cos1 + W1*sin1+0.5);
    l12_y = YBASE + (short)( L12*sin1 - W1*cos1+0.5);
    l13_x = XBASE + (short)( L12*cos1 - W1*sin1+0.5);
    l13_y = YBASE + (short)( L12*sin1 + W1*cos1+0.5);

/* joint 2 */
    end1_x = XBASE+(short)(L13*cos1+0.5);
    end1_y = YBASE+(short)(L13*sin1+0.5);
    l20_x = end1_x + (short)( L21*cos2 - W2*sin2+0.5);
    l20_y = end1_y + (short)( L21*sin2 + W2*cos2+0.5);
    l21_x = end1_x + (short)( L21*cos2 + W2*sin2+0.5);
    l21_y = end1_y + (short)( L21*sin2 - W2*cos2+0.5);
    l22_x = end1_x + (short)( L22*cos2 + W2*sin2+0.5);
    l22_y = end1_y + (short)( L22*sin2 - W2*cos2+0.5);
    l23_x = end1_x + (short)( L22*cos2 - W2*sin2+0.5);
    l23_y = end1_y + (short)( L22*sin2 + W2*cos2+0.5);
    l24_x = end1_x + (short)( (L22-2*W2)*cos2 + W2*sin2+0.5);
    l24_y = end1_y + (short)( (L22-2*W2)*sin2 - W2*cos2+0.5);
    l25_x = end1_x + (short)( (L22-2*W2)*cos2 - W2*sin2+0.5);
    l25_y = end1_y + (short)( (L22-2*W2)*sin2 + W2*cos2+0.5);
    end2_x = end1_x + (short)( (L22-W2)*cos2 + .5);
    end2_y = end1_y + (short)( (L22-W2)*sin2 + .5);

pw_batch_on(canvas2_pw);
    pw_vector(canvas2_pw, l10_x,l10_y,l11_x,l11_y,fop,BLACKC);
    pw_vector(canvas2_pw, l11_x,l11_y,l12_x,l12_y,fop,BLACKC);
    pw_vector(canvas2_pw, l12_x,l12_y,l13_x,l13_y,fop,BLACKC);
    pw_vector(canvas2_pw, l13_x,l13_y,l10_x,l10_y,fop,BLACKC);
```

```
show.c  Tue Aug 11 14:15:12 1987                Page:6 pw_vector(canvas2_pw, 120_x,120_y,121_x,121_y,fop,BLACKC);
            pw_vector(canvas2_pw, 121_x,121_y,122_x,122_y,fop,BLACKC);
            pw_vector(canvas2_pw, 122_x,122_y,123_x,123_y,fop,BLACKC);
            pw_vector(canvas2_pw, 123_x,123_y,120_x,120_y,fop,BLACKC);
            pw_vector(canvas2_pw, 124_x,124_y,125_x,125_y,fop,BLACKC);
            pw_vector(canvas2_pw, end1_x,end1_y,end1_x,end1_y,fop,BLACKC);
            pw_vector(canvas2_pw, end2_x,end2_y,end2_x,end2_y,(PIX_SRC|PIX_COLOR(REDC)),BLACKC);
            pw_batch_off(canvas2_pw);
        } plot_goals_in_task_space()
{
        short k;

for (k=0; k<num_goals;k++) {
            pw_rop(canvas2_pw,
            task_goal[k].x-(CELL_SIZE/2),task_goal[k].y-(CELL_SIZE/2),CELL_SIZE,CELL_SIZE,
            ((PIX_SRC^PIX_DST)|PIX_COLOR(GREENC)),icon_prs[GOAL_ICON],0,0);
        }
} plot_path_element(i,j,k)
short i,j,k;
{
/*
        plot_arrow(i,j,PIX_SRC|PIX_DST,k);
*/
        plot_patch(i,j,PIX_SRC|PIX_DST,PATHPATCH);
}

/******************************************************
        canvas1 painting routines
*******************************************************/ grid_paint1()
{
        register short  i, xbeg, ybeg, xend, yend, x ,y;

xbeg = CXMARGIN;
        ybeg = CYMARGIN;
        xend = CXSIZE-CXMARGIN;
        yend = CYSIZE-CYMARGIN;

x = xbeg;
        for (i=0; i < (2*XSIZE+2); i++) {
            pw_vector(canvas1_pw, x, ybeg, x, yend, PIX_SRC, 1);
            if ((i % 2))
                x += CELL_SIZE;
            else
                x += CSTEP;
        } y = ybeg;
        for (i=0; i < (2*YSIZE+3); i++) {
            pw_vector(canvas1_pw, xbeg, y, xend, y, PIX_SRC, 1);
```

```
show.c  Tue Aug 11 14:15:12 1987                Page:7 if ((i % 2))    y += CELL_SIZE;
               else        y += CSTEP;
    }

/********************************************************************
              canvas cell coordinate routines
********************************************************************/
ELEMENT *element_of_point1(event)
    Event   *event;
{
    ELEMENT     *result;
    short       x,y;

result = &null_element;
    x = event_x(event);
    y = event_y(event);
    if (x < CMARGIN+1) {
        x = CXSIZE-CMARGIN-CSTEP-(CMARGIN-CSTEP-x);
        window_set(canvas1,WIN_MOUSE_XY,x,y,0);
        result->i = (x - CMARGIN)/(CSTEP+CELL_SIZE);
        result->j = (y - CMARGIN)/(CSTEP+CELL_SIZE);
        return (result);
    }
    if (y < CMARGIN+1)  {
        y = CYSIZE-CMARGIN-CSTEP-(CMARGIN-CSTEP-y);
        window_set(canvas1,WIN_MOUSE_XY,x,y,0);
        result->i = (x - CMARGIN)/(CSTEP+CELL_SIZE);
        result->j = (y - CMARGIN)/(CSTEP+CELL_SIZE);
        return (result);
    }
    if (x >= (CXSIZE-CMARGIN-CSTEP) ) {
        x = CMARGIN +CSTEP+(x-CXSIZE+CMARGIN+CSTEP);
        window_set(canvas1,WIN_MOUSE_XY,x,y,0);
        result->i = (x - CMARGIN)/(CSTEP+CELL_SIZE);
        result->j = (y - CMARGIN)/(CSTEP+CELL_SIZE);
        return (result);
    }
    if (y >= (CYSIZE-CMARGIN-CSTEP) ) {
        y = CMARGIN +CSTEP+(y-CYSIZE+CMARGIN+CSTEP);
        window_set(canvas1,WIN_MOUSE_XY,x,y,0);
        result->i = (x - CMARGIN)/(CSTEP+CELL_SIZE);
        result->j = (y - CMARGIN)/(CSTEP+CELL_SIZE);
        return (result);
    }
    result->i = (x - CMARGIN)/(CSTEP+CELL_SIZE);
    result->j = (y - CMARGIN)/(CSTEP+CELL_SIZE);
    return (result);
} erase_arms() /* at the moment redraw complete canvas2 */
{
    pw_batch_on(canvas2_pw);
    clear_canvas2();
```

A-74

```
show.c  Tue Aug 11 14:15:12 1987                    Page:8 show_obs();
    plot_goals_in_task_space();
    pw_batch_off(canvas2_pw);
}
```

```
trafo_data.c    Tue Aug 11 14:15:12 1987                                Page:1 include "defines.h"
include "externs.h"
/*
        joint space obstacle treatment
        after an original by wyatt newman
        leo 19870406
*/ prepare_trafo_data()
{
    register short i;

def_obstacles();
    init_obs();
    for (i=0; i<NUMOBS; i++) {
        update_joint_space_for(i,1);
    }
}

/* add = +1: add obstacle */
/* add =  0: just show polygon */
/* add = -1: sub obstacle */
update_joint_space_for(obstacle,add,xx,yy)
short obstacle,add;
short xx,yy; /* coordinates of obstacle. only used if add = 0 */
{
    register short j,k;
    float x,y;
    int xp0,yp0,xp1,yp1,delx,dely;
    int xp_plus,xp_minus;

if (add == 0) {
        x = (float)(xx-XBASE);
        y = (float)(yy-YBASE);
    } else {
        x = (float)(obs_pos[obstacle].x-XBASE);
        y = (float)(obs_pos[obstacle].y-YBASE);
    }
    rad8    = (int)((8/CENTIMETER)*sqrt(y*y + x*x));
    angleobs= ( (int)(32768.0/(2*PI)*atan2(y,x)+32768)) % 32768;

if (12f_interp_obs(0)) {        /* discretize obstacle, if present */
        /* angle shift not yet done */
        xp1= (int) obs_ang1 + (int) angleobs;
        yp1= (int) obs_ang2 + (int) angleobs;
        j=0;
        for(k=0;k<12;k++){
            j=(j%12)+1;
            xp0=xp1; yp0=yp1;
            12f_interp_obs(j);
            delx = (int) obs_ang1,
            dely = (int) obs_ang2;
            xp1= xp0+delx,
            yp1= yp0+dely;
            if (add == 0) {                     /*incr ind for obs bound point*/
                draw_vector(                    /* shift down old points */
```

```
trafo_data.c    Tue Aug 11 14:15:12 1987                    Page:2

} else {
                        borderline(
                            anglepix_x(xp0), anglepix_y(yp0),
                            anglepix_x(xp1), anglepix_y(yp1),
                            roundx(xp0), roundy(yp0),
                            roundx(xp1), roundy(yp1), 4);
                            PIX_SRC^PIX_DST,BLACKC);
                    }
                }
                if (add != 0) fill_contour(add);
            } if(l2r_interp_obs(0)) {        /* discretize obstacle, if present */
                /* angle shift not yet done */
                xp1= (int) obs_ang1+ (int) angleobs;
                yp1= (int) obs_ang2+ (int) angleobs;
                j=0;
                for(k=0;k<l12;k++) {
                    /* increment index for obstacle boundary point */
                    j=(j%l2)+1;
                    xp0=xp1; yp0=yp1;          /* shift down old points */
                    l2r_interp_obs(j);
                    delx = (int) obs_ang1;
                    dely = (int) obs_ang2;
                    xp1= xp0+delx;
                    yp1= yp0+dely;
                    if (add == 0) {
                        draw_vector(
                            anglepix_x(xp0), anglepix_y(yp0),
                            anglepix_x(xp1), anglepix_y(yp1),
                            PIX_SRC^PIX_DST,BLACKC);
                    } else {
                        borderline(
                            roundx(xp0), roundy(yp0),
                            roundx(xp1), roundy(yp1), 4);
                    }
                }
                if (add != 0) fill_contour(add);
            }

/* code to fill all vertical pixels for edges of linkl obstacles */
/* should be condensed; too expensive to fill all vertical pixels */ if(l1_interp_obs()) {          /* discretize obstacle, if present */
                /* angle shift not yet done */
                xp0 = (int) obs_l1_plus + (int) angleobs - 32768;
                yp0 = 0;
                xp1 = xp0;
                yp1 = 32768;
                xp_plus = xp0;
                if (add == 0) {
                    draw_vector(
                        anglepix_x(xp0), anglepix_y(yp0),
                        anglepix_x(xp1), anglepix_y(yp1),
                        PIX_SRC^PIX_DST,BLACKC);
                }
``` trafo_data.c    Tue Aug 11 14:15:12 1987                Page:3

```
        xp0 = (int) obs_l1_minus + (int) angleobs;
        yp0 = 0;
        xp1 = xp0;
        yp1 = 32768;
        xp_minus = xp0;
        if (add == 0) {
                draw_vector(
                        anglepix_x(xp0), anglepix_y(yp0),
                        anglepix_x(xp1), anglepix_y(yp1),
                        PIX_SRC^PIX_DST,BLACK);
        }
        if (add != 0)
                fill_linkl_contour(
                        roundx(xp_minus),roundx(xp_plus),add);
} init_arm()
{
        double angle1,angle2;
        angle1 = (double)(ANGLE1RES*XSIZE/2);
        angle2 = (double)(ANGLE2RES*YSIZE/2);
        set_arm(angle1,angle2);
} set_arm(angle1,angle2)
        double angle1,angle2;
{
        arm = &null_arm;
        arm->angle1 = angle1;
        arm->angle2 = angle2;
} short roundx(x) /* conversion from screen to discrete config space */
int x;
{
        return (( (short)(x*ANGLE1PIX+CELL_SIZE/2+XSIZE*CELL_SIZE) / CELL_SIZE)-XSIZE);
} short roundy(y) /* conversion from screen to discrete config space */
int y;
{
        return (( (short)(y*ANGLE2PIX+CELL_SIZE/2+YSIZE*CELL_SIZE) / CELL_SIZE)-YSIZE);
} short periodic_x(x)
short x;
{
        if (x < 0) return(XSIZE+x);
        if (x >= XSIZE ) return(x-XSIZE);
        return(x);
} short periodic_y(y)
short y;
```

```
trafo_data.c     Tue Aug 11 14:15:12 1987      Page:4 if (y < 0) return(YSIZE+y);
    if (y >= YSIZE ) return(y-YSIZE);
    return(y);
} int anglepix_x(x)        /* conversion from angle to screen coordinates */
int x;
{
    return ((int)(x*ANGLE1PIX)+CELL_SIZE/2+CMARGIN);
} int anglepix_y(y)        /* conversion from angle to screen coordinates */
int y;
{
    return ((int)(y*ANGLE2PIX)+CELL_SIZE/2+CMARGIN);
} int cellangle_x(x)
int x;
{
    return ( ((int) ( (((float)x)*32768.0) / (((float)XSIZE) ) );
} int cellangle_y(y)
int y;
{
    return ( ((int) ( (((float)y)*32768.0) / (((float)YSIZE) ) );
} float obspixworld_x(x)   /* conversion from pixels to world coordinates */
int x;
{
    return( (float)(x-XBASE)/((float)CENTIMETER) );
} float obspixworld_y(y)   /* conversion from pixels to world coordinates */
int y;
{
    return( (float)(y-YBASE)/((float)CENTIMETER) );
} int obsworldpix_x(x)     /* conversion from world to pixels */
short x;
{
    return (((int) ( (((float)x)*(((float)CENTIMETER)) + XBASE);
} int obsworldpix_y(y)     /* conversion from world to pixels */
short y;
{
    return (((int) ( (((float)y)*(((float)CENTIMETER)) + YBASE);
} draw_vector(x1,y1,x2,y2,op,color)
    /* draw vector in periodic config space */
```

```
trafo_data.c      Tue Aug 11 14:15:12 1987       Page:5

/* it is assumed that only one boundary is traversed by the line */
short x1,y1,x2,y2,op,color;
{
    int fop;
    short leftx1,rightx1,normalx1;
    short leftx2,rightx2,normalx2;
    short lefty1,righty1,normaly1;
    short lefty2,righty2,normaly2;
    short crossx,crossy;

leftx1 = rightx1 = normalx1 = FALSE;
    if (x1 < CMARGIN)                 leftx1  = TRUE;
    else if (x1 > (CXSIZE-CMARGIN))   rightx1 = TRUE;
    else                              normalx1= TRUE;

leftx2 = rightx2 = normalx2 = FALSE;
    if (x2 < CMARGIN)                 leftx2  = TRUE;
    else if (x2 > (CXSIZE-CMARGIN))   rightx2 = TRUE;
    else                              normalx2= TRUE;

lefty1 = righty1 = normaly1 = FALSE;
    if (y1 < CMARGIN)                 lefty1  = TRUE;
    else if (y1 > (CXSIZE-CMARGIN))   righty1 = TRUE;
    else                              normaly1= TRUE;

lefty2 = righty2 = normaly2 = FALSE;
    if (y2 < CMARGIN)                 lefty2  = TRUE;
    else if (y2 > (CXSIZE-CMARGIN))   righty2 = TRUE;
    else                              normaly2= TRUE;

fop = op | PIX_COLOR(color);
    /*
    fop = (PIX_SRC^PIX_DST) | PIX_COLOR(BLACKC);
    */
#define JUMPX  (CXSIZE-2*CMARGIN)
#define JUMPY  (CYSIZE-2*CMARGIN)
#define RIGHTX (CXSIZE-CMARGIN)
#define RIGHTY (CYSIZE-CMARGIN)
    if (normalx1 && normalx2 && normaly1 && normaly2)
        pw_vector(canvas1_pw,x1,y1,x2,y2,fop,1);
    else /* all-to-one-side cases */
        if (leftx1 && leftx2 && normaly1 && normaly2)
            pw_vector(canvas1_pw,x1+JUMPX,y1,x2+JUMPX,y2,fop,1);     /* left side */
        else if (normalx1 && normaly1 && leftty2)
            pw_vector(canvas1_pw,x1,y1+JUMPY,x2,y2+JUMPY,fop,1);     /* upper side */
        else if (rightx1 && rightx2 && normaly1 && normaly2)
            pw_vector(canvas1_pw,x1-JUMPX,y1,x2-JUMPX,y2,fop,1);     /* right side */
        else if (normalx1 && normalx2 && righty1 && righty2)
            pw_vector(canvas1_pw,x1,y1-JUMPY,x2,y2-JUMPY,fop,1);     /* lower side */
        else /* corner cases */
            if (leftx1 && leftx2 && lefty1 && lefty2)
                pw_vector(canvas1_pw,x1+JUMPX,y1+JUMPY,x2+JUMPX,y2+JUMPY,fop,1);  /* upper left */
            else if (leftx1 && leftx2 && righty1 && righty2)
                pw_vector(canvas1_pw,x1+JUMPX,y1-JUMPY,x2+JUMPX,y2-JUMPY,fop,1);  /* lower left */
            else if (rightx1 && rightx2 && lefty1 && lefty2)
                pw_vector(canvas1_pw,x1-JUMPX,y1+JUMPY,x2-JUMPX,y2+JUMPY,fop,1);  /* lower right */
            else if (rightx1 && rightx2 && righty1 && righty2)
                pw_vector(canvas1_pw,x1-JUMPX,y1-JUMPY,x2-JUMPX,y2-JUMPY,fop,1);
```

```
trafo_data.c    Tue Aug 11 14:15:12 1987                Page:6 else if (rightx1 && righty1 && lefty2)             /* upper right */
        pw_vector(canvas1_pw,x1-JUMPX,y1+JUMPY,x2-JUMPX,y2+JUMPY,fop,1);
    else /* border crossing cases */
        if (leftx1 && normalx2 && normaly1 && normaly2) {  /* left border */
            crossy = y2 - (short)( ((float)(x2-CMARGIN)*(y2-y1)) / ((float)(x2-x1) );
            pw_vector(canvas1_pw,x1+JUMPX,y1,RIGHTX,crossy,fop,1);
            pw_vector(canvas1_pw,CMARGIN,crossy,x2,y2,fop,1);
        }
    else if (normalx1 && leftx2 && normaly1 && normaly2) {  /* left border */
            crossy = y1 - (short)( ((float)(x1-CMARGIN)*(y1-y2)) / ((float)(x1-x2) );
            pw_vector(canvas1_pw,x2+JUMPX,y2,RIGHTX,crossy,fop,1);
            pw_vector(canvas1_pw,CMARGIN,crossy,x1,y1,fop,1);
        }
    else if (rightx1 && normalx2 && normaly1 && normaly2) { /* right border */
            crossy = y2 - (short)( ((float)(x2-RIGHTX)*(y2-y1)) / ((float)(x2-x1) );
            pw_vector(canvas1_pw,x1-JUMPX,y1,CMARGIN,crossy,fop,1);
            pw_vector(canvas1_pw,RIGHTX,crossy,x2,y2,fop,1);
        }
    else if (normalx1 && rightx2 && normaly1 && normaly2) { /* right border */
            crossy = y1 - (short)( ((float)(x1-RIGHTX)*(y1-y2)) / ((float)(x1-x2) );
            pw_vector(canvas1_pw,x2-JUMPX,y2,CMARGIN,crossy,fop,1);
            pw_vector(canvas1_pw,RIGHTX,crossy,x1,y1,fop,1);
        }
    else if (lefty1 && normaly2 && normalx1 && normalx2) {  /* upper border */
            crossx = x2 - (short)( ((float)(y2-CMARGIN)*(x2-x1)) / ((float)(y2-y1) );
            pw_vector(canvas1_pw,x1,y1+JUMPY,crossx,RIGHTY,fop,1);
            pw_vector(canvas1_pw,crossx,CMARGIN,x2,y2,fop,1);
        }
    else if (normaly1 && lefty2 && normalx1 && normalx2) {  /* upper border */
            crossx = x1 - (short)( ((float)(y1-CMARGIN)*(x1-x2)) / ((float)(y1-y2) );
            pw_vector(canvas1_pw,x2,y2+JUMPY,crossx,RIGHTY,fop,1);
            pw_vector(canvas1_pw,crossx,CMARGIN,x1,y1,fop,1);
        }
    else if (righty1 && normaly2 && normalx1 && normalx2) { /* lower border */
            crossx = x2 - (short)( ((float)(y2-RIGHTY)*(x2-x1)) / ((float)(y2-y1) );
            pw_vector(canvas1_pw,x1,y1-JUMPY,crossx,CMARGIN,fop,1);
            pw_vector(canvas1_pw,crossx,RIGHTY,x2,y2,fop,1);
        }
    else if (normaly1 && righty2 && normalx1 && normalx2) { /* lower border */
            crossx = x1 - (short)( ((float)(y1-RIGHTY)*(x1-x2)) / ((float)(y1-y2) );
            pw_vector(canvas1_pw,x2,y2-JUMPY,crossx,CMARGIN,fop,1);
            pw_vector(canvas1_pw,crossx,RIGHTY,x1,y1,fop,1);
        }
}
```

We claim:

1. Computer animation device comprising
   means for storing a configuration space data structure representing a physical task space, the configuration space data structure including representations of the object and its environment;
   means for propagating cost waves through the configuration space data structure using a space variant metric;
   means for displaying a representation of the object and the environment based on the configuration space data structure; and
   means for displaying motion of the object through the representation.

2. The device of claim 1 wherein the cost waves are propagated from states of known costs.

3. The device of claim 2 wherein the states of known costs represent goals for the object.

4. The device of claim 1 wherein the configuration space data structure comprises means for representing obstacles around the object.

5. The device of claim 1 wherein the configuration space data structure comprises means for representing goals for the object to reach.

6. Computer animation device comprising
   means for storing a configuration space data structure representing a physical task space, the configuration space data structure including representations of the object and its environment, wherein the configuration space data structure comprises an array of states, each state representing a pose of the object, which array comprises a dimension for each degree of freedom of the object;
   means for propagating cost waves throughout the configuration space data structure, the means for propagating comprising
      means for exploring all neighbors of a state in the configuration space data structure;
      means for improving neighbors of the state by assigning appropriate values of cost to goal and direction arrows to the state; and
      means for adding improved neighbors to a storage data structure
   means for displaying a representation of the object and the environment based on the configuration space data structure; and
   means for displaying motion of the object through the representation.

7. The device of claim 6 wherein each state comprises means for storing a cost to goal value.

8. The device of claim 6 wherein each state comprises means for storing a direction arrows value pointing along an optimal path.

9. The device of claim 8 wherein the direction arrows values are chosen from a set comprising values representing transitions parallel to axes of the configuration space corresponding to the configuration space data structure.

10. The device of claim 9 wherein the direction arrows values are chosen from a set which represent transitions from a first state to respective ones of a plurality of second states, which second states are the visible states in an n-cube of p states on a side, the n-cube surrounding the first state, where n is a positive integer representing a number of degrees of freedom of the object and p is a positive integer.

11. The device of claim 6 wherein the means for displaying motion comprises
   means for deriving a sequence of object pose representations within the configuration space data structure; and
   means for providing the series in an electronic form.

12. The device of claim 6
   wherein each state comprises
      means for storing a cost to goal value; and
      means for storing a direction arrows value pointing along an optimal path; and
   further comprising means for propagating cost waves throughout the configuration space data structure, the means for propagating comprising
      means for exploring all neighbors of a state in the configuration space data structure;
      means for improving neighbors of the state by assigning appropriate values of cost to goal and direction arrows to the state; and
      means for adding improved neighbors to a storage data structure.

13. Computer software embodied in a computer readable medium comprising
   means for controlling storage of a configuration space data structure representing a physical task space, the configuration space data structure including representations of the object and its environment;
   means for propagating cost waves through the configuration space data structure using a space variant metric;
   means for causing display of a representation of the object and the environment based on the configuration space data structure; and
   means for causing display of motion of the object through the representation.

14. The software of claim 13 wherein the cost waves are propagated from states of known costs.

15. The software of claim 14 wherein the states of known costs represent goals for the object.

16. Computer software embodied in a computer-readable storage medium comprising
   means for controlling storage of a configuration space data structure representing a physical task space, the configuration space data structure including representations of the object and its environment, wherein the configuration space data structure comprises an array of states, each state representing a pose of the object, which array comprises a dimension for each degree of freedom of the object;
   means for propagating cost waves throughout the configuration space data structure, the means for propagating comprising
      means for exploring all neighbors of a state in the configuration space data structure;
      means for improving neighbors of the state by assigning appropriate values of cost to goal and direction arrows to the state; and
      means for adding improved neighbors to a storage data structure
   means for causing display of a representation of the object and the environment based on the configuration space data structure; and
   means for causing display of motion of the object through the representation.

17. The software of claim 16 wherein each state comprises means for storing a cost to goal value.

18. The software of claim 16 wherein each state comprises means for storing a direction arrows value pointing along an optimal path.

19. The software of claim 18 wherein the direction arrows values are chosen from a set comprising values representing transitions parallel to axes of the configuration space corresponding to the configuration space data structure.

20. The software of claim 19 wherein the direction arrows values are chosen from a set which represent transitions from a first state to respective ones of a plurality of second states, which second states are the visible states in an n-cube of p states on a side, the n-cube surrounding the first state, where n is a positive integer representing a number of degrees of freedom of the object and p is a positive integer.

21. The software of claim 16 wherein the means for causing displaying motion comprises means for causing derivation of a sequence of object pose representations within the configuration space data structure; and means for causing provision of the series in an electronic form.

22. The software of claim 13 wherein each state comprises a field for a cost to goal value; and a field for a direction arrows value pointing along an optimal path; and the means for causing derivation causes following of direction arrows values from a current state to a goal state to yield an optimal path to that goal state.

23. The software of claim 13 wherein the configuration space data structure comprises means for representing obstacles around the object.

24. The software of claim 13 wherein the configuration space data structure comprises means for representing goals for the object to reach.

* * * * *